United States Patent
Kim et al.

(10) Patent No.: US 9,419,000 B2
(45) Date of Patent: Aug. 16, 2016

(54) METHODS OF MANUFACTURING SEMICONDUCTOR DEVICES HAVING BURIED CONTACTS AND RELATED SEMICONDUCTOR DEVICES

(71) Applicants: Dae-ik Kim, Hwaseong-si (KR); Hyoung-sub Kim, Seongnamg-si (KR); Yoo-sang Hwang, Suwon-si (KR); Ji-young Kim, Yongin-si (KR)

(72) Inventors: Dae-ik Kim, Hwaseong-si (KR); Hyoung-sub Kim, Seongnamg-si (KR); Yoo-sang Hwang, Suwon-si (KR); Ji-young Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 14/538,832

(22) Filed: Nov. 12, 2014

(65) Prior Publication Data
US 2015/0132942 A1    May 14, 2015

(30) Foreign Application Priority Data
Nov. 13, 2013    (KR) .................. 10-2013-0137881

(51) Int. Cl.
*H01L 21/768*    (2006.01)
*H01L 27/108*    (2006.01)

(52) U.S. Cl.
CPC .... *H01L 27/10823* (2013.01); *H01L 27/10876* (2013.01); *H01L 27/10885* (2013.01); *H01L 27/10814* (2013.01); *H01L 27/10855* (2013.01)

(58) Field of Classification Search
None
See application file for complete search history.

(56) References Cited

U.S. PATENT DOCUMENTS

| | | | |
|---|---|---|---|
| 6,589,837 B1 | 7/2003 | Ban et al. | |
| 7,087,956 B2 | 8/2006 | Umebayashi | |
| 7,371,636 B2 | 5/2008 | Nam | |
| 8,093,125 B2 | 1/2012 | Kim | |
| 2010/0327346 A1 | 12/2010 | Jeong et al. | |
| 2011/0024811 A1 | 2/2011 | Kim | |
| 2011/0151632 A1* | 6/2011 | Cho .............................. 438/239 |
| 2011/0241102 A1 | 10/2011 | Cho et al. | |
| 2012/0091532 A1* | 4/2012 | Han et al. ..................... 257/368 |
| 2012/0153383 A1 | 6/2012 | Shin et al. | |
| 2014/0021521 A1* | 1/2014 | Lim ........................ H01L 29/94 257/296 |

FOREIGN PATENT DOCUMENTS

| | | | |
|---|---|---|---|
| KR | 1020070032850 A | 3/2007 |
| KR | 1020080062019 A | 7/2008 |
| KR | 1020090103147 A | 10/2009 |
| KR | 1020100127478 A | 12/2010 |
| KR | 1020110029672 A | 3/2011 |
| KR | 1020110119047 A | 11/2011 |
| KR | 1020120134216 A | 12/2012 |

* cited by examiner

*Primary Examiner* — Charles Garber
*Assistant Examiner* — Stanetta Isaac
(74) *Attorney, Agent, or Firm* — Myers Bigel & Sibley, P.A.

(57) ABSTRACT

Provided is a method of manufacturing a semiconductor device. The method includes: forming bit line structures spaced apart from each other by first groove disposed in first direction, extending in first direction, and spaced apart from each other in second direction perpendicular to first direction, on substrate in which word line is buried; forming multilayer spacer on both sidewalls of bit line structure; forming sacrificial layer to fill first groove; forming second grooves spaced apart from each other in first direction and second direction, by patterning sacrificial layer; etching outermost spacer of multilayer spacer located in second groove; forming first supplementary spacer in second groove; forming insulating layer to fill second groove; and forming third grooves spaced apart from each other in first direction and second direction, on both sides of first supplementary spacer, by removing sacrificial layer and insulating layer.

20 Claims, 60 Drawing Sheets

METHODS OF MANUFACTURING SEMICONDUCTOR DEVICES HAVING BURIED CONTACTS AND RELATED SEMICONDUCTOR DEVICES

CROSS-REFERENCE TO RELATED APPLICATION

This application claims the benefit under 35 U.S.C. §119 of Korean Patent Application No. 10-2013-0137881, filed on Nov. 13, 2013 in the Korean Intellectual Property Office, the disclosure of which is incorporated herein in its entirety by reference.

BACKGROUND

The inventive concepts relate to methods of manufacturing semiconductor devices and, more particularly, to methods of manufacturing semiconductor devices that include buried contacts, and to semiconductor devices that are manufactured by these methods.

As the integration level of semiconductor devices is increased, the design rules for the components included in such semiconductor devices is decreasing. As a result, it is becoming more difficult to form interconnection lines and buried contacts (BCs) interposed therebetween in highly-integrated semiconductor devices. For example, in a highly-integrated semiconductor device, since the size of the openings for buried contacts is reduced, a not open (NOP) margin is decreasing and a BC recess distribution is becoming poor.

SUMMARY

The inventive concepts provide methods of manufacturing semiconductor devices that may solve the problem of a BC recess distribution and the problem of a not open (NOP) margin shortage due to a buried contact (BC) open space reduction in a process of manufacturing a highly-integrated semiconductor devices.

The inventive concepts also provide methods of manufacturing semiconductor devices that may reduce etch loss of an etch mask in the process of etching openings for buried contacts.

The inventive concepts also provide semiconductor devices manufactured by these methods.

According to an aspect of the inventive concept, there is provided a method of manufacturing a semiconductor device in which first and second bit line structures that extend in the first direction are formed on a substrate that are spaced apart from each other by a first groove in a second direction that is perpendicular to the first direction. A multilayer spacer is formed on first and second sidewalls of the first bit line structure and on first and second sidewalls of the second bit line structure. A sacrificial layer is formed in the first groove. The sacrificial layer is patterned to form a plurality of second grooves that are spaced apart from each other in the first direction and the second direction. Portions of an outermost spacer of at least some of the multilayer spacers that are exposed in the second grooves are etched. First supplementary spacers are formed in at least some of the second grooves. The sacrificial layer is removed to form a plurality of third grooves that are spaced apart from each other in the first direction and the second direction.

Each multilayer spacer may comprise a first nitride spacer on the first both sidewalls of the bit line structure at issues and a first oxide spacer on the first nitride spacer, the first oxide spacer the outermost spacer on the first spacer.

Forming the plurality of second grooves may comprise: forming a mask pattern on the sacrificial layer to expose portions of the sacrificial layer; and etching the sacrificial layer using the mask pattern and the multilayer spacer as an etch mask.

The mask pattern may expose portions of the sacrificial layer that are on word lines that are buried in the substrate.

The first supplementary spacer may be formed on exposed sidewalls of the sacrificial layer and on the etched multilayer spacer.

The first supplementary spacers are oxide space4s.

The forming of the plurality of third grooves may include forming an insulating layer in at least some of the second grooves, and removing both the sacrificial layer and the insulating layer by an ashing and stripping process.

The method may further include, after the forming the plurality of third grooves: forming a polysilicon conductive layer that fills the third grooves and is electrically connected to the substrate; and removing an upper portion of the polysilicon conductive layer by an etch-back process and forming a metal layer to cover the first and second bit line structures, the multilayer spacers, and the first supplementary spacers.

The forming of the polysilicon conductive layer may include: forming a conductive material layer to fill the third grooves and cover the first and second bit line structures, the multilayer spacers, and the first supplementary spacers; and exposing the bit line structure, the multilayer spacer, and the first supplementary spacer by removing an upper portion of the conductive material layer by a chemical mechanical polishing (CMP) process.

The method may further include, the forming the metal layer, forming a plurality of fourth grooves by etching portions of the first supplementary spacers, the multilayer spacers, the first and second bit line structures, and the metal layer that are exposed through a mask pattern, wherein the metal layer is divided by the fourth grooves into a plurality of landing pads that are electrically isolated from each other.

The landing pads may be disposed in a zigzag configuration along the first direction, the multilayer spacer on a left sidewall of the first bit line structure and the multilayer spacer on a right sidewall of the second bit line structure may be alternately exposed through the fourth groove along the first direction, and the multilayer spacer formed on the same sidewall of the first and second bit line structures may be exposed by the fourth groove along the second direction.

Second supplementary spacers may be formed in the third grooves before the polysilicon conductive layer is formed, and the method may further include, after the forming of the metal layer: forming the fourth grooves to expose the multilayer spacers, the first supplementary spacers, and the second supplementary spacers; and forming air spacers by removing the first supplementary spacers.

According to another aspect of the inventive concepts, there is provided a method of manufacturing a semiconductor device, including: forming first and second bit line structures that extend in a first direction on a substrate, the first and second bit line structures spaced apart from each other in a second direction that is perpendicular to the first direction by a first groove; forming multilayer spacers on first and second sidewalls of the first bit line structure and on first and second sidewalls of the second bit line structure; forming a sacrificial layer in the first groove; forming a plurality of second grooves that are spaced apart from each other in the first direction by patterning the sacrificial layer; forming fence insulating layers of a same material as an outermost layer of the multilayer spacers in at least some of the second grooves; forming an insulating layer in the second grooves in regions bounded by the respective fence insulating layers; and forming a plurality of third grooves that are spaced apart from each other in the first direction and the second direction by removing the sacrificial layer and the insulating layer.

The fence insulating layers and the outermost layer of each multilayer spacer may include oxide.

Each multilayer spacer may include: a first spacer formed of a nitride layer on both sidewalls of a respective one of the first and second bit line structures; and a second spacer formed of an oxide layer as an outermost spacer on the first spacer.

The forming of the fence insulating layers may include: etching portions of the second spacer of each multilayer spacer that are located in the second grooves and that are formed in the second direction; and forming first supplementary spacers on both sidewalls of the sacrificial layer in the second grooves in the first direction and on the first spacers of the first and second bit line structures in the second direction.

After forming the third grooves, supplementary spacers having an etch selectivity with respect to the first spacers and the fence insulating layers may be further formed on both sidewalls of at least some of the fence insulating layers in the first direction and on the multilayer spacers of the first and second bit line structures in the second direction.

The method may further include, after forming the third grooves: forming a polysilicon conductive layer in the third grooves that is electrically connected to the substrate; and removing an upper portion of the polysilicon conductive layer by an etch-back process and forming a metal layer to cover the first and second bit line structures, the multilayer spacers, the supplementary spacers, and the fence insulating layers.

The method may further include, after forming the metal layer: forming a fourth groove to expose the metal layer, the first and second bit line structures, the multilayer spacers, the supplementary spacers, and the fence insulating layers; and forming air spacers by removing the fence insulating layers and the second spacers of the multilayer spacer.

According to another aspect of the inventive concepts, methods of forming a semiconductor device are provided in which an isolation pattern is formed in a substrate that defines a plurality of active regions. A plurality of word line structures are formed in the substrate that extend in a second direction to cross over the active regions. An interlayer insulating pattern is formed between the word line structures. Openings are formed in the interlayer insulating pattern that expose source regions of the active regions. Direct contacts are formed that are electrically connected to respective ones of the source regions. A plurality of bit line structures are formed on the substrate, the bit line structures each extending in a first direction and spaced apart from each other by a plurality of first grooves. Multilayer spacers are formed on sidewalls of the bit line structures. The interlayer insulating layer is etched using the multilayer spacers as an etch mask to form linear openings in the interlayer insulating layer that expose the active regions.

In the above methods, each word line structure may be a word line, a buried insulating layer on the word line, and a gate dielectric layer under the word line, on sidewalls of the word line and on sidewalls of the buried insulating layer.

Each bit line may be electrically connected to a plurality of the direct contacts.

The method may further include forming a sacrificial layer in the first grooves, patterning the sacrificial layer to form a plurality of second grooves in the sacrificial layer, the second grooves exposing portions of the multilayer spacers, and etching the exposed portions of the multilayer spacers to remove an outermost layer of the exposed portions of the multilayer spacers.

The method may also further include forming first supplementary spacers in the second grooves and removing at least further portions of the patterned sacrificial layer to form third grooves by expanding the second grooves.

The sacrificial layer may be a carbon containing layer.

Each secondary groove may be an opening in the sacrificial layer and the first supplementary spacers line the sidewalls of each secondary groove.

The method may further include forming second supplementary spacers on the first supplementary spacers and then forming buried contacts in openings defined by the second supplementary spacers.

The method may further include forming a metal layer that covers the bit line structures, the multilayer spacers, and the first supplementary spacers, and then forming a mask pattern on the metal layer; and then etching exposed portions of the first supplementary spacers, the multilayer spacers, the bit line structures and the metal layer to form a plurality of fourth grooves, where the metal layer is divided by the fourth grooves into a plurality of landing pads that are electrically isolated from each other and that are disposed in columns that each have a zigzag configuration along the first direction.

According to another aspect of the inventive concepts, there is provided a semiconductor device including: a substrate having a word line buried therein; a first bit line structure on the substrate and a second bit line structure on the substrate, the first and second bit line structures extending in a first direction and spaced apart from each other in a second direction that is perpendicular to the first direction; a first multilayer spacer extending in the first direction on both sidewalls of the first bit line structure; a second multilayer spacer extending in the first direction on both sidewalls of the second bit line structure a plurality of fence insulating layers that are spaced apart from each other in the first direction that are provided between the first bit line structure and the second bit line structure, the fence insulating layers defining respective contact holes that expose portions of active regions in the substrate; and a conductive pattern in the contact holes.

Each fence insulating layer may include a first supplementary spacer that has a first portion that is on a first sidewall of the first bit line structure, a second portion that is on a first sidewall of the second bit line structure, a third portion that connects a first end of the first portion to a first end of the second portion, and a fourth portion that connects a second end of the first portion to a second end of the second portion.

The first multilayer spacer may include: a first nitride spacer on both sidewalls of the first bit line structure; and a second oxide spacer on the first nitride spacer, and the second multilayer spacer may include a second nitride spacer on both sidewalls of the second bit line structure and a second oxide spacer on the second nitride spacer.

The multilayer spacer may further include a second supplementary spacer that is formed on an interior of each fence insulating layer.

Each fence insulating layer may be an air spacer that is disposed the second supplementary spacer and the first nitride spacer and between the second supplementary spacer and the second nitride spacer.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
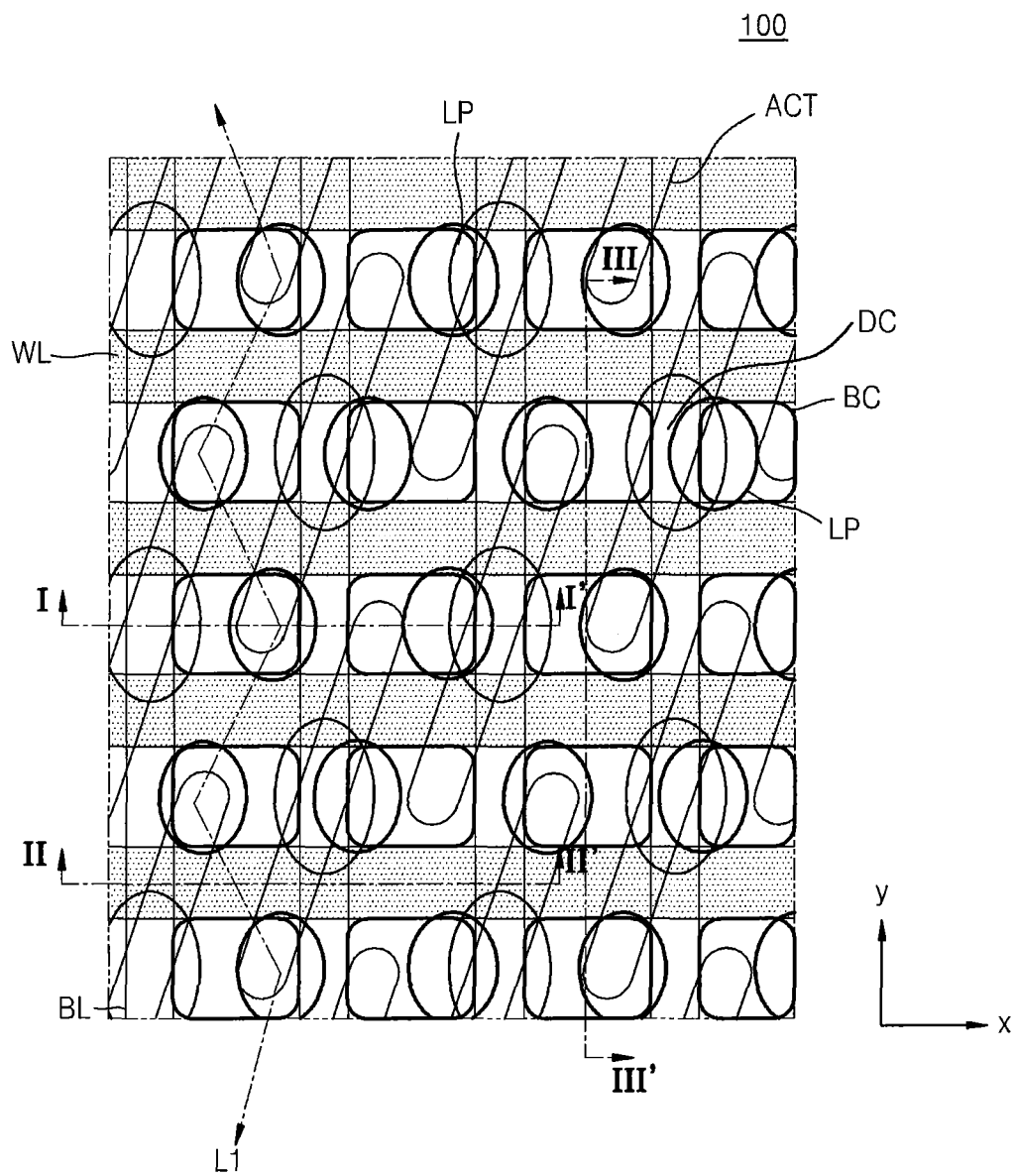
FIG. 1 is a schematic layout diagram of a semiconductor device according to embodiments of the inventive concepts.

The inventive concepts will now be described more fully with reference to the accompanying drawings, in which exemplary embodiments of the inventive concepts are shown. The inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art.

It will be understood that when an element is referred to as being "connected to" another element, it may be directly connected to the other element or intervening elements may be present. Likewise, it will be understood that when an element is referred to as being "on" another element, it may be directly on the other element or intervening elements may be present. Also, in the drawings, the structures or sizes of elements may be exaggerated for clarity, and portions irrelevant to the description may be omitted. Like reference numerals denote like elements throughout the specification and drawings.

As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of the relevant art and will not be interpreted in an idealized or overly formal sense unless expressly so defined herein. The terms herein are only used to describe the inventive concepts and are not intended to limit the scope of the inventive concepts.

FIG. 1 is a schematic layout diagram of a semiconductor device according to embodiments of the inventive concepts.

Referring to FIG. 1, a semiconductor device 100 according to an embodiment of the inventive concepts may include a plurality of active regions ACT. The active regions ACT may be defined by an isolation pattern 114 (see FIG. 2A) that is formed on a substrate 110 (see FIG. 2A). The active regions ACT may have bar shapes. The semiconductor device 100 may be a semiconductor memory device.

A plurality of word lines WL or gate lines are provided which extend in parallel to each other in a second direction (X-axis direction) across the active regions ACT. The word lines WL may be spaced apart equidistantly from each other. The width of each word line WL and/or the distance between adjacent word lines WL may be determined according to a design rule. A plurality of bit lines BL are provided which extend in parallel to each other in a first direction (Y-axis direction). The bit lines BL are perpendicular to the word lines WL, and may be disposed on the word lines WL. The bit lines BL may be spaced apart equidistantly from each other. The width of each bit line BL and/or the distance between adjacent bit lines BL may be determined according to a design rule. As shown in FIG. 1, the active regions ACT may extend diagonally across the grid structure defined by the word lines WL and the bit lines BL. Thus, the active regions ACT may intersect both the word lines WL and the bit lines BL at oblique angles.

In some embodiments, the bit lines BL may be disposed in parallel to each other with a pitch of about 3F between adjacent bit lines BL, and the word lines WL may be disposed in parallel to each other with a pitch of about 2F between adjacent word lines WL. Herein, F may refer to a minimum lithographic feature size. When the bit lines BL and the word lines WL are disposed with such a pitch therebetween, the memory device may include memory cells having a unit cell size of about $6F^2$.

The semiconductor device 100 may include contact arrays formed on the active regions ACT such as, for example, an array of direct contacts DC, an array of buried contacts BC, and an array of landing pads LP. The direct contacts DC may be contacts that connect the active regions ACT to the bit lines BL, and the buried contacts BC may be contacts that connect the active regions ACT to the bottom electrodes of respective capacitors (not illustrated).

The contact area between each buried contact BC and its corresponding active region ACT may be very small. Accordingly, a conductive landing pad LP may be provided that increases the contact area between the active region ACT and the bottom electrode of its associated capacitor. Each landing pad LP may be disposed between an active region ACT and its corresponding buried contact BC or between the buried contact BC and the bottom electrode of the capacitor. In the present embodiment, each landing pad LP may be disposed between a buried contact BC and the bottom electrode of a capacitor. By increasing the contact area by introducing the landing pad LP, a contact resistance between the active region ACT and the bottom electrode of the capacitor may be reduced.

In the semiconductor device 100, the direct contact DC may be disposed at a center portion of each active region ACT, and buried contacts BC may be disposed at both end portions of each active region ACT. The landing pads LP may be disposed to partially overlap with the buried contacts BC.

The word line WL may be a buried structure in the substrate 110 of the semiconductor device 100. Each word line may cross the active regions ACT between the direct contacts DC and the buried contacts BC. As illustrated in FIG. 1, since two word lines WL cross each active region ACT and each active region ACT extends along a diagonal line or an oblique line, each active region ACT may intersect the two word lines at an angle of less than about 90°.

The direct contacts DC and the buried contacts BC may be disposed symmetrically, and thus may be disposed in straight lines along the X axis and the Y axis. In other words, the direct contacts DC may be disposed in rows that are parallel to the word lines WL and may also be disposed in columns that are parallel to (and under) the bit lines BL. Likewise, the buried contacts BC may be disposed in rows that are parallel to the word lines WL and may also be disposed in columns that are parallel to the bit lines BL. Unlike the direct contacts DC and the buried contacts BC, the landing pads LP may be disposed in a zigzag configuration L1 in the first direction (Y-axis direction). Also, each landing pad LP in a column may overlap with the same side portion of each bit line BL in the second direction (X-axis direction). For example, each of the landing pads LP in a first column extending along the first direction (Y-axis direction) may overlap with a left side surface of the corresponding bit line BL, and each of the landing pads LP in a second column extending along the first direction (Y-axis direction) that is adjacent the first column may overlap with a right side surface of a corresponding bit line BL.

Since a spin on hard mask (SOH) sacrificial layer is used in the etching process that is used to form the openings for the buried contacts (BC), the etching process may be performed with an increased etch selectivity. When an oxide sacrificial layer is used, the openings for the buried contacts BC may have a contact shape. However, since the SOH sacrificial layer is used, the openings for the buried contacts BC may have a line shape and thus a not open (NOP) margin may be increased and a BC recess distribution may be improved.

In the case of the semiconductor device 100, since the SOH sacrificial layer is used to form the buried contacts BC, the buried contacts BC may each be surrounded by an oxide or nitride insulating layer. This will be described in more detail herein with reference to FIGS. 14A and 14B.

FIGS. 2 to 13 are cross-sectional and plan views illustrating a method of manufacturing the semiconductor device of FIG. 1 according to certain embodiments of the inventive concepts. In particular, FIGS. 2A, 3A, . . . , 13A are cross-sectional views taken along line I-I' of FIG. 1; FIGS. 2B, 3B, . . . , 13B are cross-sectional views taken along line II-II' of FIG. 1; FIGS. 2C, 3C, . . . , 13C are cross-sectional views taken along line III-III' FIG. 1; and FIGS. 6D to 9D are plan views illustrating various operations in the manufacturing process.

Figure 2A:
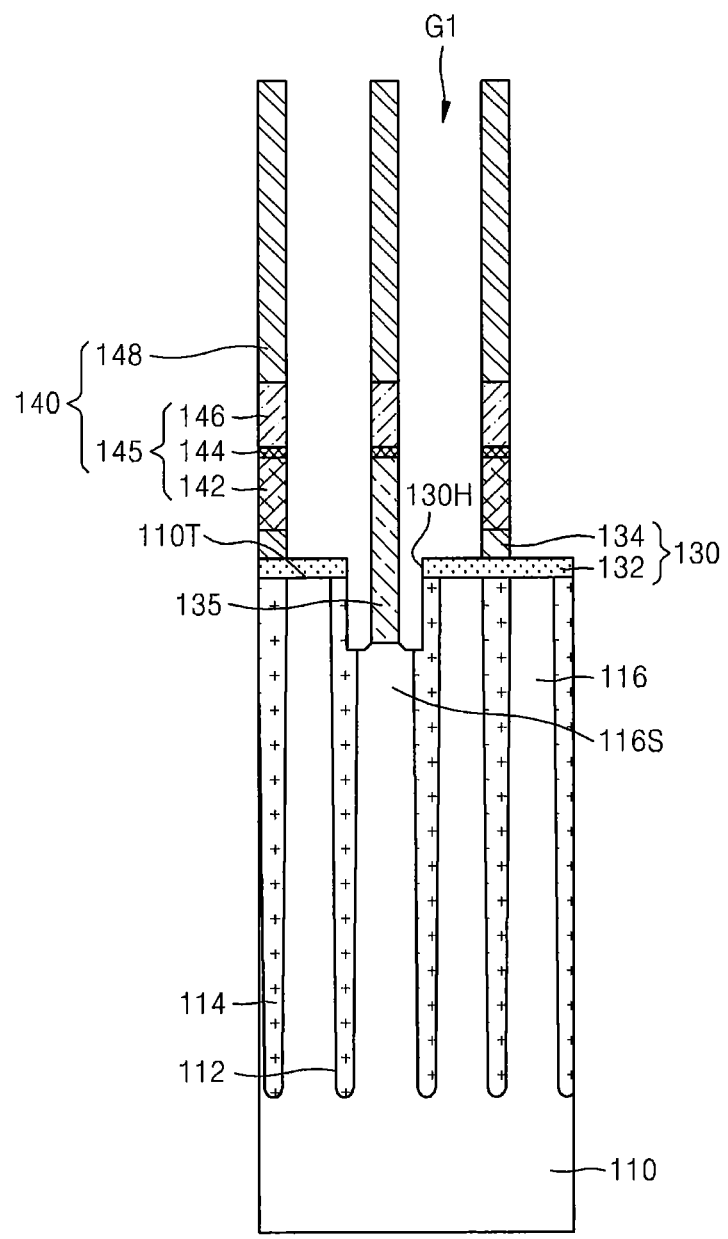
FIGS. 2A-2C, 3A-3C, 4A-4C, 5A-5C, 6A-6D, 7A-7D, 8A-8D, 9A-9D, 10A-10C, 11A-11C, 12A-12C and 13A-13C are cross-sectional and plan views illustrating methods of manufacturing a semiconductor device according to certain embodiments of the inventive concepts.
Figure 2B:
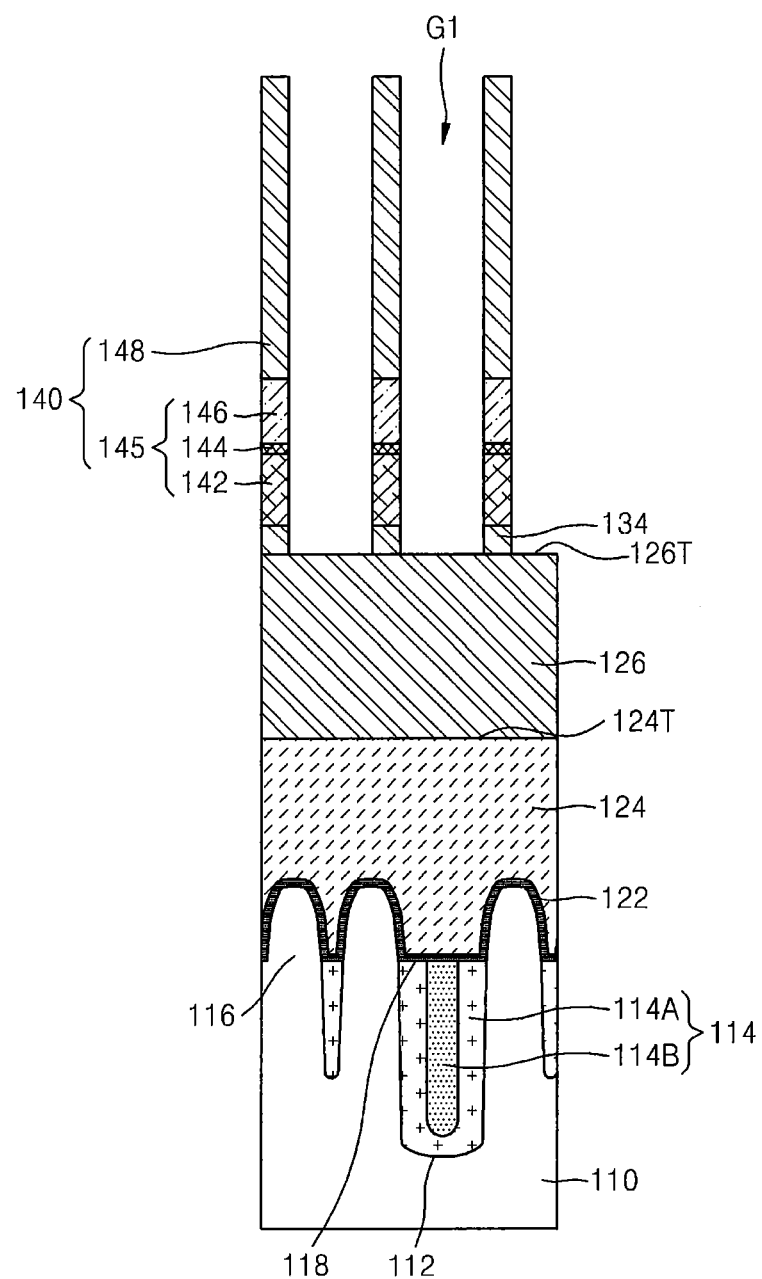
Figure 2C:
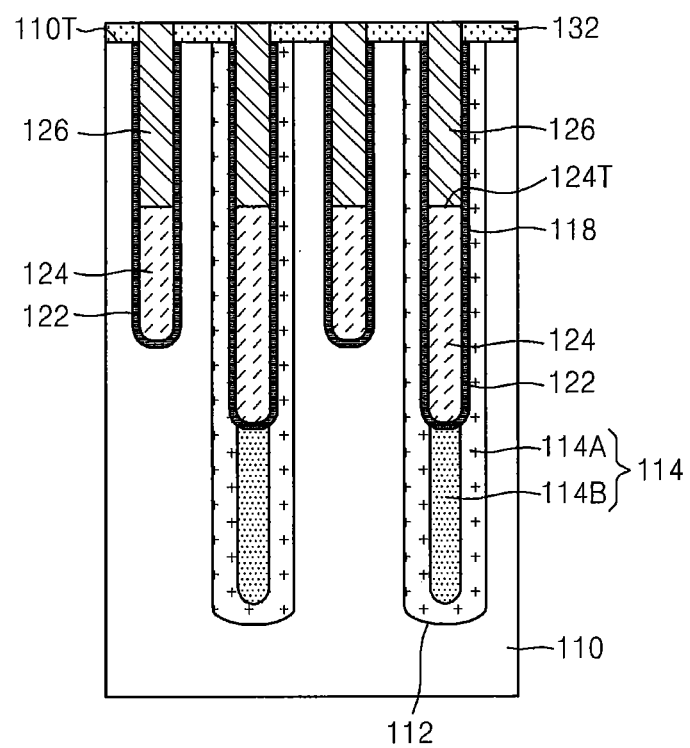

Referring to FIGS. 2A to 2C, an isolation trench pattern 112 is formed in a substrate 110, and an isolation pattern 114 is formed in the isolation trench pattern 112. A plurality of active regions 116 may be defined in the substrate 110 by the isolation pattern 114. As illustrated in FIG. 1, each active region 116 (also referred to as ACT in FIG. 1) may have an island shape having a minor axis and a major axis, and may be disposed in the shape of a diagonal line that forms an oblique angle with respect to the word lines 124 that cross each active region 116.

The substrate 110 may include silicon (Si), for example, crystalline Si, polycrystalline Si, or amorphous Si. In other embodiments, the substrate 110 may include germanium (Ge), or a compound semiconductor such as SiGe, silicon carbide (SiC), gallium arsenide (GaAs), indium arsenide (InAs), or indium phosphide (InP). In some embodiments, the substrate 110 may include a conductive region, for example, a doped well or a doped structure.

The isolation pattern 114 may include one insulating layer or may include both an outer insulating pattern 114A and an inner insulating pattern 114B, as illustrated in FIGS. 2B and 2C. The outer insulating pattern 114A and the inner insulating pattern 114B may be formed of different materials. For example, the outer insulating pattern 114A may be formed of an oxide layer, and the inner insulating pattern 114B may be formed of a nitride layer. However, the configuration of the isolation pattern 114 is not limited thereto. For example, the isolation pattern 114 may include at least three types of insulating layers in further embodiments.

A plurality of word line trenches 118 are formed in the substrate 110. The word line trenches 118 may extend in parallel to each other, and may have a linear shape extending across the active regions 116.

As illustrated in FIG. 2B, the word line trenches 118 may have uneven bottom surfaces. The isolation pattern 114 and the substrate 110 may be etched by separate etching processes such that the etching depth of the isolation pattern 114 is different from the etching depth of the substrate 110.

The resulting structure including the word line trenches 118 is cleaned, and then a gate dielectric layer 122, a word line 124, and a buried insulating layer 126 are sequentially formed in each word line trench 118, as shown in FIGS. 2B and 2C.

In some embodiments, after the word lines 124 are formed, the word lines 124 may be used as a mask to implant dopant ions into the substrate 110 at both sides of the word lines 124 to form source/drain regions in the top surfaces of the active regions 116. One such source region 116S is illustrated in FIG. 2A. A direct contact DC may be connected to the source/drain region 116S. In other embodiments, the dopant ion implantation process for forming the source/drain regions may be performed before the word lines 124 are formed.

As shown in FIG. 2C, the top surfaces 124T of the word lines 124 may be lower than the top surface 110T of the substrate 110. The bottom surfaces of the word lines 124 may have an uneven (i.e., non-planar) shape as illustrated in FIG. 2B, thereby forming saddle fin structure transistors (saddle FINFET) in the active regions 116. In some embodiments, the word lines 124 may be formed of at least one of titanium (Ti), titanium nitride (TiN), tantalum (Ta), tantalum nitride (TaN), tungsten (W), tungsten nitride (WN), titanium silicon nitride (TiSiN), and tungsten silicon nitride (WSiN).

The gate dielectric layer 122 may be formed of at least one of a silicon oxide layer, a silicon nitride layer, a silicon oxynitride layer, an oxide/nitride/oxide (ONO) layer, and a high-k dielectric layer that has a higher dielectric constant than a silicon oxide layer. For example, the gate dielectric layer 122 may have a dielectric constant of about 10 to about 25. In some embodiments, the gate dielectric layer 122 may be formed of at least one of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). In other embodiments, the gate dielectric layer 122 may be formed of $HfO_2$, $Al_2O_3$, $HfAlO_3$, $Ta_2O_3$, or $TiO_2$.

A top surface 126T of each buried insulating layer 126 may, in some embodiments, be at a higher level, or substantially the same level, as the top surface 110T of the substrate 110. The buried insulating layers 126 may be formed of, for example, a silicon oxide layer, a silicon nitride layer, a silicon oxynitride layer, or any combinations thereof.

A silicon oxide layer may be formed over the substrate 110. The resulting structure is planarized by chemical mechanical polishing (CMP) so that the silicon oxide pattern 132 is provided between the buried insulating layers 126, as shown in FIGS. 2A and 2C. A silicon nitride layer 134 may be formed over the resulting structure. The silicon nitride pattern 134 and the silicon oxide pattern 132 may constitute an interlayer insulating layer pattern 130. The interlayer insulating layer pattern 130 may have a thickness of about 200 Å to about 400 Å. In some cases, the interlayer insulating layer pattern 130 may be formed of a single layer of silicon oxide. For example, the interlayer insulating layer pattern 130 may be formed of tetraethylorthosilicate (TEOS), high density plasma (HDP), or boro-phospho silicate glass (BPSG).

The interlayer insulating layer pattern' 130 may include a plurality of openings 130H that expose the source regions 116S of the active regions 116. A spacer (not illustrated) formed of a different material than the isolation pattern 114 may be formed on sidewalls of the openings 130H. For example, when the isolation pattern 114 is formed of silicon oxide, the spacer may be formed of silicon nitride. After the spacer is formed, the openings 130H may be filled with a conductive material to form a plurality of direct contacts 135 that are electrically connected to the respective source regions 116S of the active regions 116.

Thereafter, a plurality of bit line structures 140, which are arranged in parallel to each other in the second direction (X-axis direction of FIG. 1), are formed on the interlayer insulating layer pattern 130 and the on direct contacts 135. The bit line structures 140 extend in the first direction (Y-axis direction of FIG. 1). Each of the bit line structures 140 may include a bit line 145 and an insulating capping line 148 that covers a top surface of the bit line 145. Each bit line 145 may be electrically connected to a plurality of the direct contacts 135, as shown in FIG. 1.

In some embodiments, the bit lines 145 may be formed of at least one of doped semiconductor, metal, metal nitride, and metal silicide. The bit lines 145 may be formed of a single layer or may be formed as a multilayer structure, as illustrated. For example, the bit lines 145 may have a stacked structure in which doped polysilicon 142, tungsten nitride 144, and tungsten 146 are sequentially stacked.

In some embodiments, the insulating capping lines 148 may be formed of a silicon nitride layer. The thickness of the insulating capping lines 148 may be greater than the thickness of the bit lines 145.

In some embodiments, in order to form the bit line structures 140, a bit line conductive layer is formed on the interlayer insulating layer pattern 130 and the direct contacts 135, and an insulating layer is formed to cover the bit line conductive layer. The thickness of the insulating layer may be greater than the thickness of the bit line conductive layer. The insulating layer is patterned to form the insulating capping lines 148. Thereafter, the insulating capping lines 148 are used as an etch mask, and the bit line conductive layer is etched to form the bit lines 145.

In some embodiments, when the bit line conductive layer is etched, a portion of the interlayer insulating layer pattern 130 may be etched by over-etching and accordingly, a step portion may be formed at a top surface of the interlayer insulating layer pattern 130. For example, the silicon nitride layer 134 on the interlayer insulating layer pattern 130 may be etched to expose the silicon oxide layer 132. Also, the silicon nitride spacer (not illustrated) may be removed to expose the openings 130H that surround the respective direct contacts 135.

In some embodiments, the bit line conductive layer may be a multilayer structure. For example, the bit line conductive layer may have a multilayer structure in which a first metal silicide layer, a conductive barrier layer, a second metal silicide layer, and an electrode layer formed of metal or metal nitride are sequentially stacked. In the semiconductor device 100 according to the present embodiment, the bit line conductive layer may include, for example, a doped polysilicon layer, a tungsten nitride layer, and a tungsten layer.

As illustrated, linear openings, that is, a plurality of first grooves G1, may be formed between adjacent bit line structures 140. The bit line structures 140 may be spaced apart from each other by the first grooves G1. The first grooves G1 extend in the first direction (Y-axis direction). As illustrated in FIG. 1, the bit line structures 140 may extend in the first direction, and may be spaced apart from each other in the second direction (X-axis direction) that is perpendicular to the first direction (Y-axis direction).

Figure 3A:
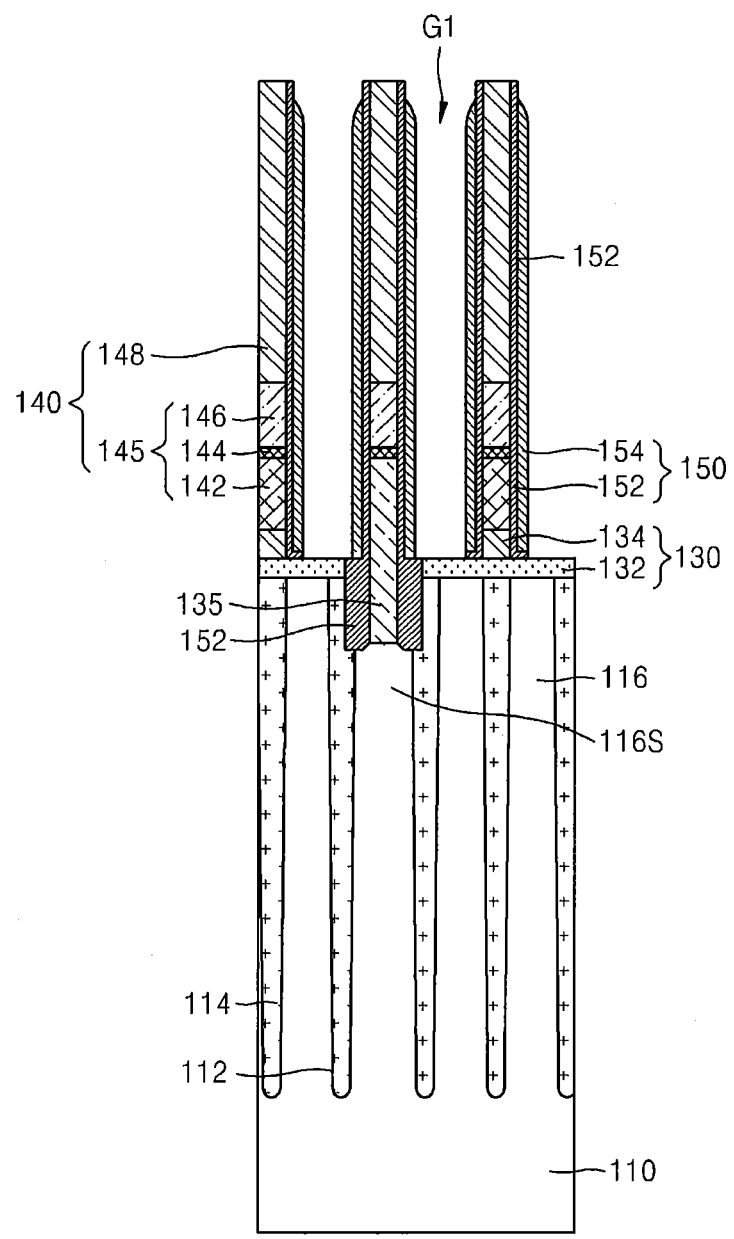
Figure 3B:
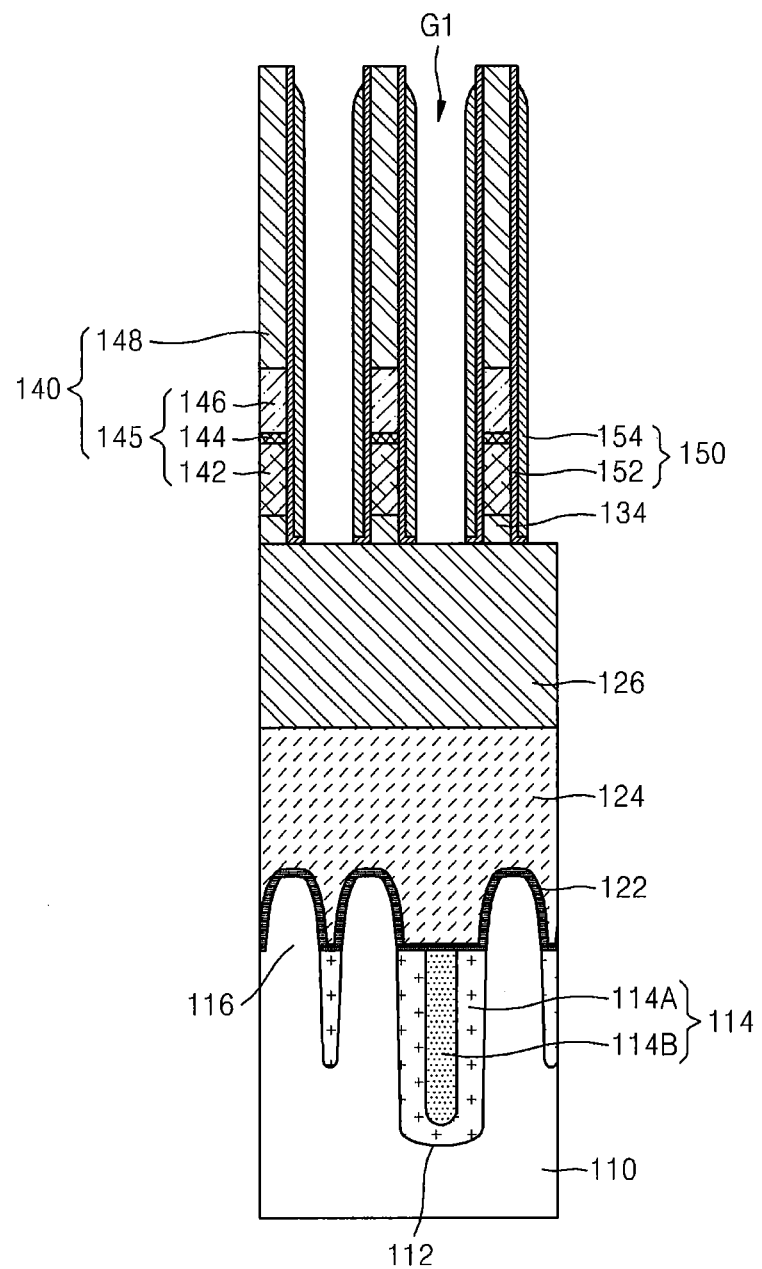
Figure 3C:
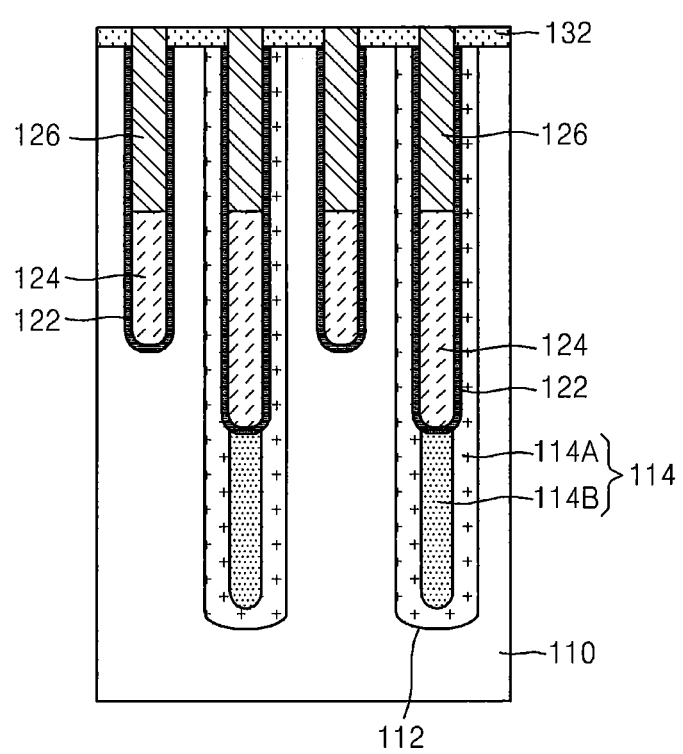

Referring to FIGS. 3A to 3C, insulating liners 152 are formed to cover the exposed top surfaces and sidewalls of the bit line structures 140 and the exposed surfaces of the interlayer insulating layer pattern 130. As shown in FIG. 3A, the insulating liners 152 may fill the opening 130H. The insulating liners 152 may be first spacers that are formed on both sidewalls of each bit line structure 140. In some embodiments, the insulating liners 152 may be used as an etch stop layer in a subsequent process. The insulating liners 152 may also be used as a protection layer for protecting the bit line structures 140.

In some embodiments, the insulating liners 152 may be silicon nitride liners. The insulating liner 152 may have a thickness of, for example, about 30 Å to about 80 Å.

Subsequently, a second spacer insulating layer is deposited on the resulting structure including the insulating liner 152. Thereafter, by using the insulating liner 152 as an etch stop layer, the second spacer insulating layer is etched back to form second spacers 154 on both sidewalls of the bit line structures 14Q. The second spacers 154 may cover the insulating liner 152. In some embodiments, the second spacers 154 may be formed of silicon oxide (as an example of oxide), a silicon germanium (SiGe) compound, or a polymer. However, the second spacers 154 may alternatively be formed of other materials.

The second spacers 154 may be formed of a material that has an etch selectivity with respect to the insulating liner 152. For example, the second spacers 154 may be formed of an insulating material or a conductive material. In the semiconductor device 100 according to the present embodiment, the second spacers 154 may be formed of silicon oxide. The insulating liners 152 (first spacers) and the second spacers 154 may constitute multilayer spacers 150 that surround both sidewalls of each bit line structure 140.

As illustrated, the top surface and bottom surface of the insulating liners 152 may be removed during the etch-back process that is performed to form the second spacers 154. By controlling an etch rate of the second spacers 154, the top surface and bottom surface of the insulating liner 152 may be maintained without being removed.

After forming the second spacers 154 via the etch-back process, the interlayer insulating layer pattern 130 may be exposed under the first grooves G1. For example, as shown in FIG. 3A by a subsequent etch-back process, material layers constituting the insulating liners 152 and the second spacers 154 that are formed in the lower portions of the first grooves G1 may be removed to expose the silicon oxide pattern 132.

Figure 4A:
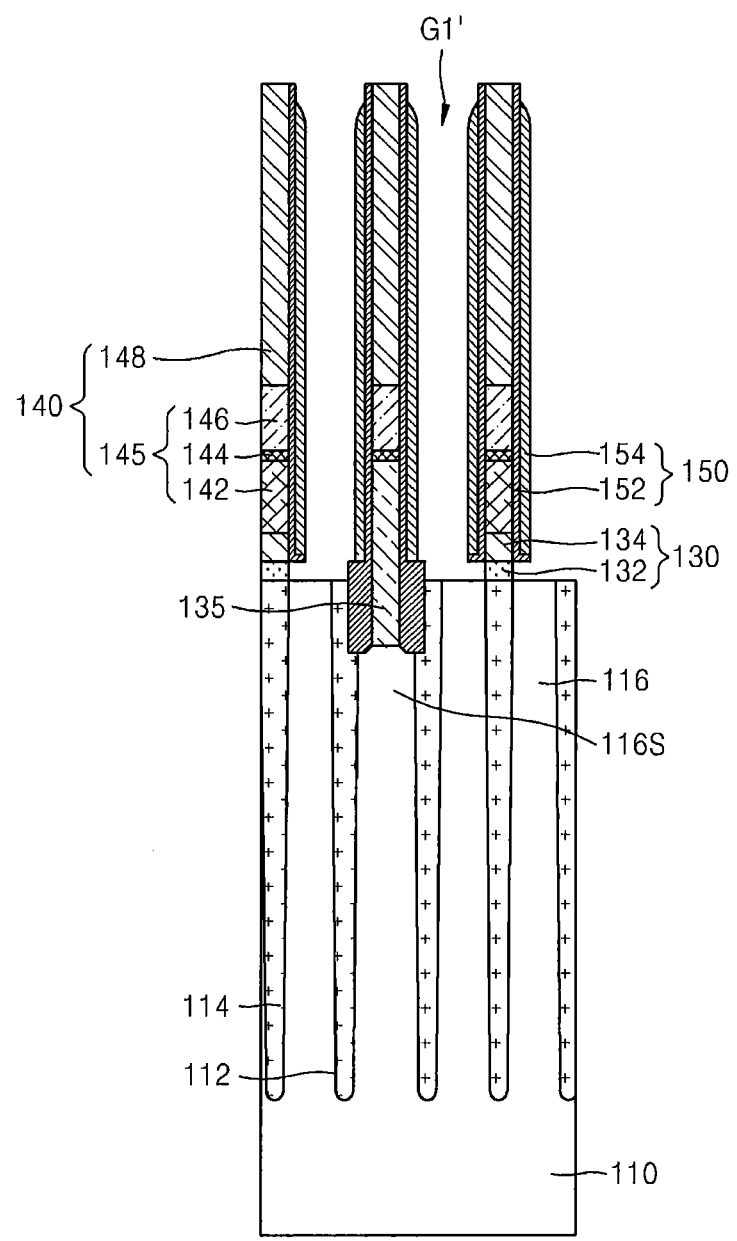
Figure 4B:
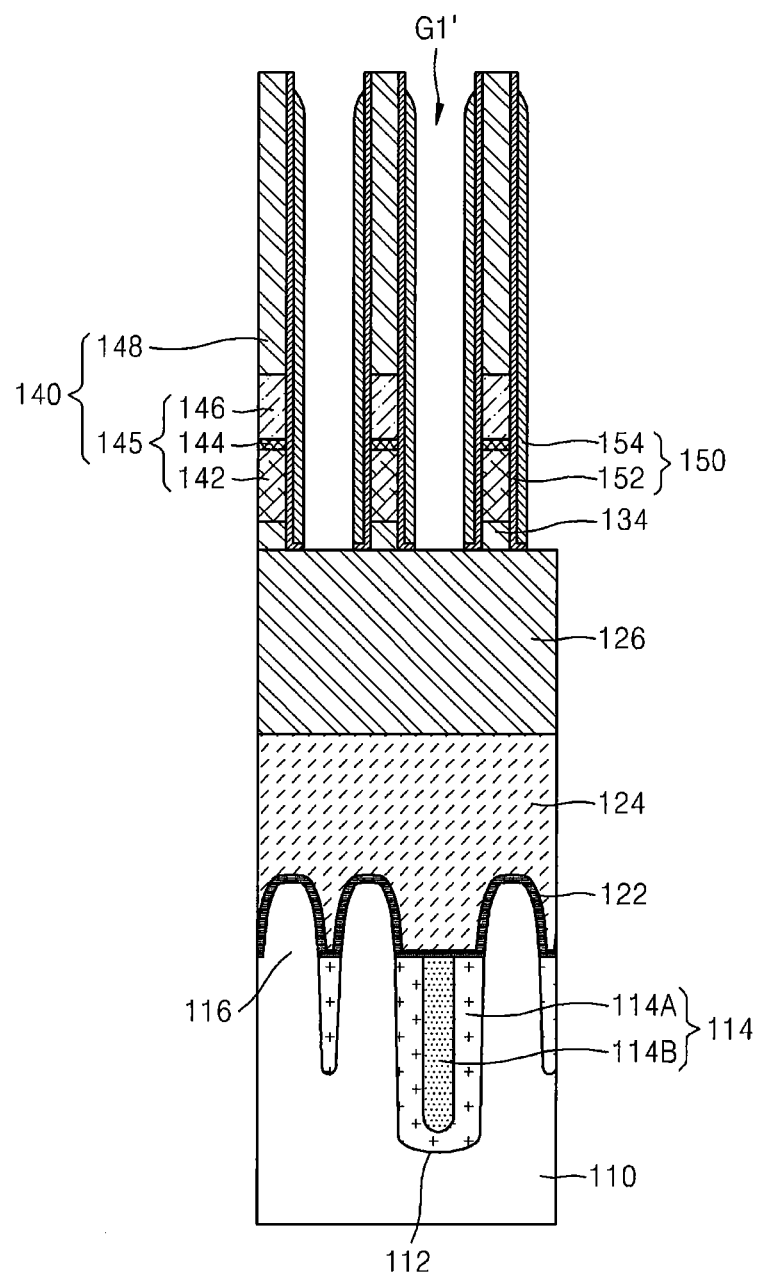
Figure 4C:
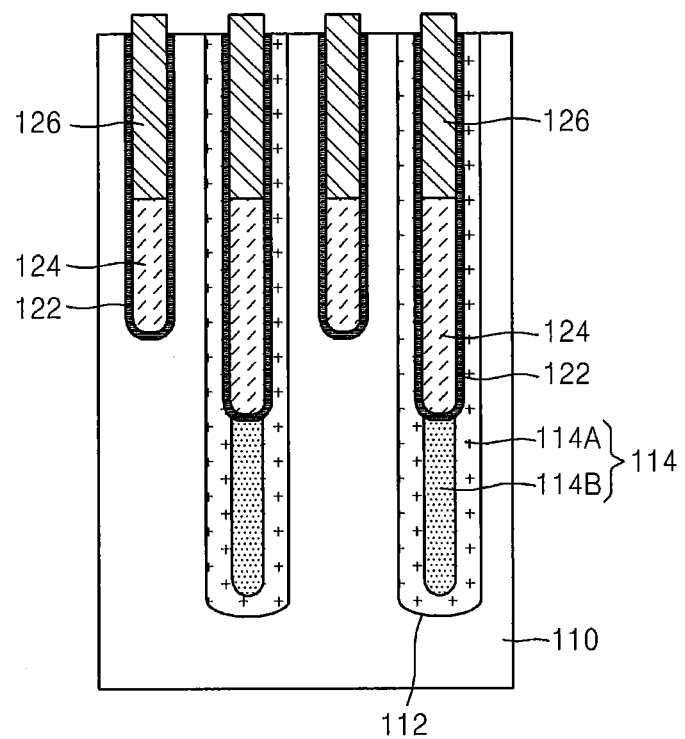

Referring to FIGS. 4A to 4C, the second spacers 154 may be used as an etch stop layer to etch the silicon oxide pattern 132 under the first grooves G1 to expose portions of the top surface of the active regions 116. A portion of the top surfaces of the isolation layers 114 that are adjacent to the active regions 116 may be exposed simultaneously with the exposure of the top surfaces of the active regions 116.

As discussed above, in the semiconductor device manufacturing method according to the present embodiment, the active regions 116 may be exposed during the process of forming the multilayer spacer 150 of the bit line structures 140. Accordingly, the active regions 116 may be exposed through linear openings. In detail, the bit line structures 140 may have a linear structure, and the first grooves G1 between the bit line structures 140 may also be linear structures. Thus, the first grooves G1 may have a linear shape after the multilayer spacer 150 that covers the bit line structures 140 is formed. Thus, by etching the silicon oxide layer 132 using the multilayer spacer 150 as an mask, linear openings may be formed that expose the active regions 116.

By exposing the active regions 116 through linear openings, the possibility of occurrence of an NOP may be reduced and an etch rate of the mask in the etching process may be reduced in comparison to manufacturing methods in which the openings exposing the active regions 116 have a polygonal or circular horizontal cross-section (i.e., a cross-section taken in the x-y plane).

The mask that is used in the etching process may be a nitride mask or an oxide mask, and a mask loss rate may be large since an etch rate is excessively large when forming openings that are shaped like the contacts (e.g., openings having a polygonal or circular horizontal cross-section). Accordingly, while the open region needs to be expanded or the thickness of the mask needs to be increased in the opening process of a contact shape, there is a limit due to the scale-down of devices.

Consequently, as in the semiconductor device manufacturing method according to the present embodiment, by exposing the active regions 116 through linear openings as part of the process of forming the multilayer spacer 150, the openings may be larger and the etching process may be more stably performed. That is, by the semiconductor device manufacturing method according to the present embodiment, an NOP margin may be increased, a mask loss rate may be reduced, and a buried contact (BC) recess distribution may be reduced.

Referring again to FIGS. 4A to 4C, after the top surfaces of the active regions 116 are exposed, a wet etching process may be performed on an oxide layer, for example, the silicon oxide layer 132 to increase the area of the openings exposing the top surfaces of the active regions 116. Since the portions of the top surfaces of the active regions 116 that are exposed are enlarged, a contact area between the active regions 116 and the buried contacts BC, which will be formed by filling the first grooves G1 with a conductive material, may also be increased. Accordingly, a contact resistance between the buried contacts BC and their respective active regions 116 may be reduced. The wet etching process may expand the first grooves G1 to form expanded first grooves G1'.

In some cases, the wet etching process of the present process may be omitted. For example, when a sufficient portion of the top surfaces of the active regions 116 are exposed by the linear openings, the additional wet etching process may be omitted.

Figure 5A:
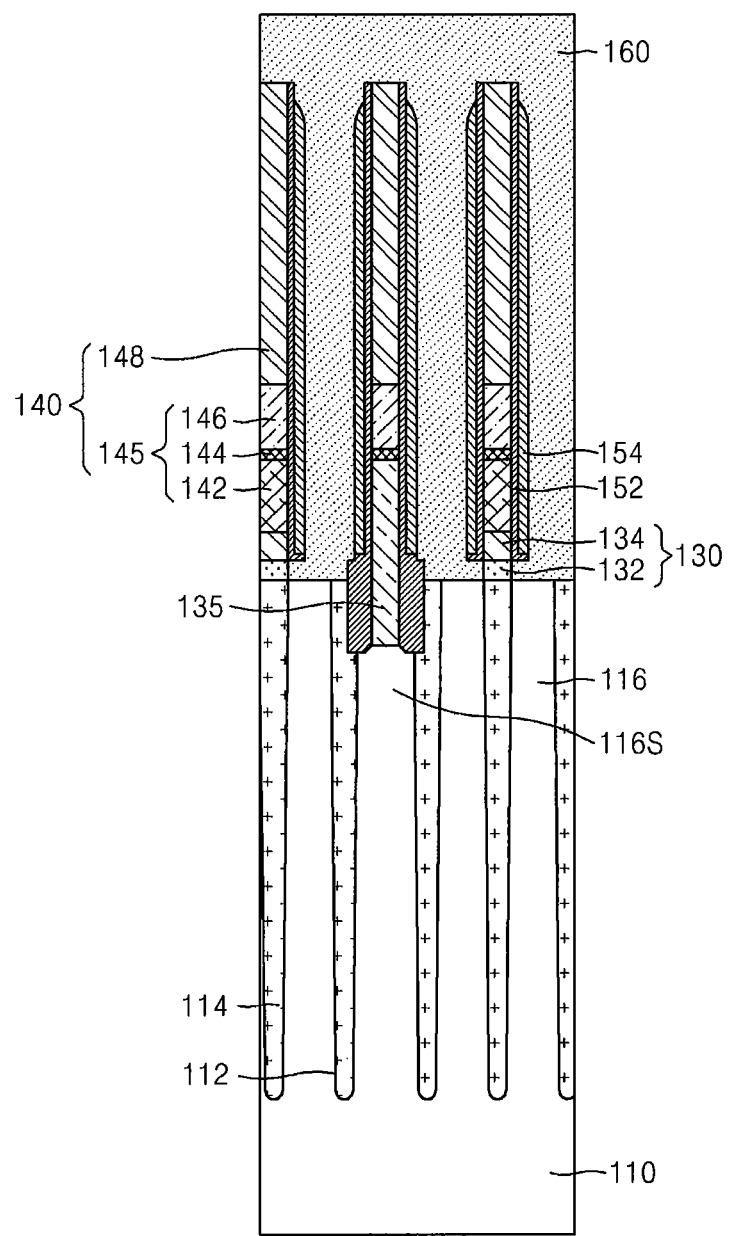
Figure 5B:
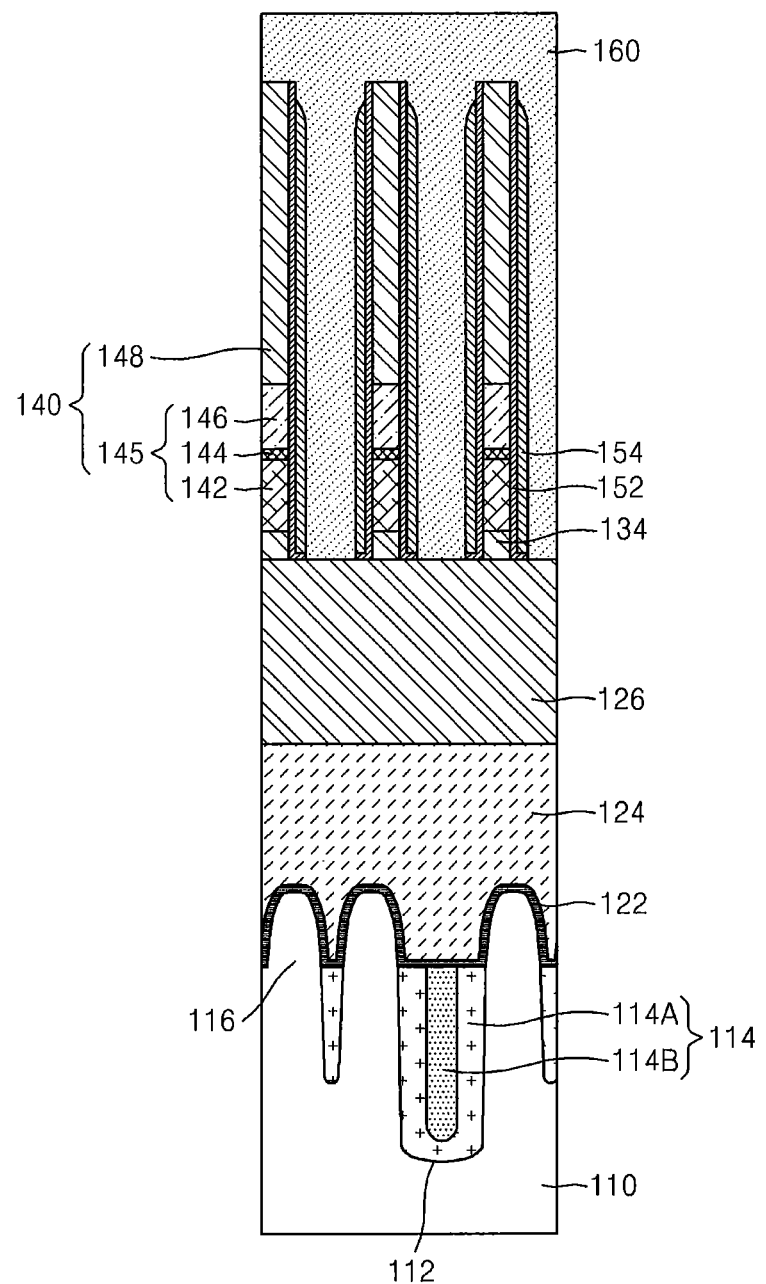
Figure 5C:
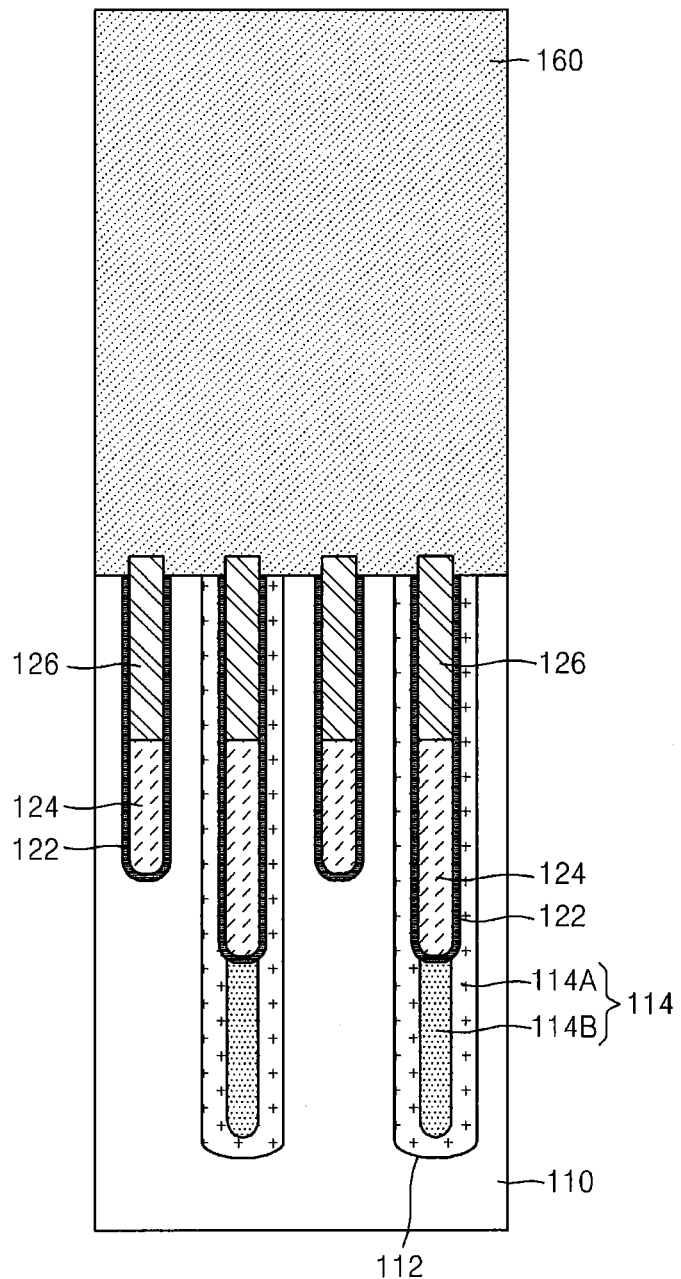

Referring to FIGS. 5A to 5C, after increasing the exposed area of the top surfaces of the active regions 116 by wet etching the silicon oxide pattern 132, a sacrificial layer 160 is formed to fill the expanded first grooves G1' and to cover the top surfaces of the multilayer spacer 150 and the bit line structures 140. In some embodiments, the sacrificial layer 160 may be an insulating layer formed of oxide or nitride, for example, SiO$_2$ or SiON.

In some embodiments, the sacrificial layer 160 may be a SOH material. Herein, the SOH material may refer to a material including a hydrocarbon compound having a relatively high carbon content of about 85 wt % to about 99 wt %, or any derivatives thereof.

The sacrificial layer 160, particularly the SOH sacrificial layer 160, may be formed by b depositing an organic compound by a spin coating process or other deposition processes to form an organic compound layer, and then performing one or more baking processes. The organic compound may include a hydrocarbon compound including an aromatic ring, such as phenyl, benzene, or naphthalene, or any derivatives thereof. Also, the organic compound may include a material having a relatively high carbon content of about 85 wt % to about 99 wt %.

The organic compound may be deposited by spin coating or the like to form the organic compound layer. Thereafter, the organic compound layer may be primarily baked at a temperature of about 150° C. to about 350° C. to form a carbon containing layer. The primary baking may be performed for about 60 seconds. Thereafter, the carbon containing layer may be secondarily baked at a temperature of about 300° C. to about 550° C. to form the SOH sacrificial layer 160. The secondary baking may be performed for about 30 seconds to about 300 seconds. Since the carbon containing layer is cured by the secondary baking process to form the SOH sacrificial layer 160, the sacrificial layer 160 may not be adversely affected during a subsequent deposition process even when the subsequent deposition process is performed at a relatively high temperature of about 400° C. to form another material layer on the sacrificial layer 160.

The SOH sacrificial layer 160 may be easily removed by an ashing and stripping process, without performing a separate subsequent process. In some embodiments, the sacrificial layer 160 may be formed of an amorphous carbon layer (ACL) material instead of an SOH material. The ACL material may have properties similar to those of the SOH material since it contains a large amount of carbon.

Referring to FIGS. 6A to 6D, the sacrificial layer 160 is patterned to form second grooves G2. The second grooves G2 may be spaced apart from each other in the first direction (Y-axis direction) and the second direction (X-axis direction). The second grooves G2 may comprise a plurality of holes in the sacrificial layer.

Figure 6A:
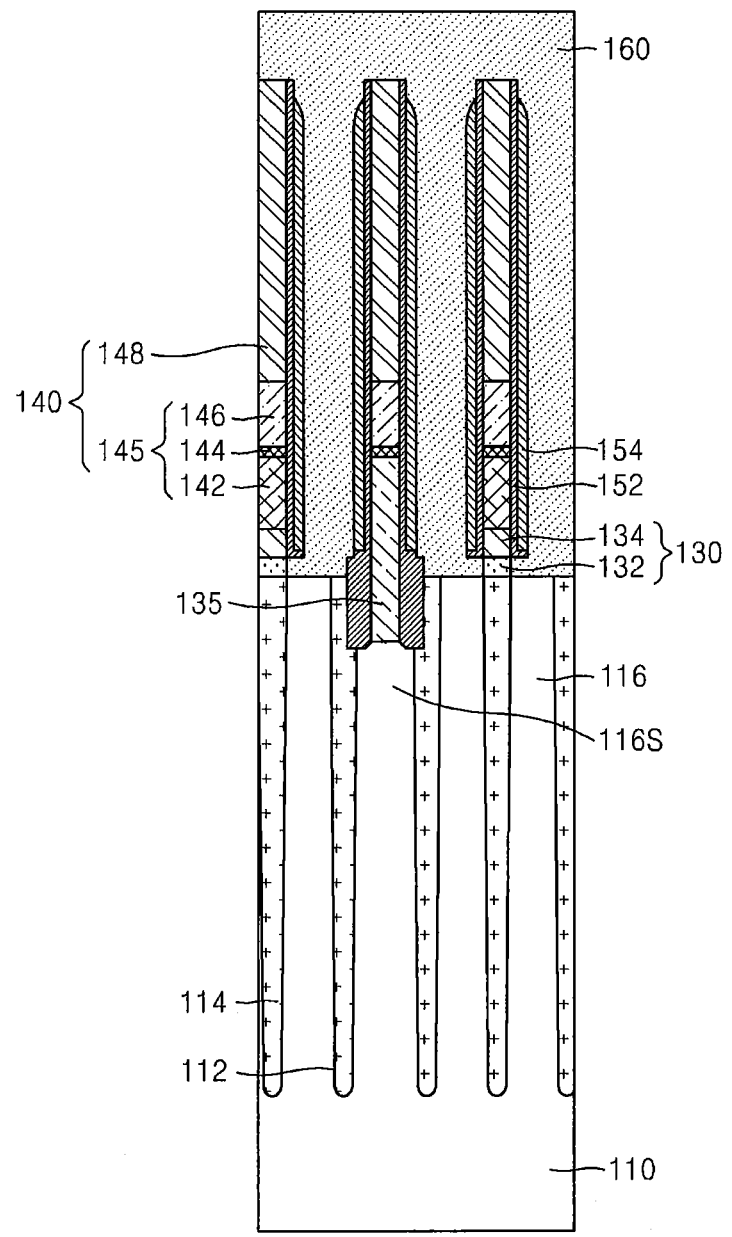
Figure 6B:
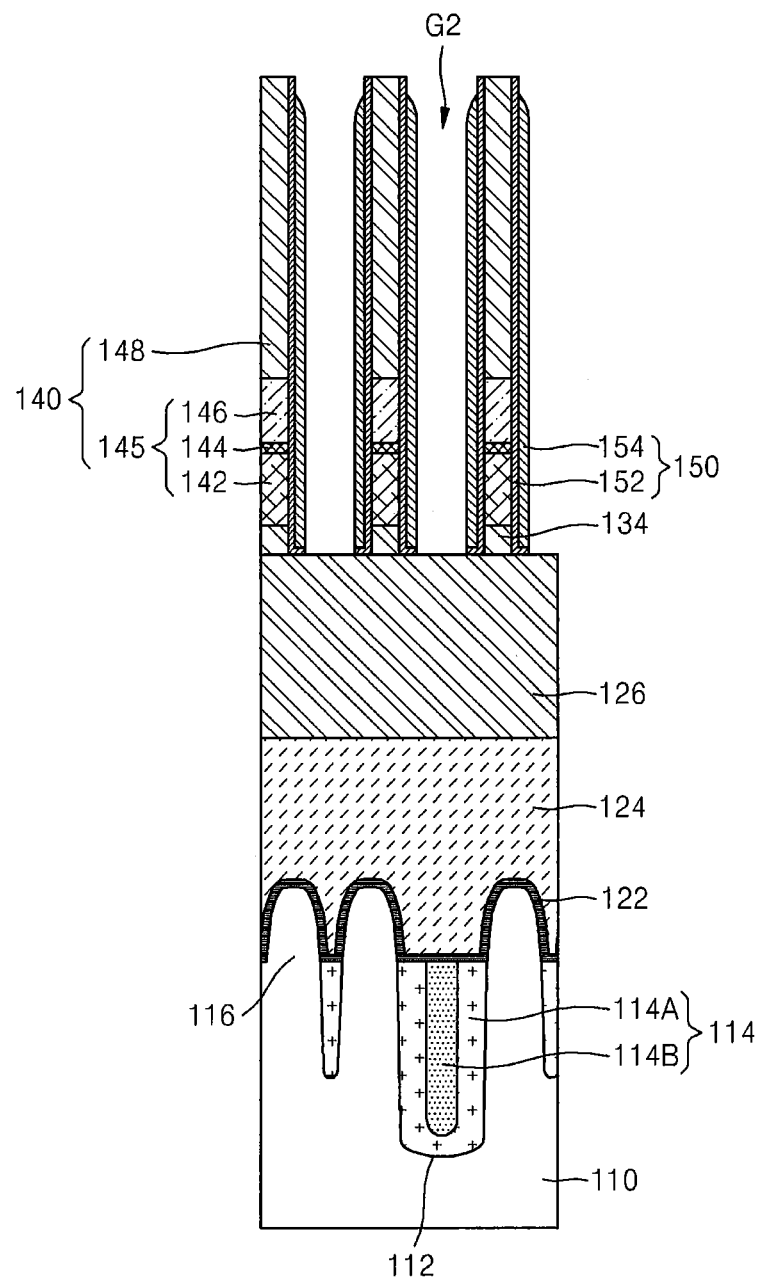
Figure 6C:
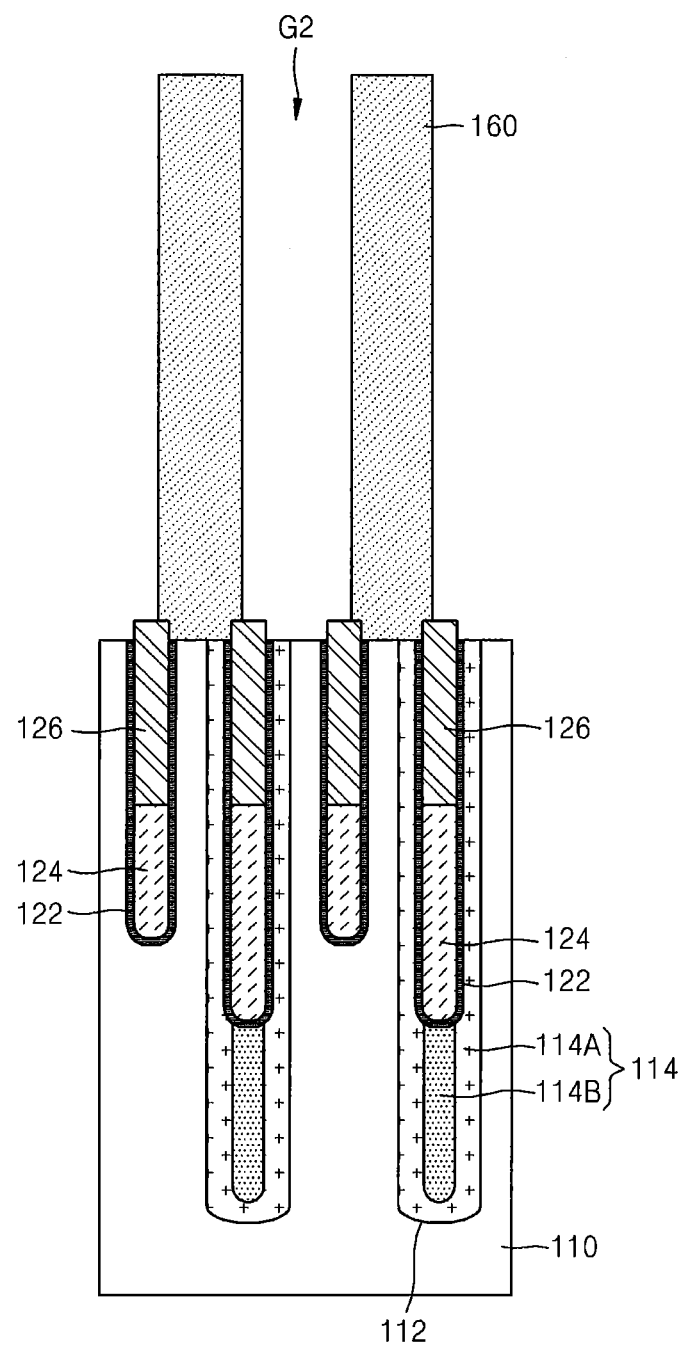
Figure 6D:
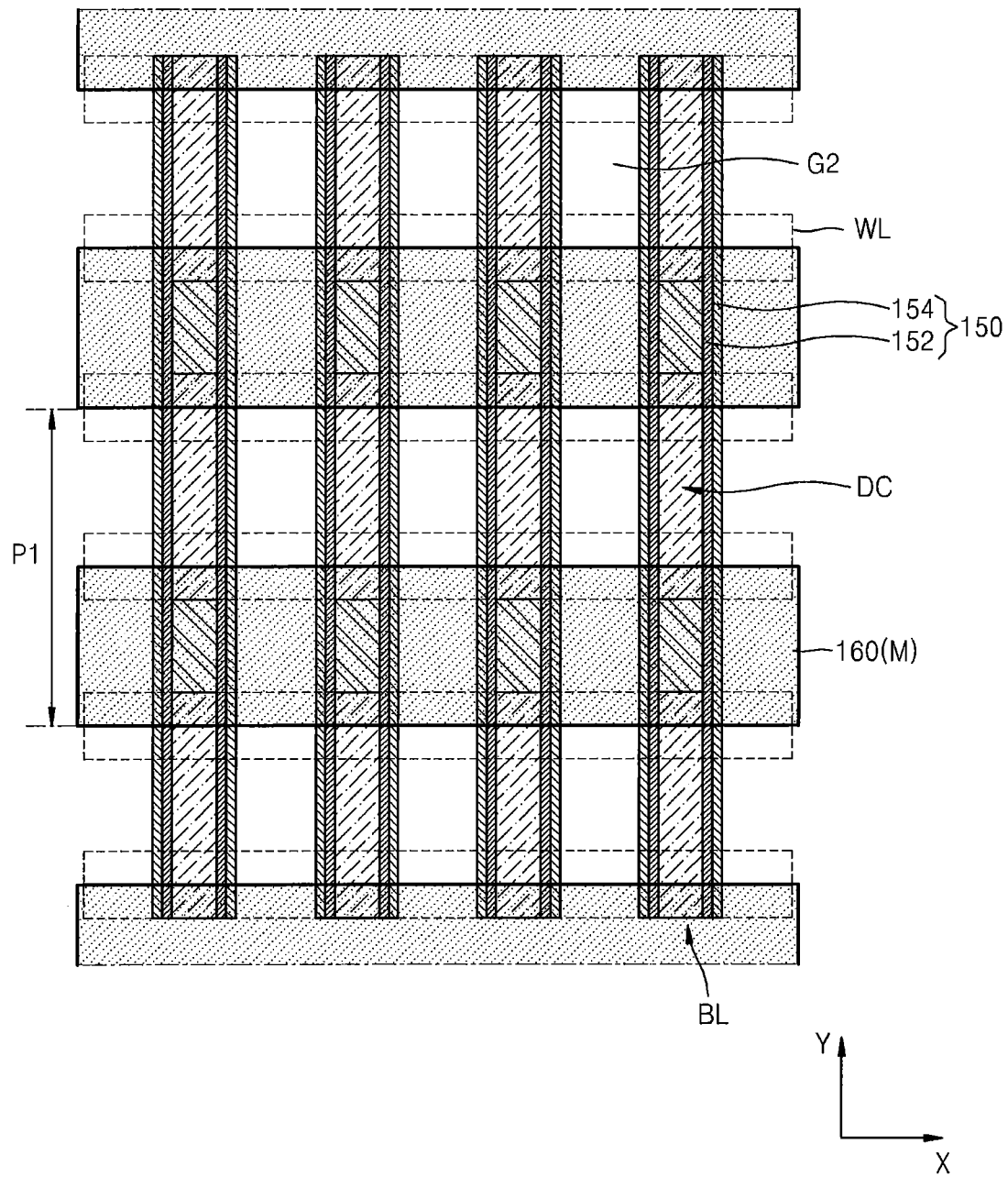

In detail, a mask pattern M (see FIG. 6D) of a predetermined shape is formed on the resulting structure that includes the sacrificial layer 160. Thereafter, using the mask pattern M, the bit line structures 140 and the multilayer spacer 150 as an etch mask, a portion of the sacrificial layer 160 is removed to form a plurality of second grooves G2 that expose the top surfaces of the buried insulating layers 126. As shown in FIG. 6D, the mask pattern M may comprise a series of parallel linear mask segments that each extend in the second direction (X-direction). Accordingly, as illustrated in FIG. 6C, the second groove G2 may expose the top surfaces of the buried insulating layers 126.

A pitch P1 of the mask pattern M (see FIG. 6D) may be about two times a pitch P2 (see FIG. 9D) of a series of third grooves G3 that will be formed later. The pitch P2 of the third grooves G3 may correspond to a pitch of the buried contacts 180 (see FIGS. 10A and 10C). Since the pitch P1 of the mask pattern M may be greater than the pitch P2 of the third grooves G3, a photo process may be performed more easily.

In the process of forming the second grooves G2, the bit line structures 140 and the multilayer spacers 150 may act as an etch mask together with the mask pattern M. Accordingly, as illustrated in FIGS. 6B and 6D, the second grooves G2 may expose the outermost spacers (that is, the second spacers 154) of the multilayer spacers 150 on the sidewalls of the bit line structures 140.

As described above, since the bit line structures 140 and the multilayer spacers 150 extend perpendicular to the word lines 124, they also extend perpendicular to the mask pattern M. Thus, the second grooves G2 may have a rectangular shape and may be surrounded by the bit line structures 140 and the multilayer spacers 150 on two sides, and by the sacrificial layer 160 on the other two sides. After the second grooves G2 are formed, the mask pattern M is removed.

In the semiconductor device manufacturing method according to the present embodiment, the second grooves G2 may correspond to a fence region that surround the buried contacts BC that are formed in a subsequent process. The second grooves G2 may correspond to a fence insulating layer in a subsequent process. The fence region may correspond to the fence insulating layer. The fence region will be described later in more detail with reference to FIGS. 14A and 14B.

Figure 7A:
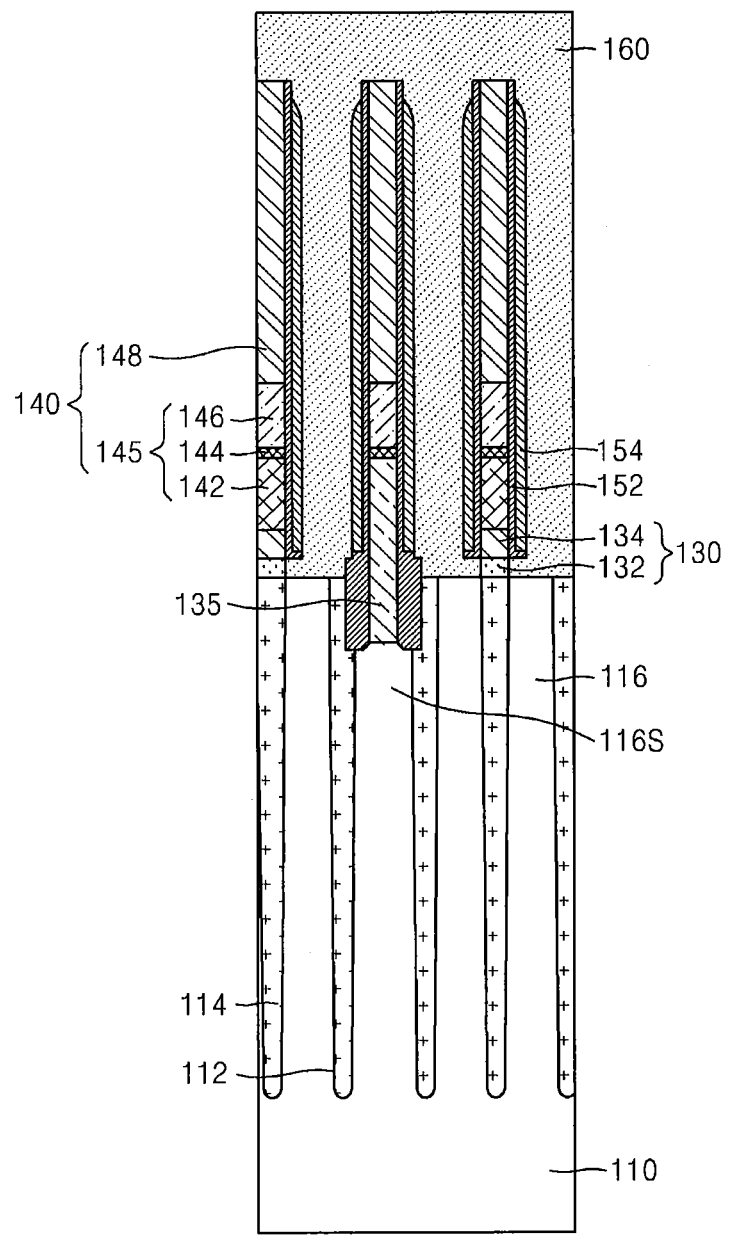
Figure 7B:
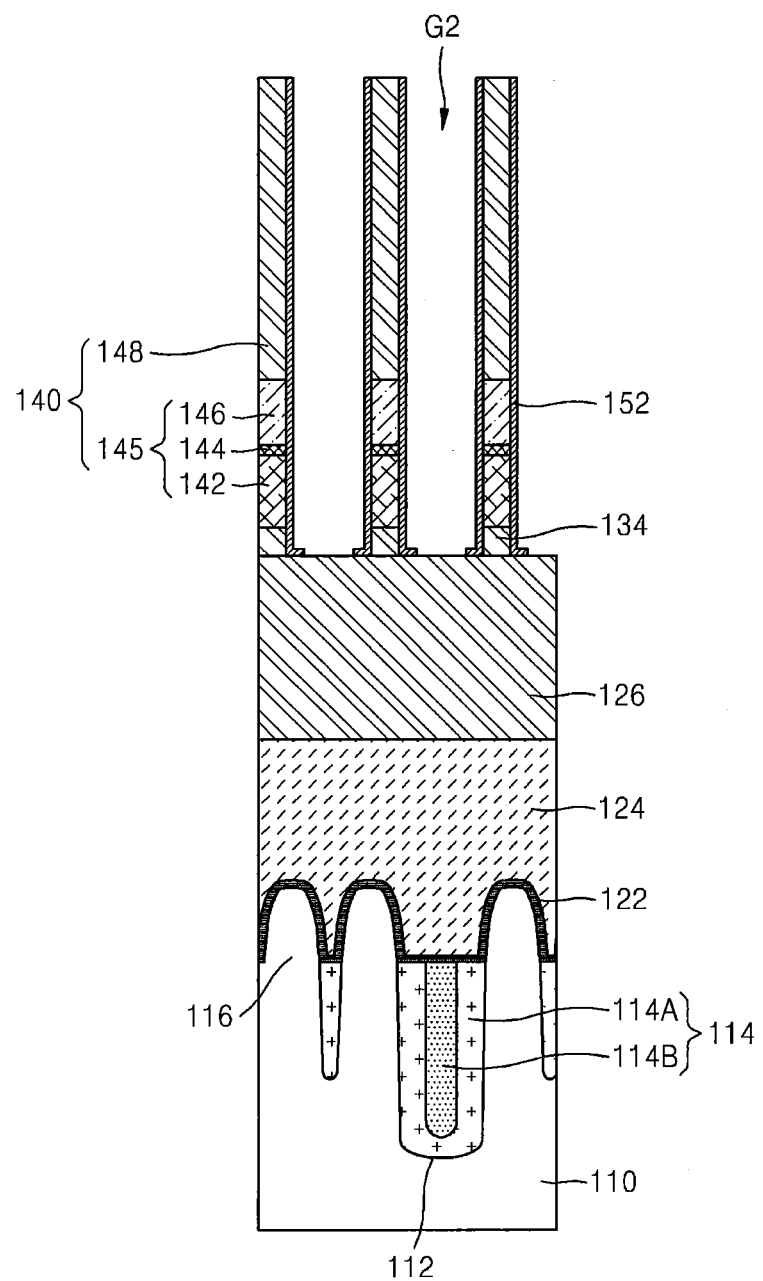
Figure 7C:
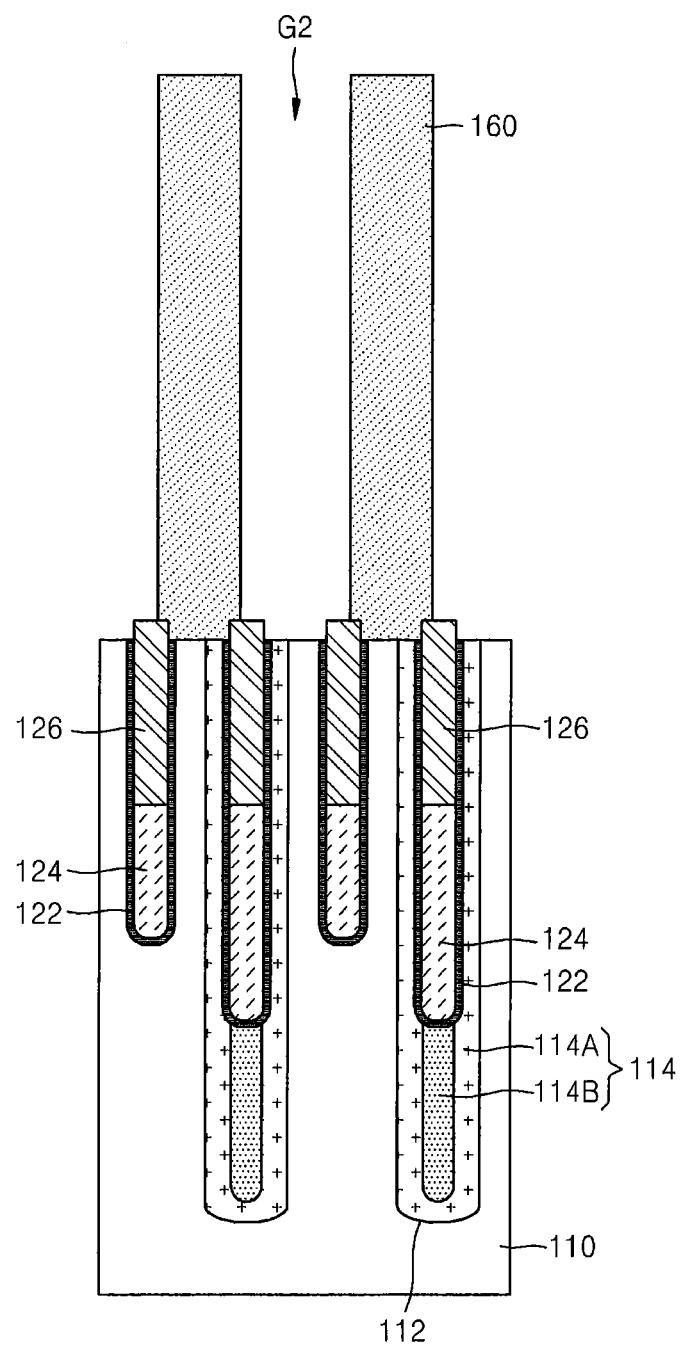
Figure 7D:
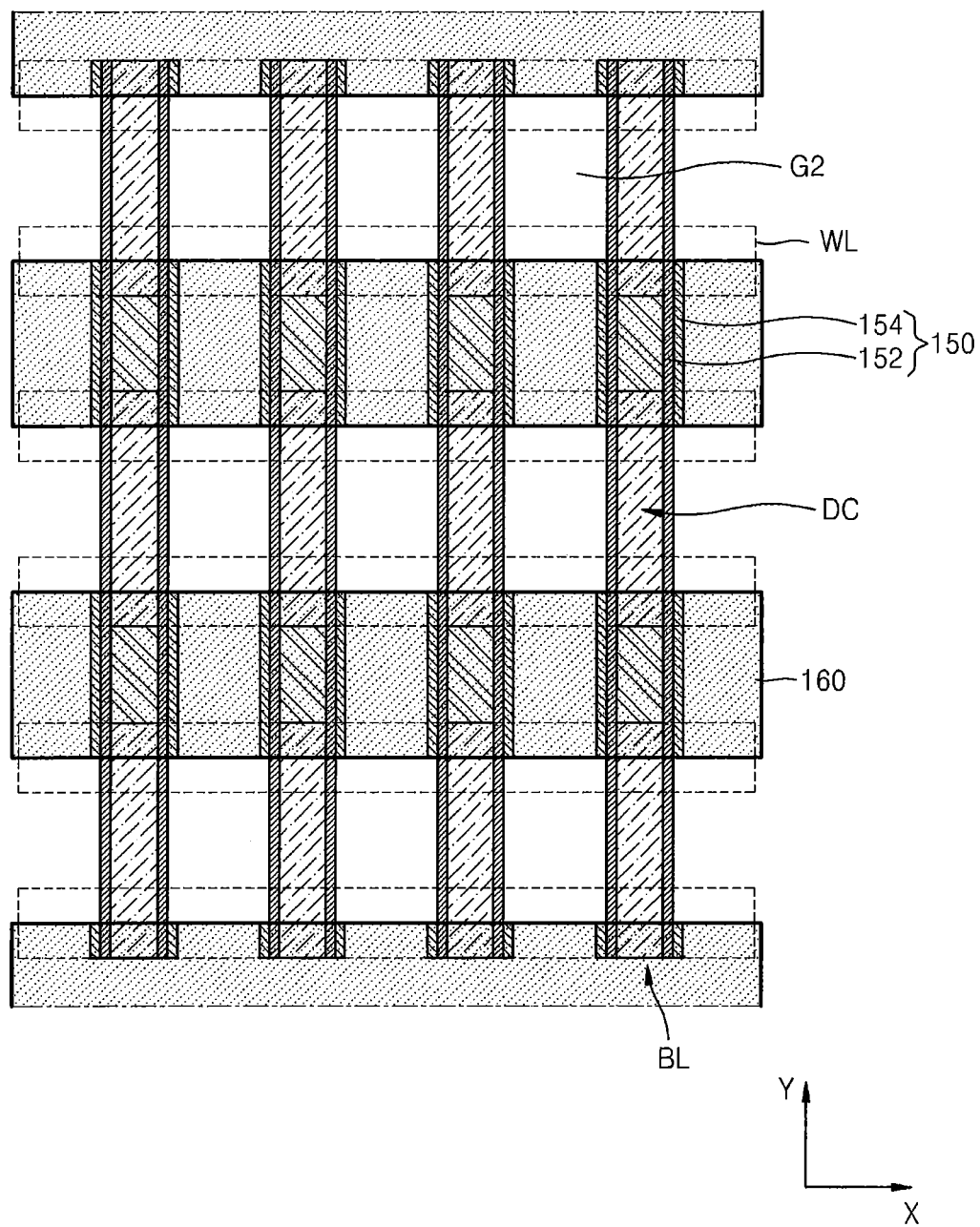
Figure 8A:
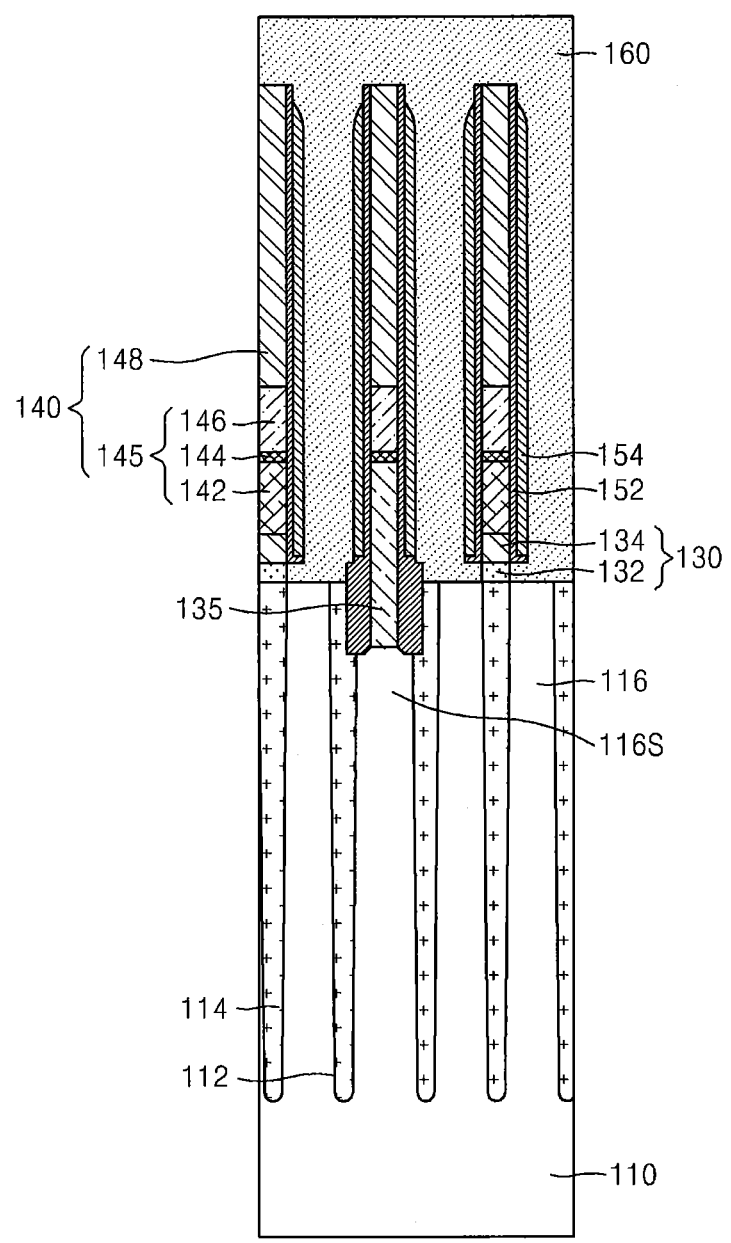
Figure 8B:
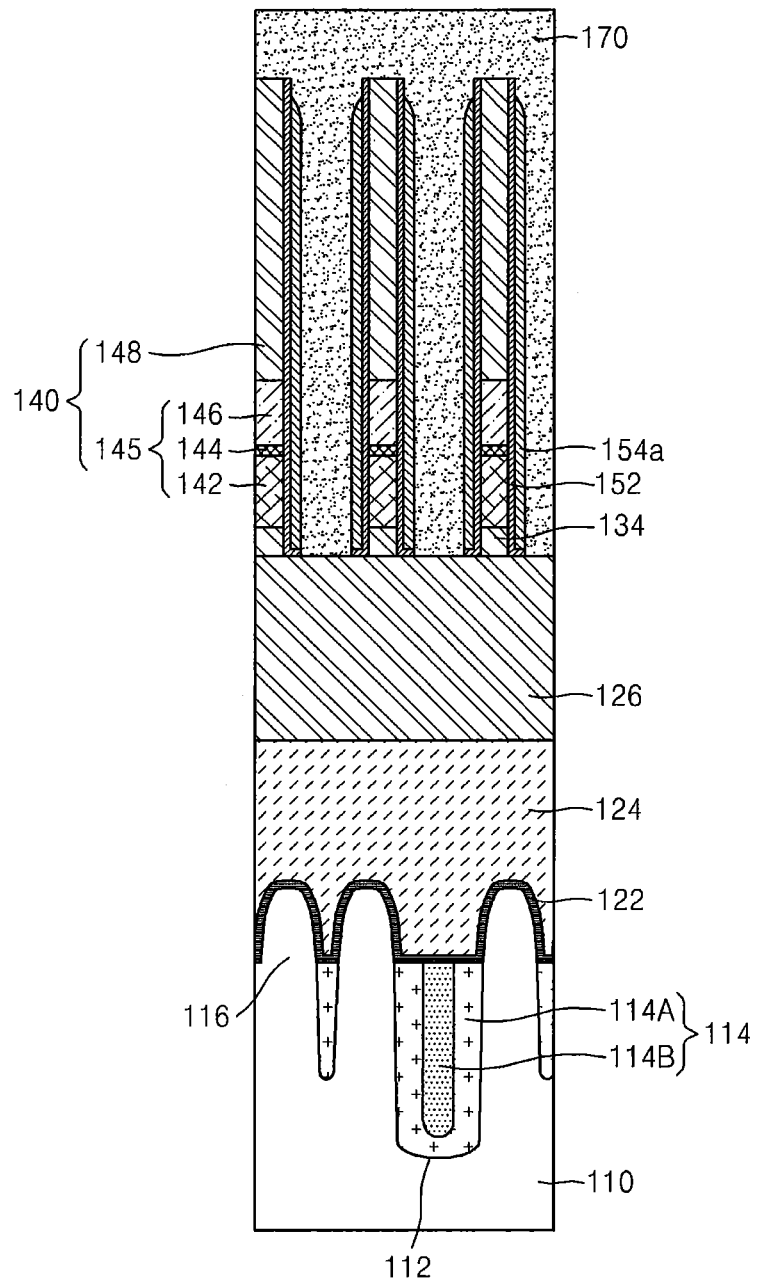
Figure 8C:
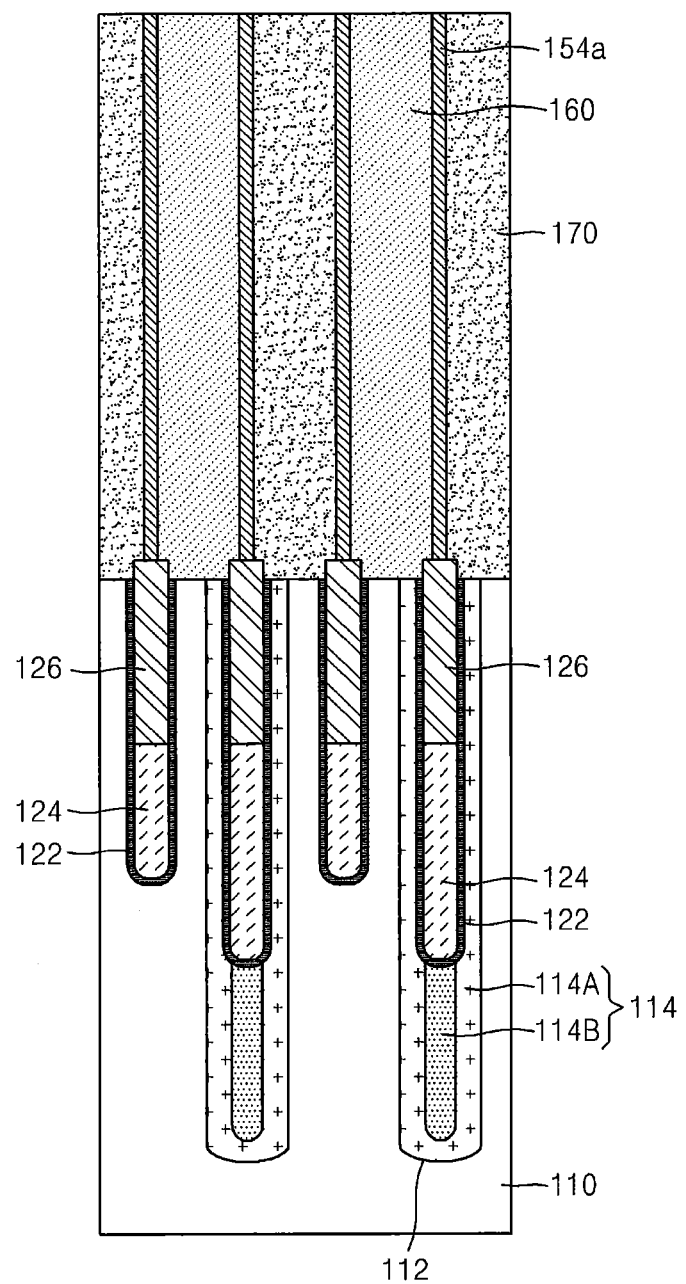
Figure 8D:
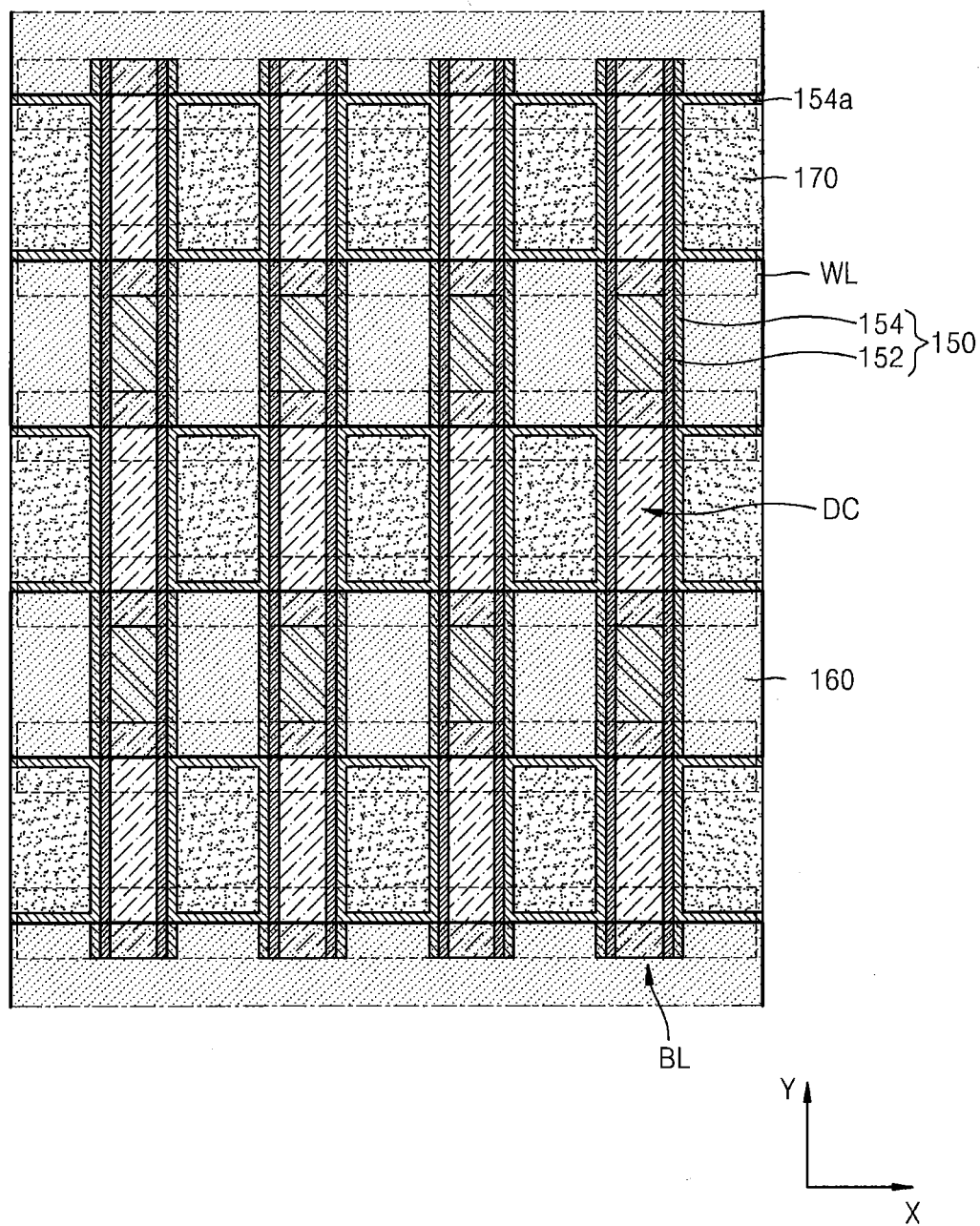
Figure 9A:
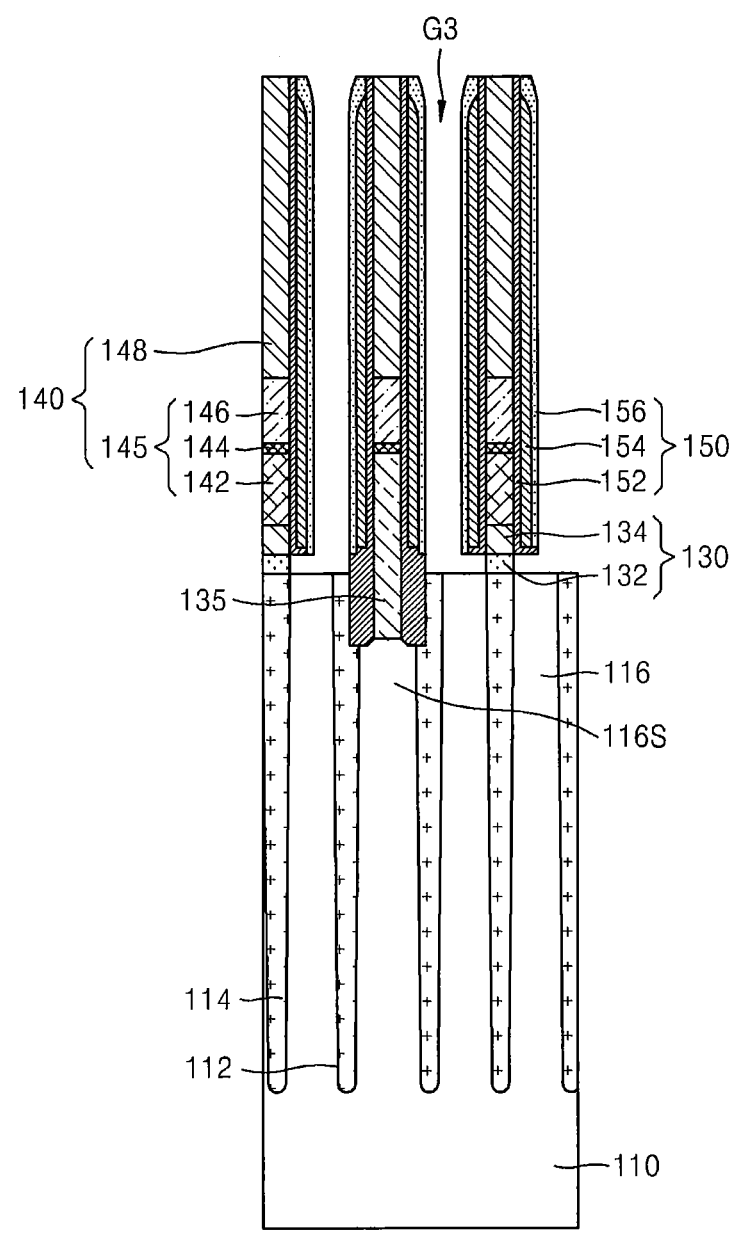
Figure 9B:
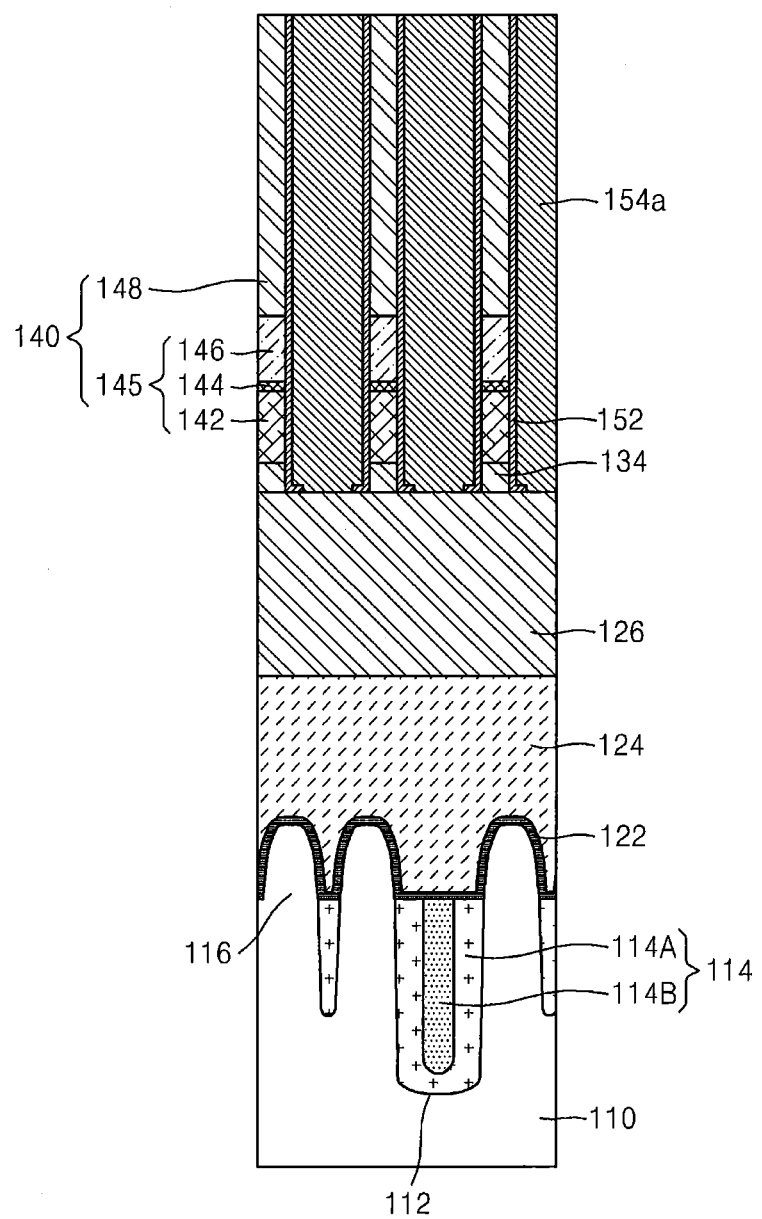
Figure 9C:
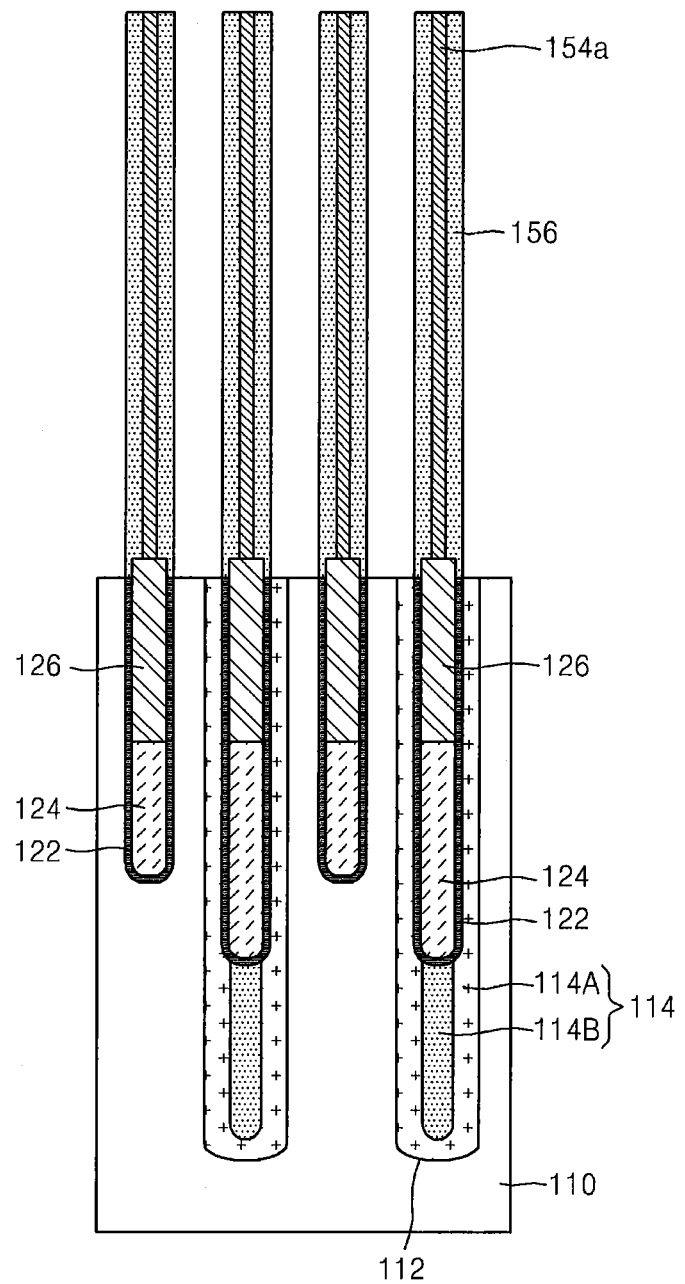
Figure 9D:
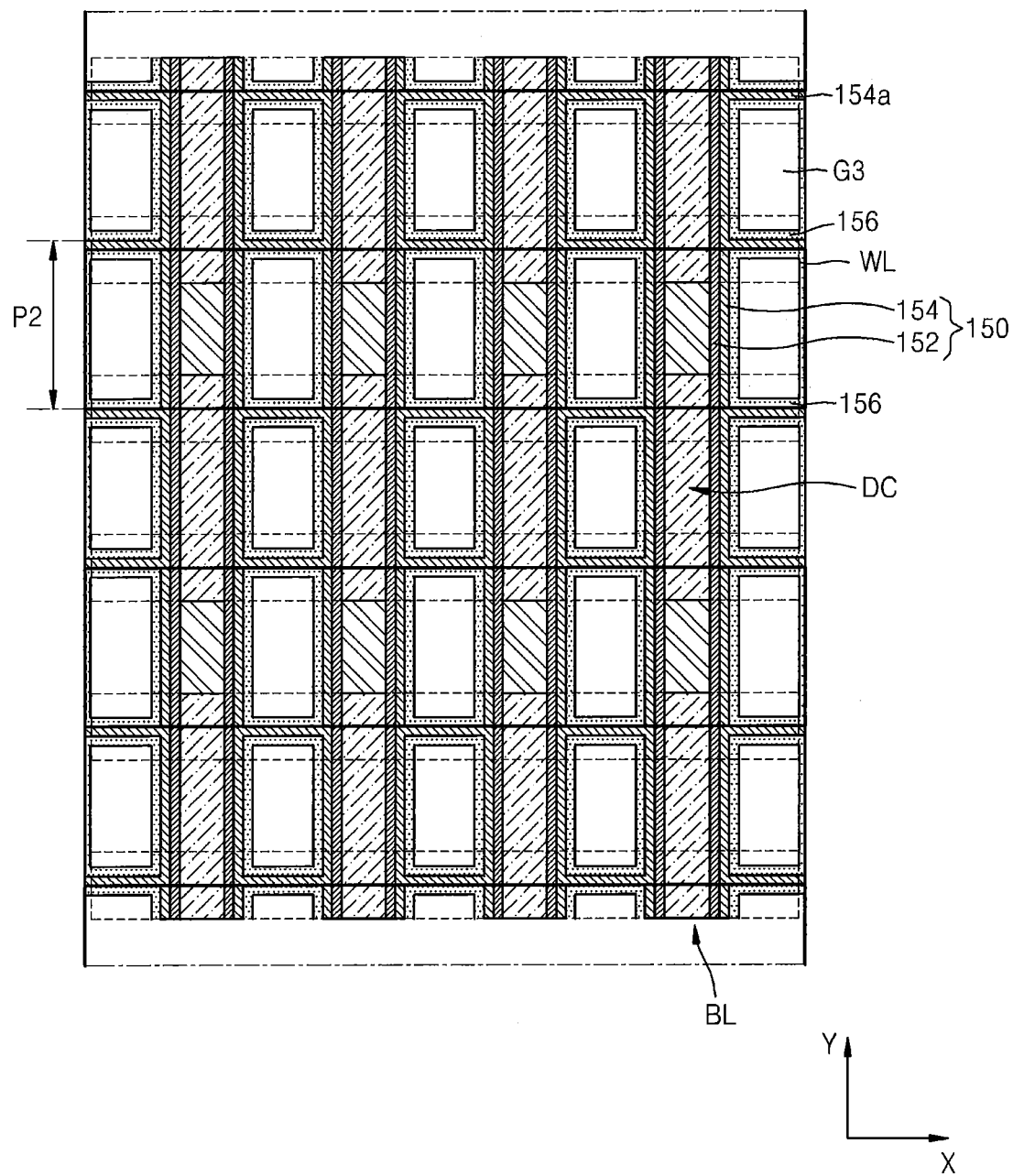

Referring to FIGS. 7A to 7D, the second spacers 154 (i.e., the outermost spacers of the multilayer spacers 150) that are exposed by the second grooves G2 are etched. As illustrated in FIGS. 7B and 7D, the second grooves G2 are expanded by etching the second spacers 154.

Since each second groove G2 is surrounded entirely by the sacrificial layer 160 and the insulating liners 152, the portions of the second spacers 154 that are exposed by the second, grooves G2 may be etched. The second spacers 154 in the second grooves G2 are etched to facilitate formation of first supplementary spacers 154a in the second grooves G2 in a subsequent process that may have a uniform thickness. The etching of the second spacers 154 may be omitted in some embodiments.

Referring to FIGS. 8A to 8D, first supplementary spacers 154a are formed in the second grooves G2. The first supplementary spacers 154a may be formed on both sidewalls of the sacrificial layer 160 in the second direction (X-axis direction), and may be formed on the etched multilayer spacers 150 on both sidewalls of the bit line structures 140 in the first direction (Y-axis direction). The first supplementary spacers 154a, the insulating liners 152 and the second spacers 154 may together form the multilayer spacers 150. The first supplementary spacers 154a may be uniformly formed in the second grooves G2.

The first supplementary spacers 154a may be formed of the same material (for example, of an oxide layer) as the second spacers 154. The first supplementary spacers 154a may correspond to a fence region that surrounds the buried contacts BC that will be formed in a subsequent process. The first supplementary spacers 154a may be the fence region or the fence insulating layer.

When the second spacers 154 of the multilayer spacers that are 150 exposed on the sidewall of the bit line structure 140 is not etched, the first supplementary spacers 154a may be formed as the fence insulating layer on both sidewalls of the sacrificial layer 160 in the second direction (X-axis direction).

Subsequently, an insulating layer 170 is formed to fill the second grooves G2, that is, the fence region, and to cover the top surfaces of the multilayer spacers 150 and the bit line structures 140. The insulating layer 170 may be formed of the same material as the sacrificial layer 160 described above. In some embodiments, the insulating layer 170 may be an insulating layer formed of oxide or nitride, for example, $SiO_2$ or SiON. In some embodiments, the insulating layer 170 may be formed of an SOH material. The sacrificial layer 160 has already been described and thus a description thereof will be omitted herein.

Referring to FIGS. 9A to 9D, the sacrificial layer 160 and the insulating layer 170 are removed to form a plurality of third grooves G3 that expose the top surfaces of the active regions 116. The third grooves G3 may be spaced apart from each other in the first direction (Y-axis direction) and the second direction (X-axis direction) on both sides of the first supplementary spacers 154a.

In some embodiments, the sacrificial layer 160 and the insulating layer 170 may be removed by an ashing and stripping process. By removing the sacrificial layer 160 and the insulating layer 170, the top surfaces of the active regions 116, which were exposed previously as illustrated in FIGS. 4A to 4C, may be exposed again through the third grooves G3.

In some embodiments, the insulating layer 170 and the sacrificial layer 160 are formed of a material having a high etch selectivity with respect to the multilayer spacers 150. In such embodiments, the active regions 116 may be easily and stably exposed without damaging the multilayer spacers 150. When the SOH sacrificial layer 160 and the insulating layer 170 are removed by an ashing and stripping process, the problem of a loss of the multilayer spacers 150 and the second spacers 154 in the opening of the active region 116 and the problem of the occurrence of a recess in the isolation pattern 114 that is exposed at the bottom surface of the third grooves G3 may be avoided.

The third grooves G3 may be formed in a self-align method since the sacrificial layer 160 and the insulating layer 170 are removed using the first supplementary spacer 154a and the multilayer spacer 15Q as an etch mask. In this manner, according to the inventive concepts, the second grooves G2 for the buried contacts are primarily formed by using the mask pattern M (see FIG. 6D) having a large pitch, and the third grooves G3 for the buried contacts are secondarily formed in a self-align method, thereby achieving process simplification.

Subsequently, second supplementary spacers 156 are formed in the third grooves G3. The second supplementary spacers 156 together with the insulating liners 152 (first spacers), the second spacers 154, and the first supplementary spacers 154a may form the multilayer spacers 150. The second supplementary spacers 156 and the first supplementary spacers 154a may constitute the fence region or the fence insulating layer that surrounds each buried contact BC. The second supplementary spacers 156 may be formed of nitride. The second supplementary spacers 156 may be the fence region or the fence insulating layer, and may not be formed in some cases.

Figure 10A:
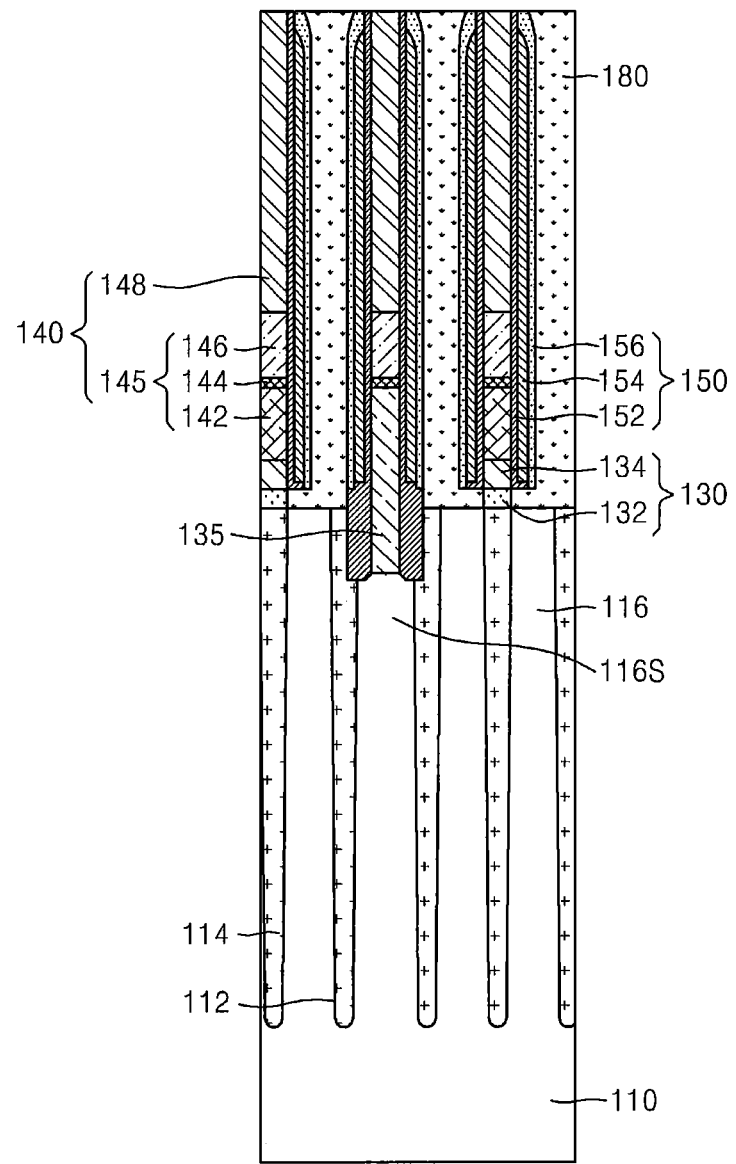
Figure 10B:
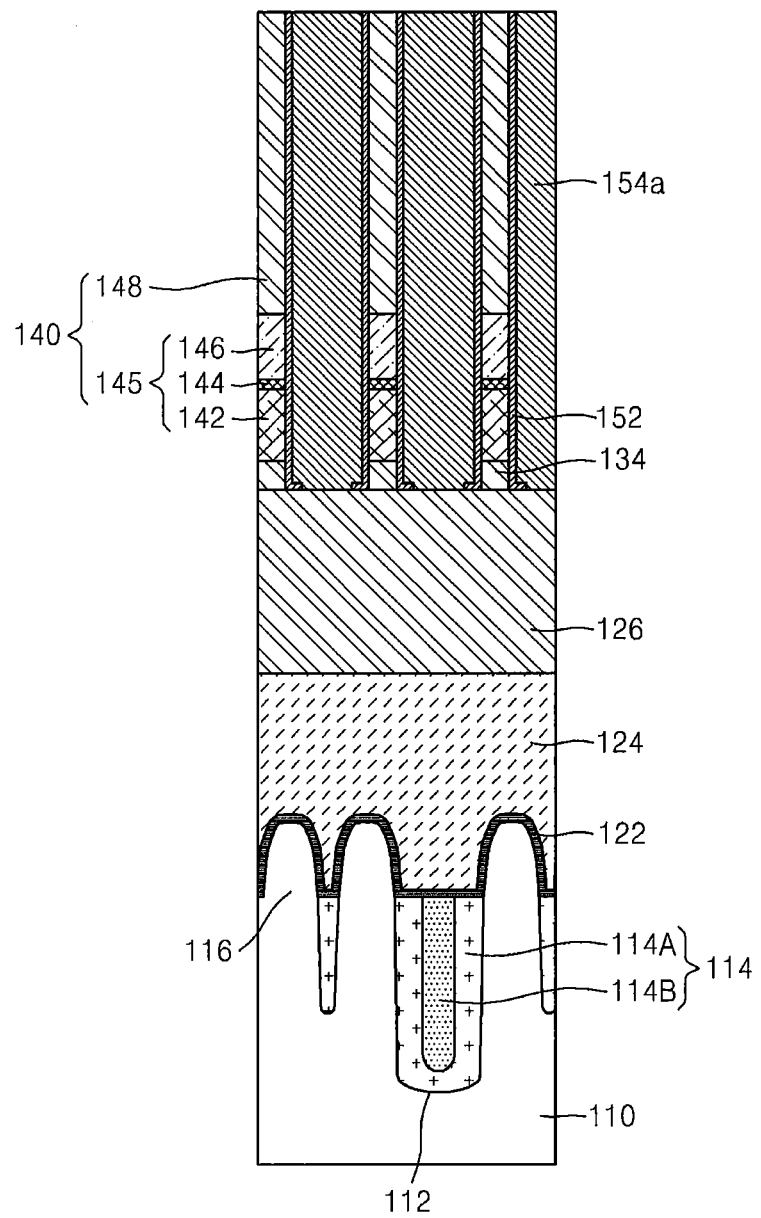
Figure 10C:
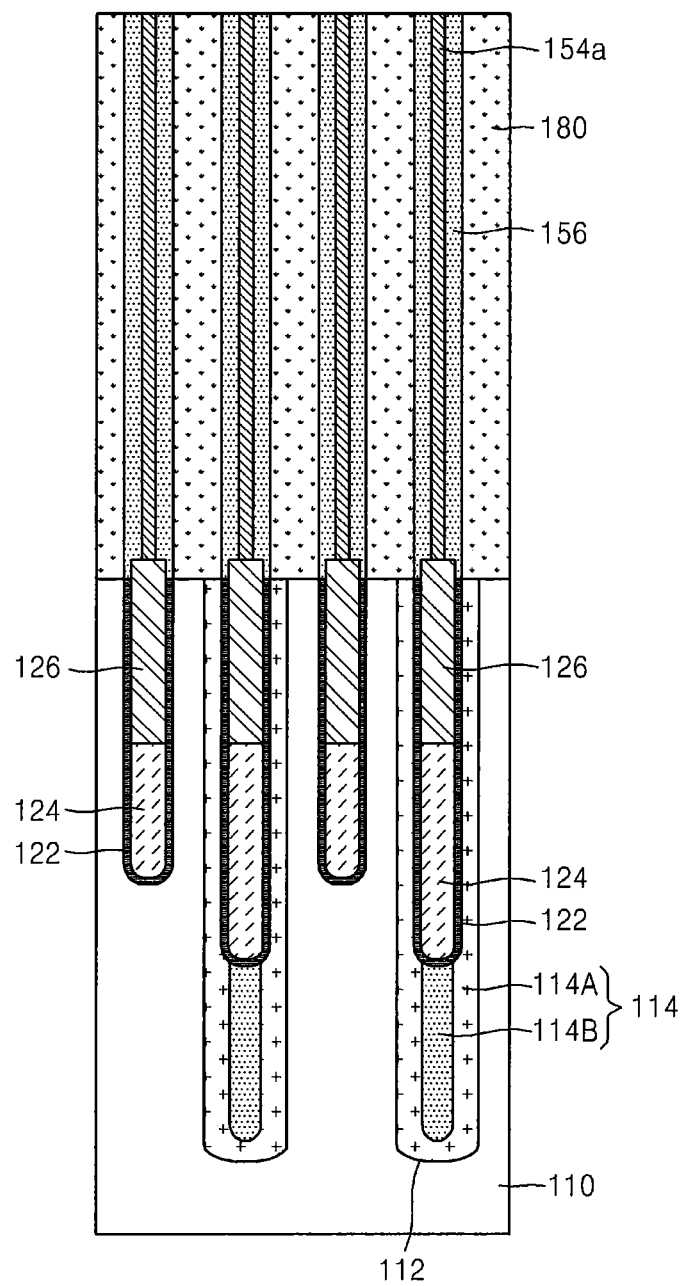

Referring to FIGS. 10A to 10C, a conductive material layer (not illustrated) is formed to fill the third grooves G3 and to cover the top surfaces of the supplementary spacers 154a and 156, the multilayer spacers 150, and the bit line structures 140. Thereafter, a top portion of the conductive material layer is removed by CMP to expose the top surfaces of the supplementary spacers 154a and 156, the multilayer spacers 150, and the bit line structures 140, thereby forming a plurality of buried contacts 180.

In the present embodiment, the buried contacts 180 may be formed of polysilicon. The polysilicon may be doped polysilicon. In other embodiments, the buried contacts 180 may be formed of metal, metal silicide, metal nitride, or any combinations thereof. The buried contacts 180 may include a buried layer (not illustrated) that covers an inner wall of the third grooves G3, and a conductive layer that is formed on the barrier layer to fill the third grooves G3. In some embodiments, the buried layer may be formed in a Ti/TiN stack structure.

When the buried contacts 180 are formed of a metal, a metal silicide layer (not illustrated) may be formed between the buried contacts 180 and the active regions 116. For example, the metal silicide layer may be a cobalt (Co) silicide layer. However, the metal silicide layer is not limited to a cobalt silicide layer. That is, the metal silicide layer may be formed of a material selected from various types of metal silicide.

In some embodiments, the following processes may be performed to form the buried contacts 180. After cleaning the resulting structure that includes the third grooves G3, the barrier layer may be formed over the resulting structure to cover the inner walls of the third grooves G3. Thereafter, a conductive layer may be formed on the barrier layer to a sufficient thickness to fill the third grooves G3, and the conductive layer may be polished by CMP to expose the barrier layer, thereby forming the buried contacts 180 in the third grooves G3.

Figure 11A:
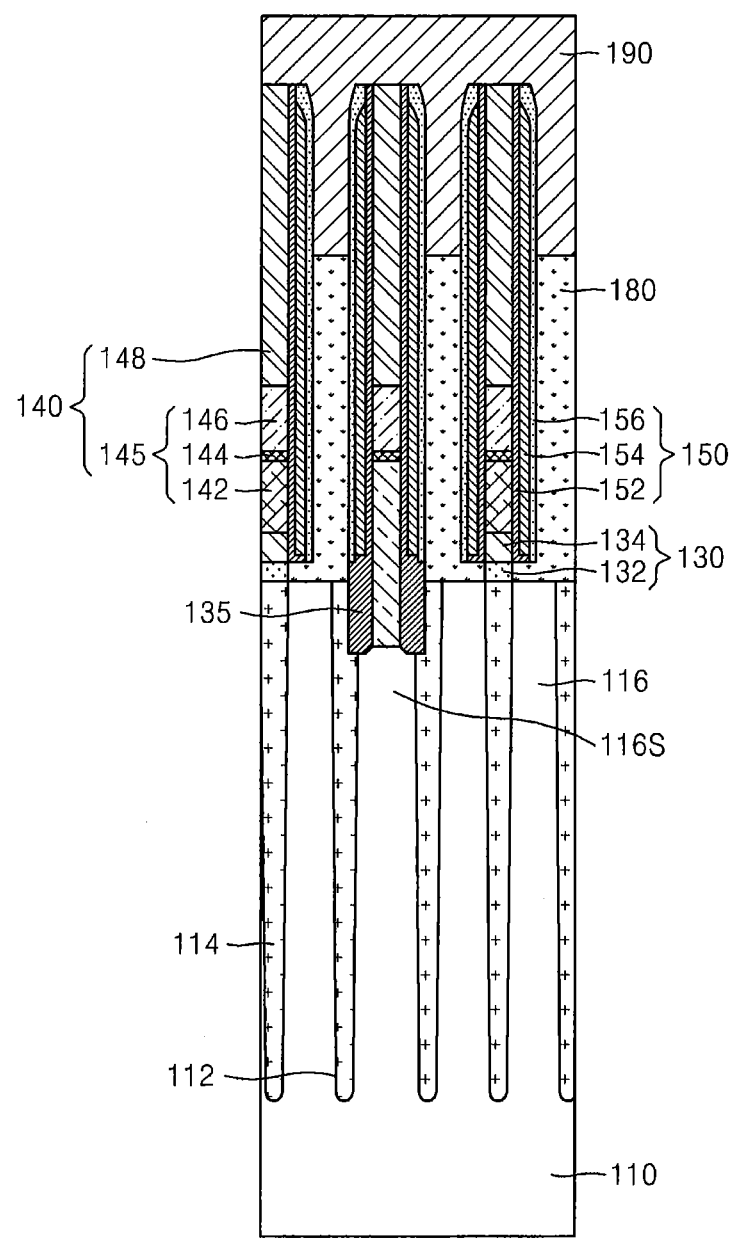
Figure 11B:
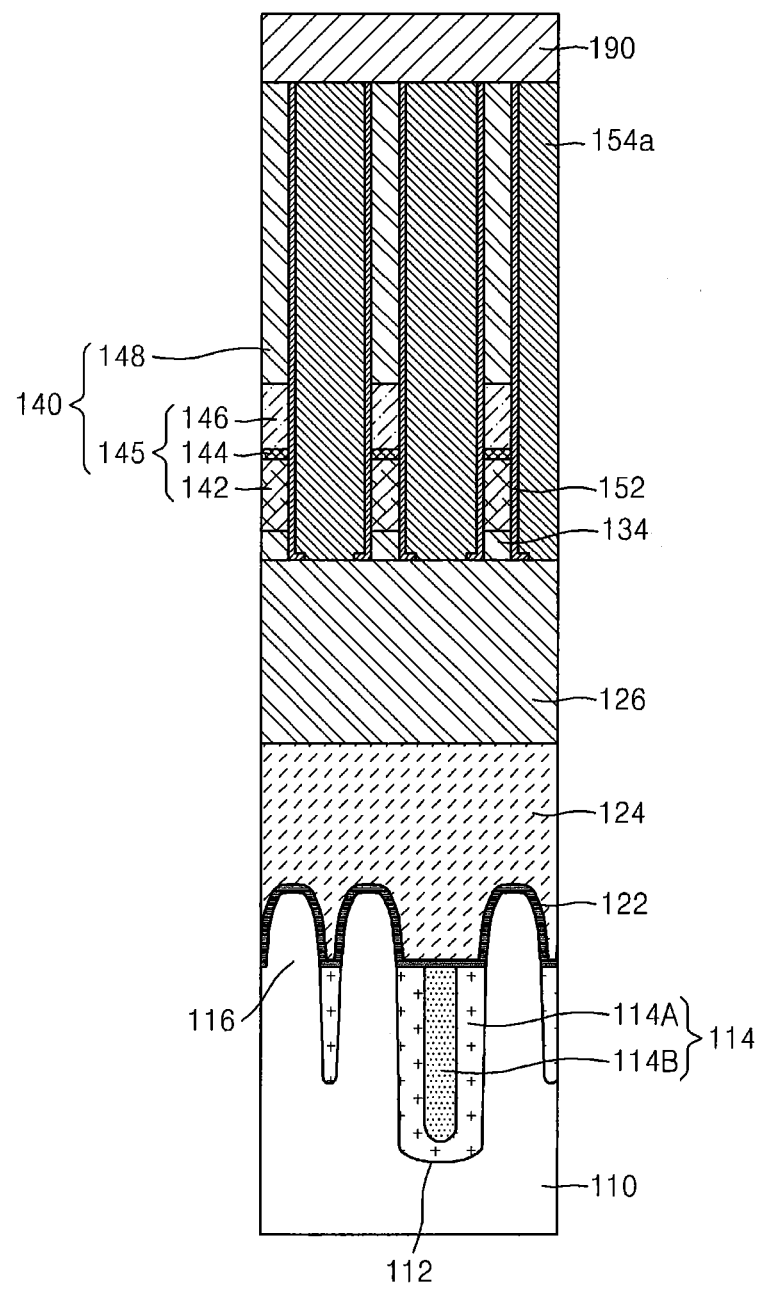
Figure 11C:
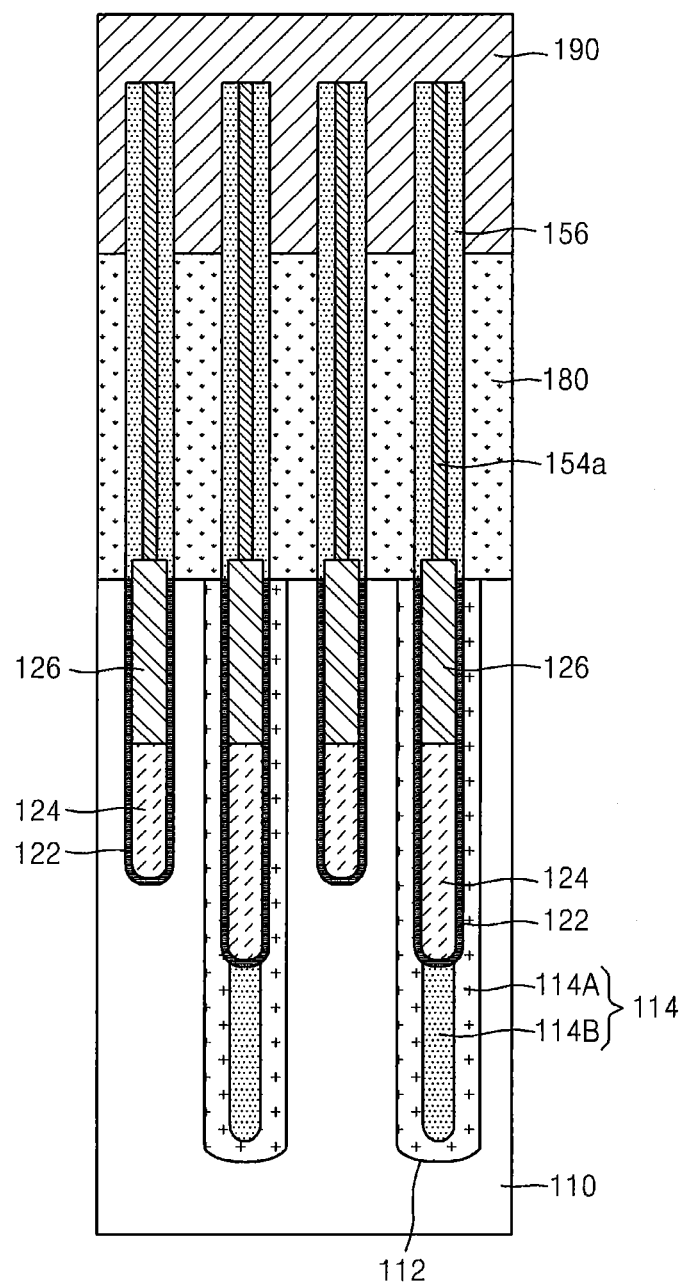

Referring to FIGS. 11A to 11C, upper portions of the buried contacts 180 are removed by an etch-back process to form a groove. A metal layer 190 is formed to fill the groove formed by the etch-back process and to cover the top surfaces of the supplementary spacers 154a and 156, the multilayer spacers 150, and the bit line structures 140. The metal layer 190 may include a metal silicide layer (not illustrated) which contacts the buried contacts 180. For example, the metal silicide layer may be a cobalt silicide layer. However, the metal silicide layer is not limited to a cobalt silicide layer.

In some embodiments, the following processes may be performed to form the metal silicide layer. First, a metal layer is formed on surfaces of the polysilicon buried contacts 180 that are exposed at the bottom surface of the groove formed by the etch-back process, and then a first rapid thermal silicidation (RTS) process is performed. The first RTS process may be performed at a temperature of about 450° C. to about 550° C. Thereafter, the metal that does not react to Si atoms in the first RTS process is removed, and a second RTS process is performed at a temperature of about 800° C. to about 950° C. to form the metal silicide layer. When the metal is cobalt, the above-described cobalt silicide may be formed.

The metal layer 190 may include: a buried layer (not illustrated) that covers an inner wall of the groove, the bit line structures 140, and the top surfaces of the multilayer spacers 150; an inner metal layer that is formed on the buried layer to fill the groove; and an upper metal layer that is formed on the buried layer to cover the bit line structures 140 and the top surfaces of the multilayer spacers 150. In some embodiments, the buried layer may be formed in a Ti/TiN stack structure as described above. Also, in some embodiments, at least one of the inner metal layer and the upper metal layer may include tungsten.

In some embodiments, the following processes may be performed to form the metal layer 190. First, the resulting structure that includes the groove that is formed by the etch-back process is cleaned. Then, the barrier layer may be formed over the resulting structure to cover the inner wall of the groove. Thereafter, a metal layer may be formed on the barrier layer to fill the groove and cover the top surfaces of the multilayer spacers 150 and the bit line structures 140, and the resulting structure may be planarized to form the inner metal layer and the upper metal layer. In some cases, the inner metal layer and the upper metal layer may be formed separately. For example, after the metal layer is formed, the metal layer may be etched back and polished to expose the barrier layer, thereby forming the inner metal layer in the groove. Thereafter, a metal layer may be formed again on the barrier layer and the inner metal layer, and the metal layer may be planarized to form the upper metal layer.

Figure 12A:
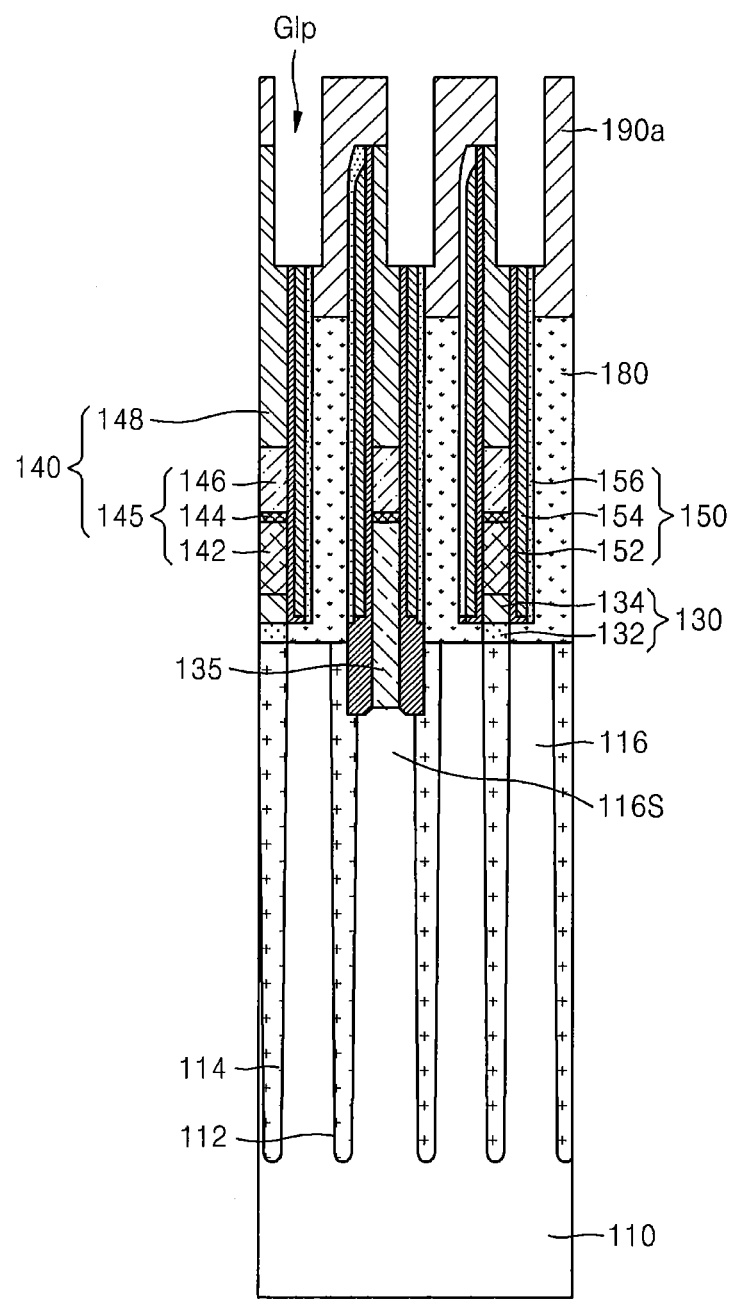
Figure 12B:
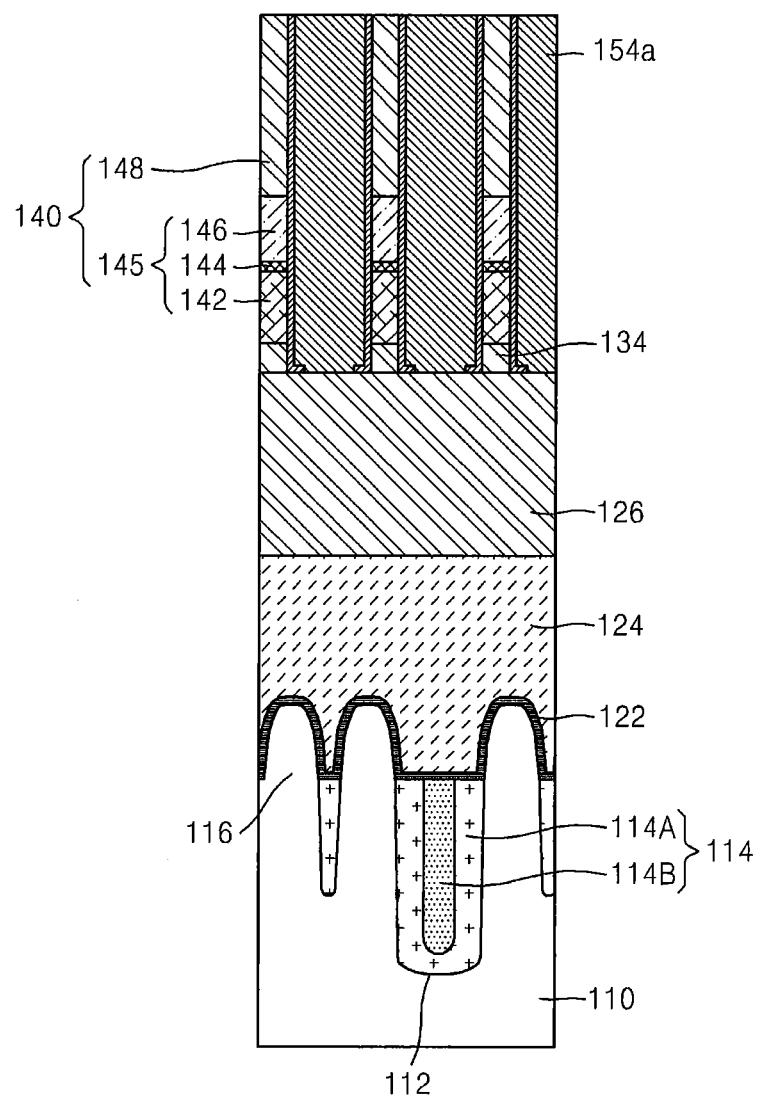
Figure 12C:
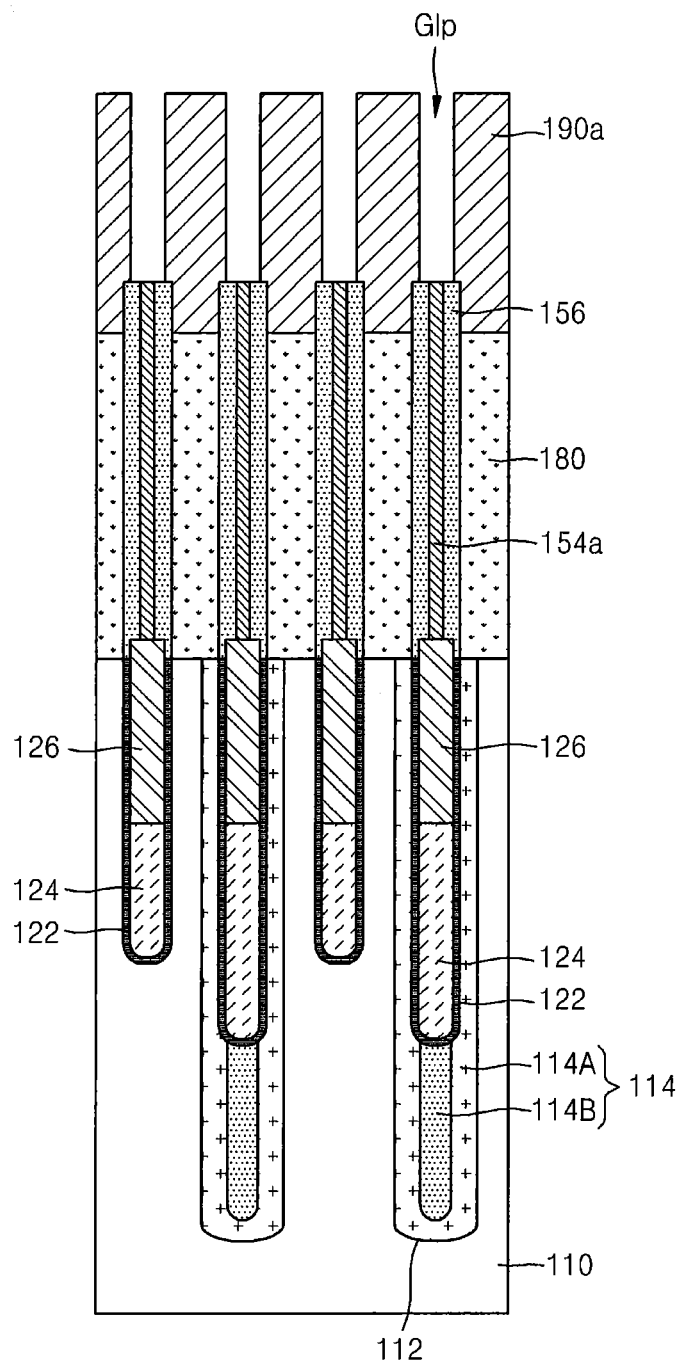

Referring to FIGS. 12A to 12C, a mask pattern (not illustrated) is formed on the metal layer 190. Thereafter, by using the mask pattern as an etch mask, the metal layer 190, the bit line structures 140, the multilayer spacers 150, and a portion of the supplementary spacers 154a and 156 are etched to form a plurality of landing pads 190a that are connected to the buried contacts 180.

Like the landing pad LP illustrated in FIG. 1, the mask pattern may have a plurality of island shapes. Accordingly, during the process of forming the landing pads 190a by using the mask pattern as an etch mask, a plurality of landing pad grooves Glp are formed as illustrated, and the landing pads 190a may be isolated from each other and electrically disconnected from each other by the landing pad grooves Glp. Also, side surfaces of the bit line structures 140 and top surfaces of the multilayer spacers 150 may be exposed by the landing pad grooves Glp.

In detail, upper portions of the insulating capping lines 148 of the bit line structures 140 and upper portions of the multilayer spacers 150 formed on the sidewalls of the insulating capping lines 148 are removed during the process of forming the landing pad grooves Glp. Accordingly, the side surfaces of the insulating capping lines 148 and the top surfaces of the multilayer spacers 150 may be exposed through the landing pad grooves Glp.

As illustrated, in the process of forming the landing pad grooves Glp, right side surfaces of the insulating capping patterns 148 may be removed, and an upper portion of the multilayer spacers 150 on right sidewalls of the insulating capping patterns 148 may be removed. Accordingly, the landing pads 190a may have a structure that covers a left portion of the insulating capping patterns 148 and the multilayer spacers 150 on left sidewalls of the insulating capping patterns 148. On the other hand, the landing pads arranged on another line adjacent and parallel to the line I-I' of FIG. 1 may have structures that cover right portions of the insulating capping patterns 148 and the multilayer spacers 150 on right sidewalls of the insulating capping patterns 148.

Like the landing pads LP of FIG. 1, the landing pads 190a may be disposed along the first direction (Y-axis direction) in a zigzag configuration L1 (see FIG. 1) that alternately covers the multilayer spacer 150 on the left sidewall of a first bit line structure 140 and the multilayer spacer 150 on the right sidewall of a second bit line structure 140, and the landing pads 190a may have a structure that covers the multilayer spacer 150 formed on the same sidewall of each bit line structure 140. After the landing pads 190a are formed, the mask pattern is removed.

Figure 13A:
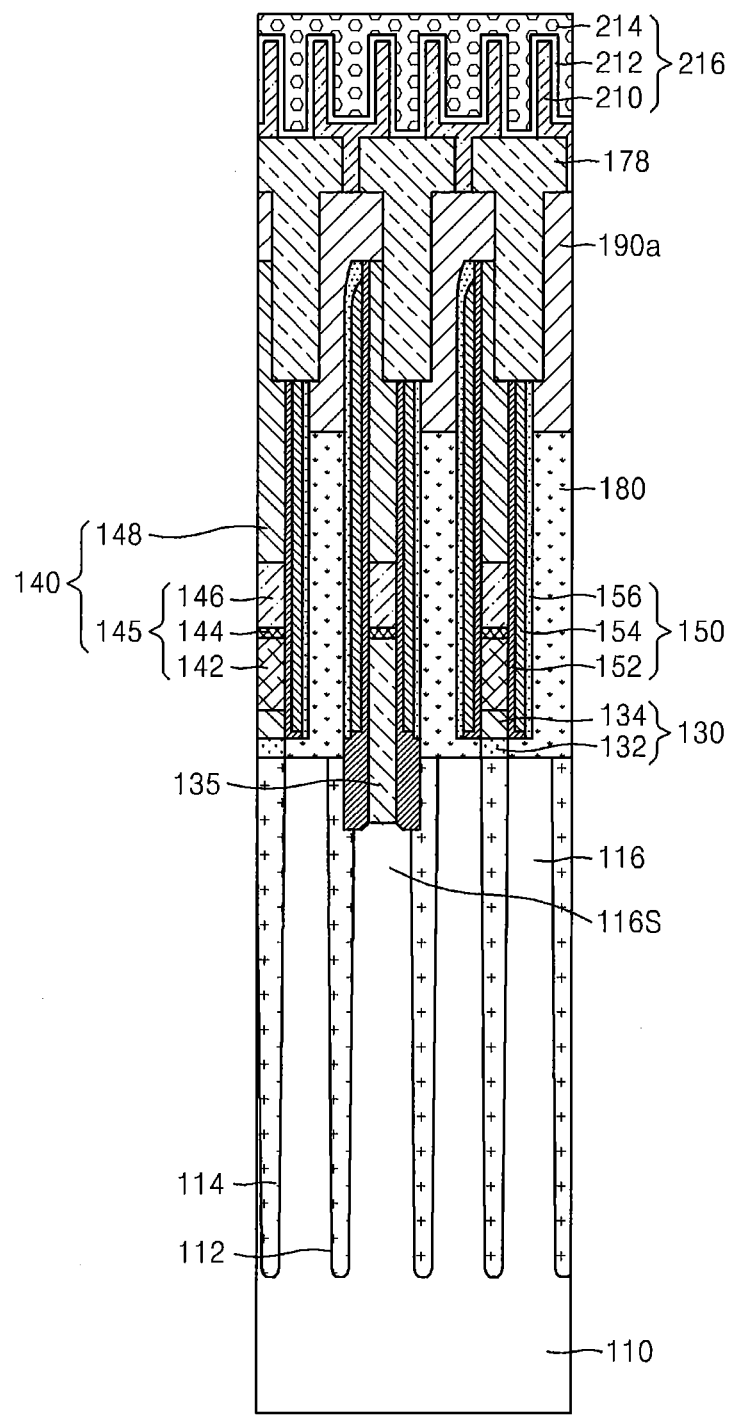
Figure 13B:
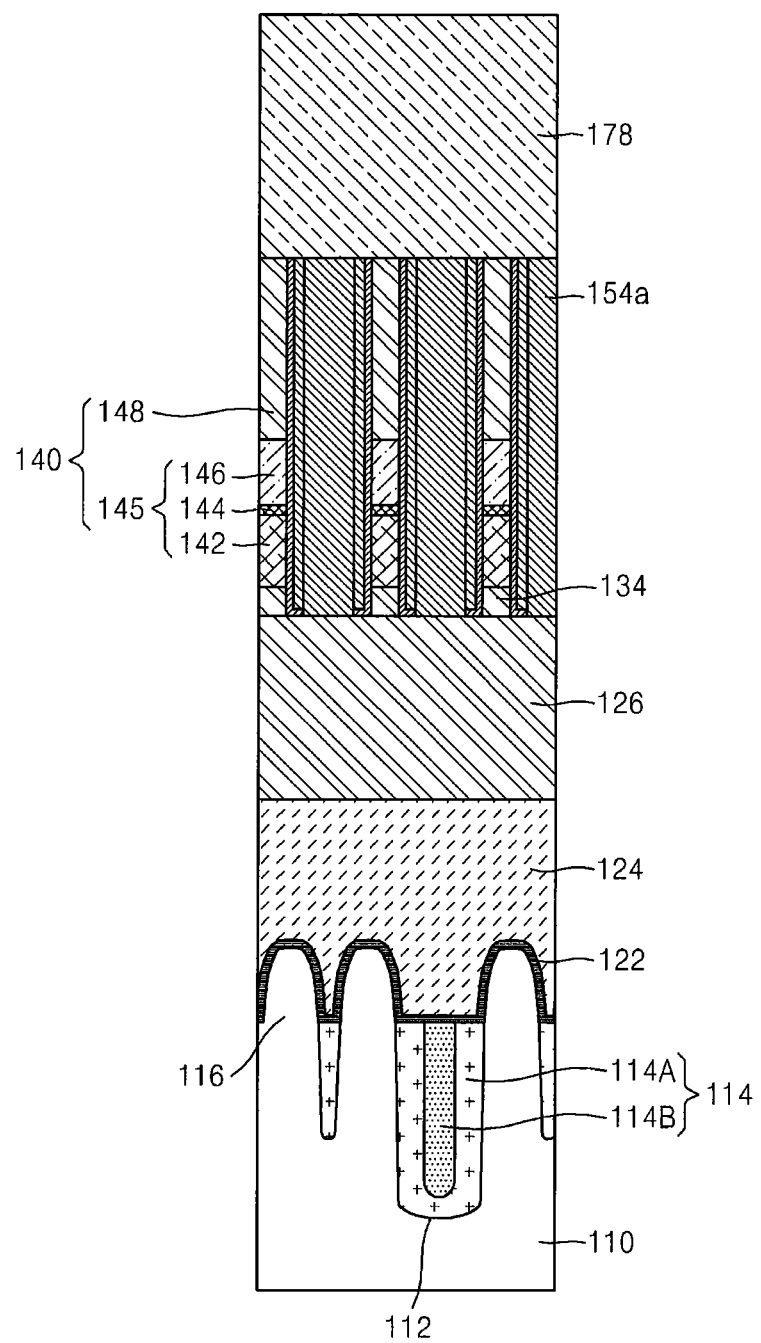
Figure 13C:
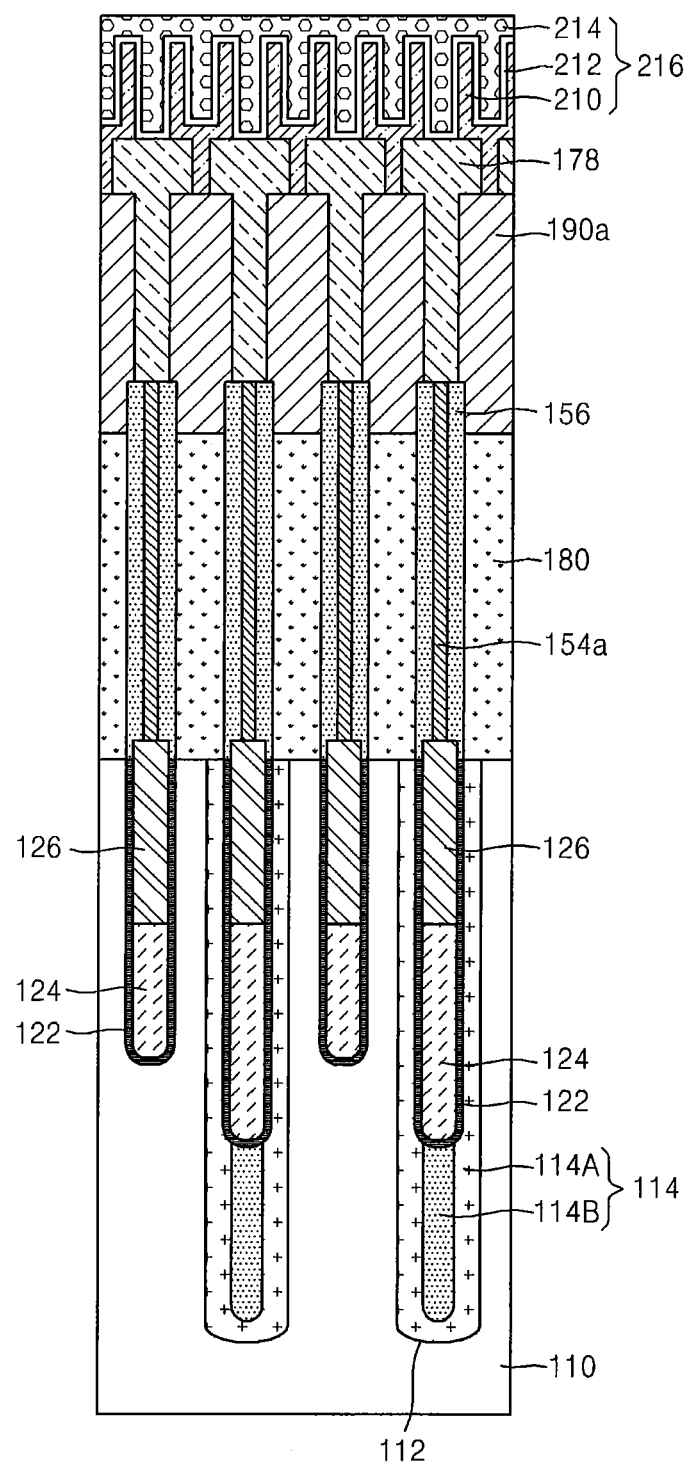

Referring to FIGS. 13A to 13C, after the mask pattern is removed, a capping insulating layer 178 is formed to fill the landing pad grooves Glp and to cover top surfaces of the landing pads 190a. The capping insulating layer 178 may be formed of an oxide or nitride insulating material. The bit lines 145 and the landing pads 190a may correspond respectively to the bit lines BL and the landing pads LP illustrated in FIG. 1, and the buried contacts 180 and the direct contacts 135 may correspond respectively to the buried contacts BC and the direct contacts DC illustrated in FIG. 1.

After the capping insulating layer 178 is formed, a plurality of capacitors 216 (that is, a lower electrode 210 (storage node), a dielectric 212, and an upper electrode 214) may be formed to be electrically connected to the landing pads 190a after passing through the capping insulating layer 178.

Figure 14A:
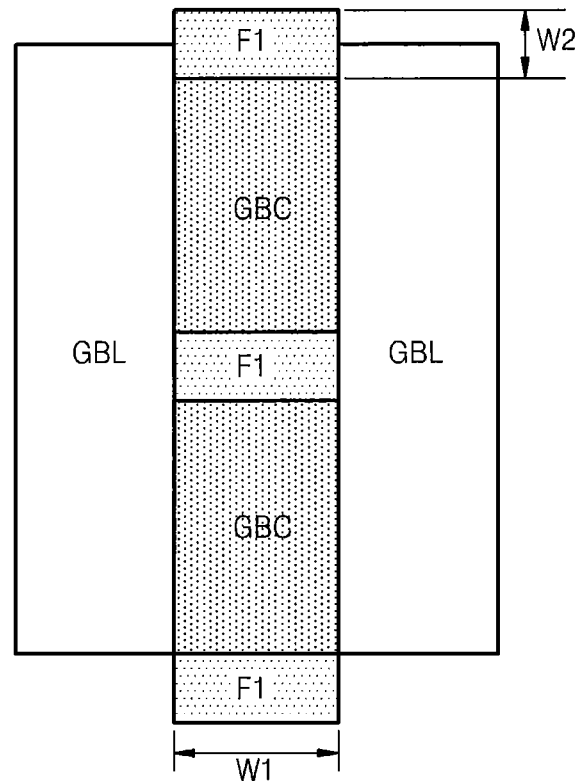
FIGS. 14A and 14B are plan views of a semiconductor device according to embodiments of the inventive concepts.
Figure 14B:
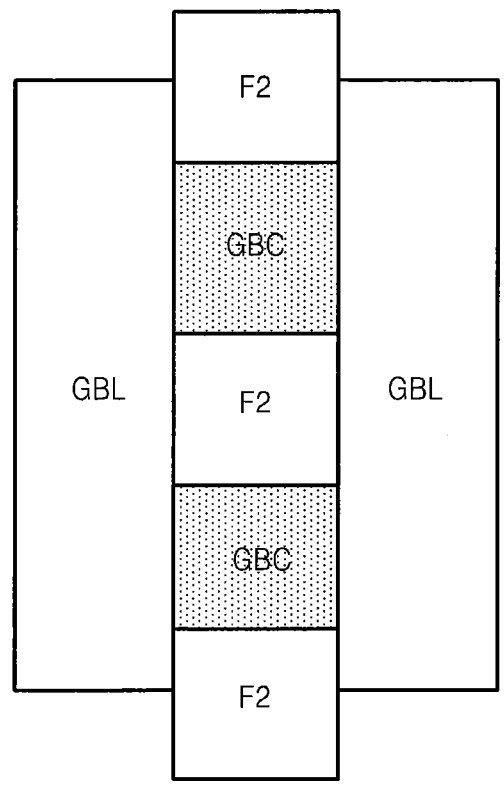

FIGS. 14A and 14B are plan views of a semiconductor device according to an embodiment of the inventive concepts.

In detail, FIGS. 14A and 14B illustrate that the top surfaces of the multilayer spacers 150, the bit line structures 140 and the buried contacts 180 that are exposed by removing a top portion of the conductive material layer, which is formed as illustrated in FIGS. 10A to 10C, by CMP. In FIGS. 14A and 14B, GBC corresponds to the buried contacts 180, GBL corresponds to the bit line structures 140 and the multilayer spacers 150, and F1 and F2 correspond to the supplementary spacers 154a and 156. As described above, the supplementary spacers 154a and 156 correspond to a fence that surrounds both sides of the buried contact 180 in the first direction (Y-axis direction).

G in GBC and GBL is an abbreviation for "global," and may indicate that a bit line of a cell region is formed at the same level as a peripheral region or a core region as a word line is formed in a buried structure in a cell region as in the semiconductor device according to the present embodiment.

As illustrated in FIG. 10A, top surfaces of the nitride insulating capping layers 148 and top surfaces of a nitride insulating liners 152 may be exposed. Since the exposed top surfaces of the bit line structures 140 and the multilayer spacers 150 are formed of the same nitride material, the bit line structures 140 and the multilayer spacers 150 correspond collectively to GBL.

In the semiconductor device according to the present embodiment, depending on the width of the buried contacts GBC and whether the second supplementary spacer 156 is formed, the buried contacts GBC may have a structure in which left and right side surfaces in the second direction (X-axis direction) are surrounded by a nitride or oxide bit line GBL, and upper and lower side surfaces in the first direction (Y-axis direction) are surrounded by a nitride or oxide fence (F1, F2).

Since an oxide material has a higher etch selectivity than a nitride material with respect to SOH, the oxide fence F1 may be formed to be thinner than the nitride fence F2. Thus, the width W2 of the oxide fence F1 in the first direction may be minimized. Accordingly, the contact resistance may be reduced by increasing the width W2 of the buried contact GBC in the first direction (y-axis direction).

In the semiconductor device according to the present embodiment, the buried contacts GBC may have a structure in which the upper and lower side surfaces in the first direction (Y-axis direction) are also surrounded by the second supplementary spacers 156. When the distance W2 (width) between the buried contacts GBC in the first direction (Y-axis direction) is reduced due to a design rule change, the second supplementary spacer 156 may not be formed. In this case, as illustrated in FIG. 14A, the width W2 of the fence F1 in the first direction, which is the distance (width) between the buried contacts GBC in the first direction (Y-axis direction), may be reduced.

In the semiconductor device according to the present embodiment, the buried contacts GBC may have a structure in which left and right side surfaces in the second direction (X-axis direction) are surrounded by a multilayer spacer including an oxide first supplementary spacer 154a and a nitride second supplementary spacer 156, and upper and lower side surfaces in the first direction (Y-axis direction) are surrounded by a nitride second supplementary spacer 156. Accordingly, as will be described later, when the first supplementary spacer 154a is etched, an air spacer may be formed.

When the second supplementary spacer 156 is not formed, the width W2 of the fence F1 in the second direction may decrease by about two times the thickness of the second supplementary spacer 156 and the width W1 of the buried contact GBC in the first direction may increase.

Figure 15A:
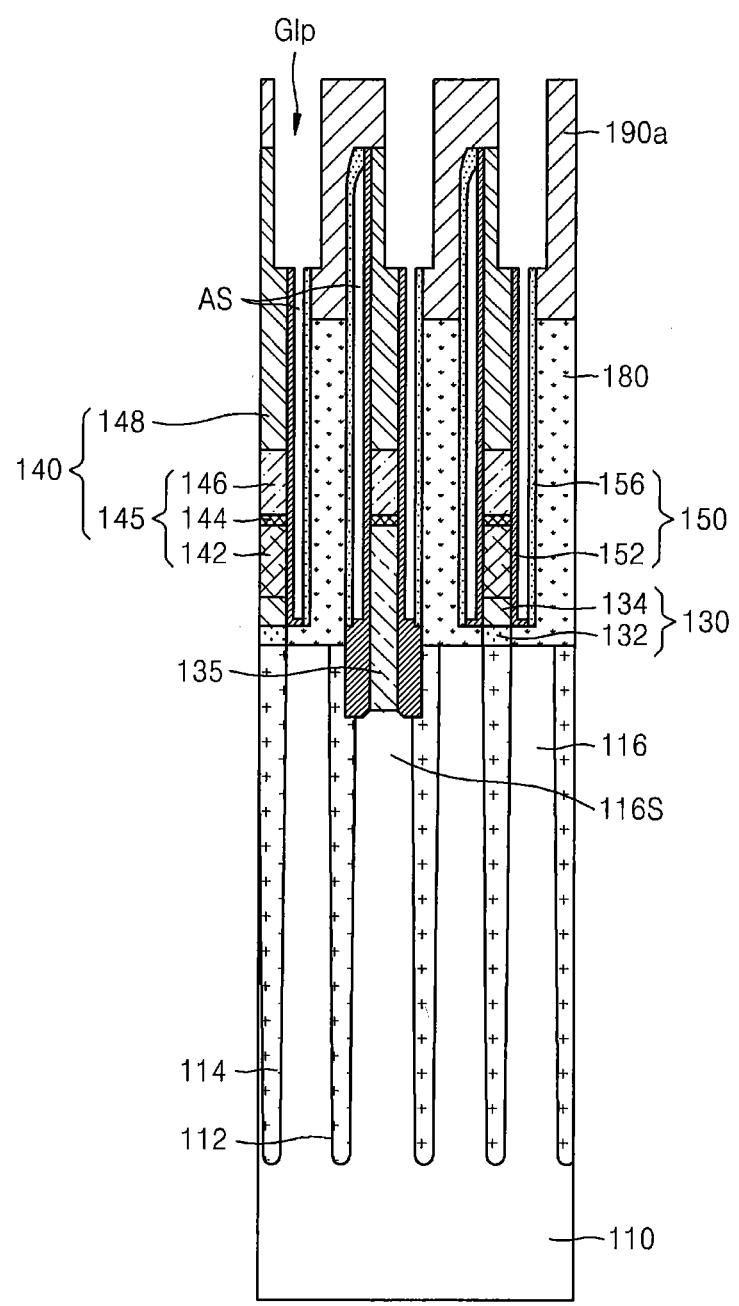
FIGS. 15A-15D are cross-sectional and plan views illustrating a semiconductor device manufacturing method according to an embodiment of the inventive concepts and a semiconductor device manufactured by these methods.
Figure 15B:
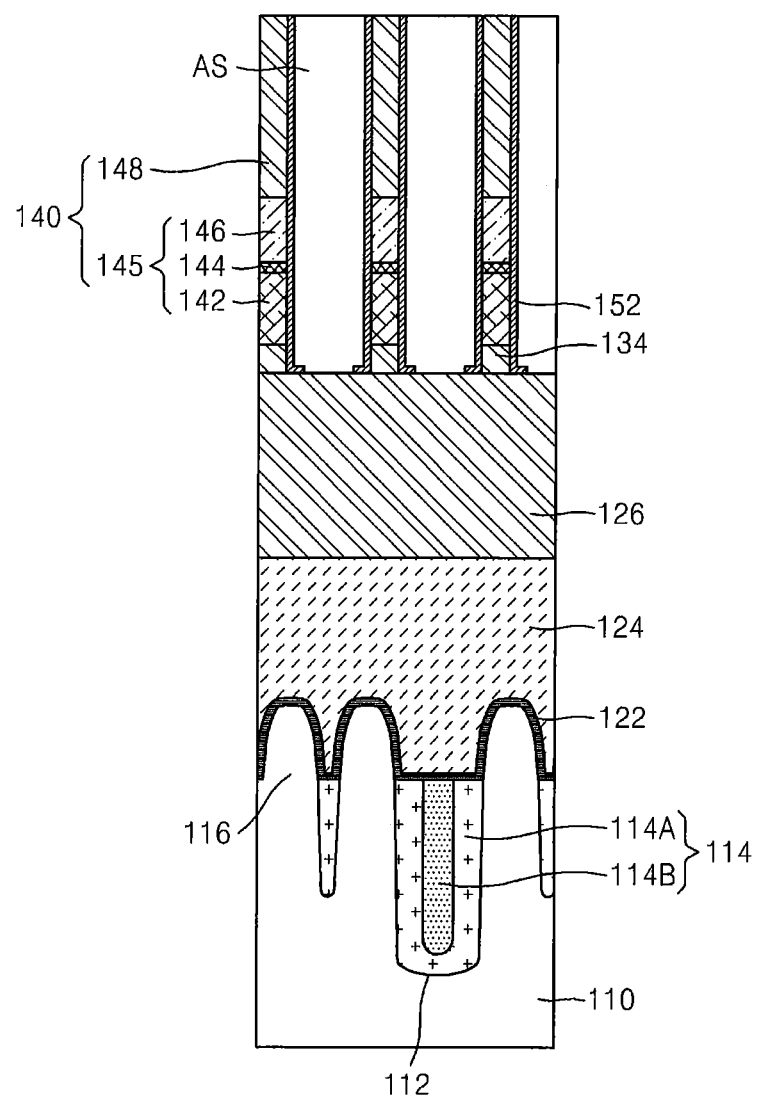
Figure 15C:
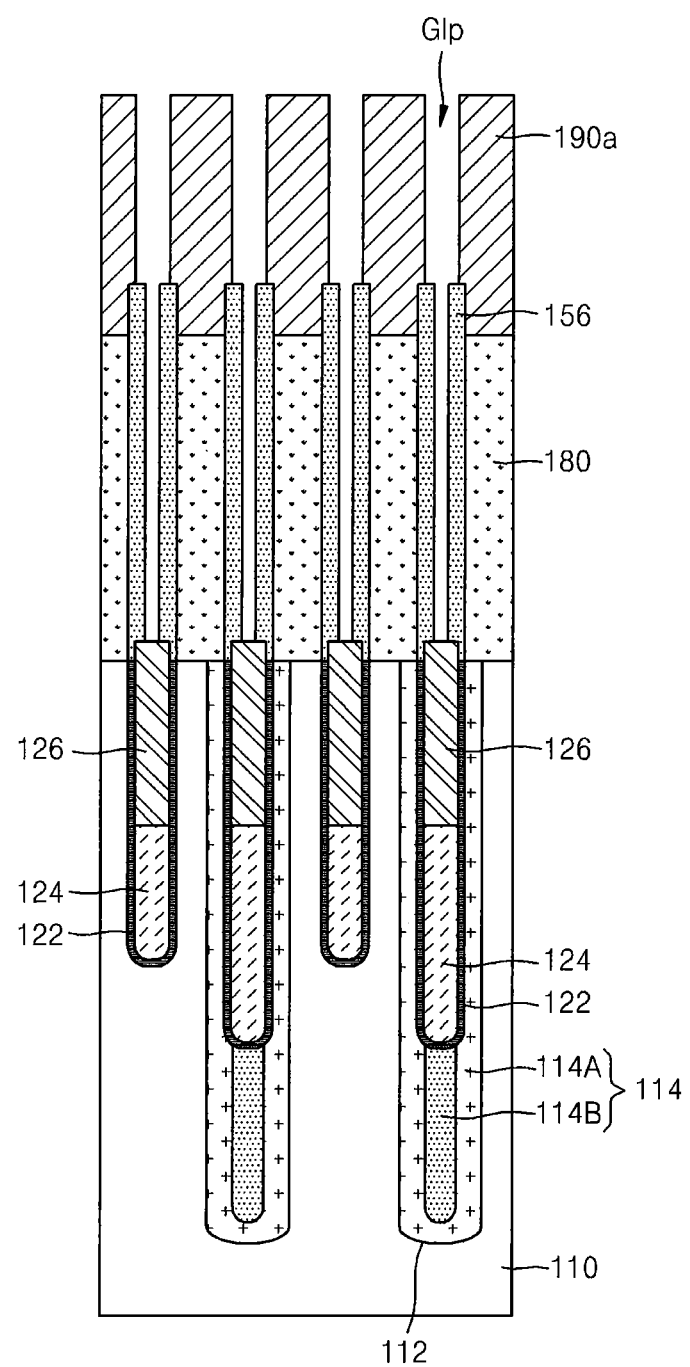
Figure 15D:
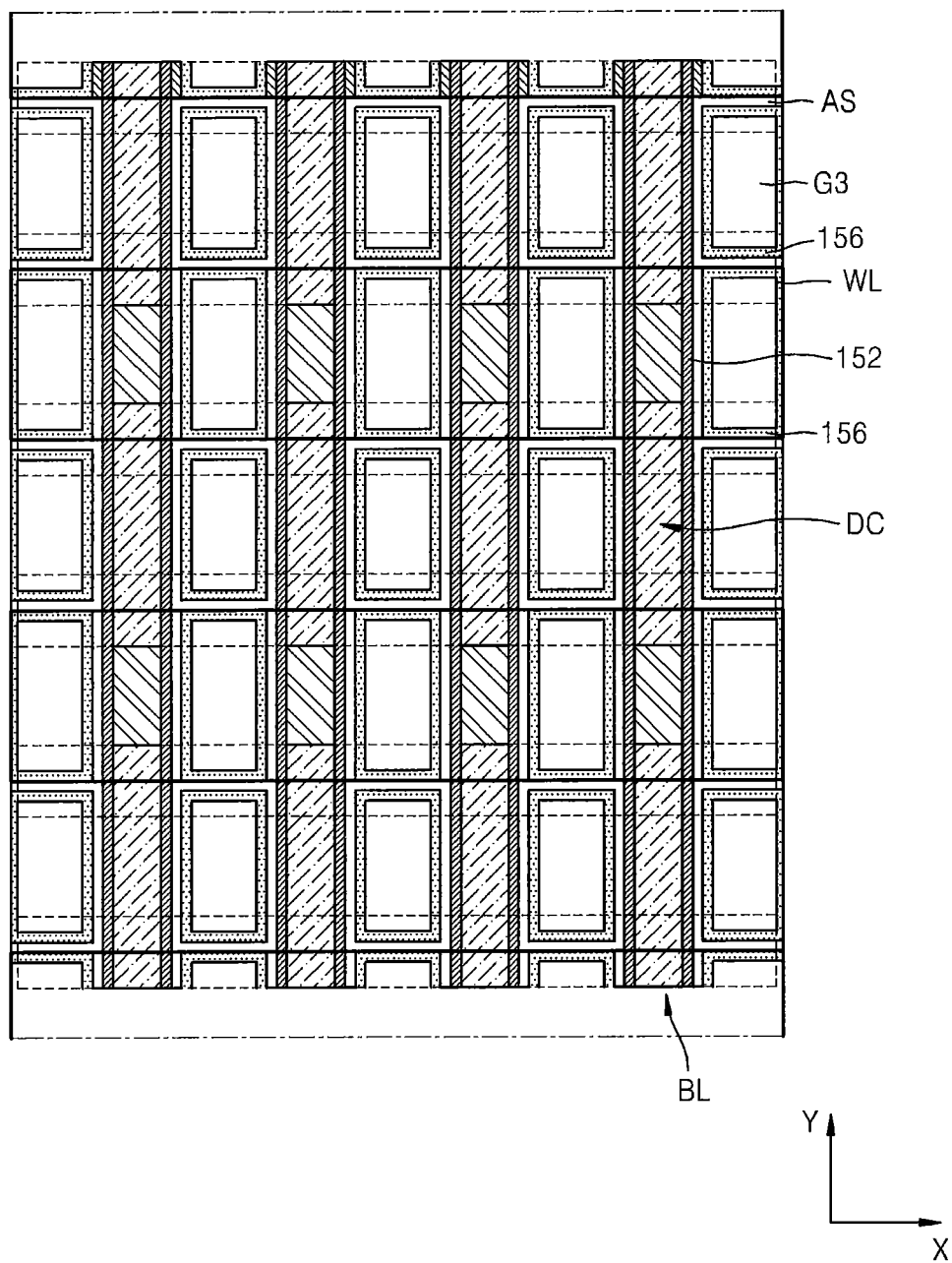

FIGS. 15A-15D are cross-sectional and plan views illustrating semiconductor device manufacturing methods according to an embodiment of the inventive concept and semiconductor devices manufactured by these methods. FIG. 15A is a cross-sectional view taken along line I-I' of FIG. 1; FIG. 15B is a cross-sectional view taken along line II-II' of FIG. 1; FIG. 15C is a cross-sectional view taken along line III-III' of FIG. 1'; and FIG. 15D is a plan view of FIGS. 15A to 15C. In FIG. 15, like reference numerals as in FIGS. 2 to 13 denote like elements, and a detailed description thereof will be omitted herein.

As described with reference to FIGS. 2 to 12, a plurality of landing pads 190a are formed. That is, a mask pattern (not illustrated) is formed on the metal layer 190. Thereafter, by using the mask pattern as an etch mask, the metal layer 190, the bit line structures 140 thereunder, and portions of the multilayer spacers 150 are etched to form the landing pad grooves Glp, thereby forming a plurality of landing pads 190a that are connected to the buried contacts 180 and that are electrically disconnected and physically isolated from each other.

By using the insulating liners 152 (first spacers) and the second supplementary spacers 156 as an etch mask, oxide first supplementary spacers 154a and second supplementary spacers 154 exposed through the landing pad grooves Glp are removed to form air spacers AS. The air spacers AS may be formed between the second supplementary spacers 156 and the first spacers 152 of the bit line structures 140 to surround the third grooves G3, that is, the buried contacts.

The air spacers AS may be formed by, for example, wet etching. The air spacers AS may also be formed by dry etching. In order to increase the width of the air spacers AS, portions of the second supplementary spacers 156 and the nitride insulating liners 152 may be further removed by wet etching or dry etching.

Thereafter, as illustrated in FIGS. 13A to 13C, a capping insulating layer 178 may be formed to fill the landing pad grooves Glp and to cover top surfaces of the landing pads 190a. During the forming of the capping insulating layer 178, an insulating material constituting the capping insulating layer 178 may be deposited in the air spacers AS, top surfaces of which are exposed through the landing pad grooves Glp. As a result, except for portions of the air spacers AS that are covered by the landing pad 190a, a capping liner (not illustrated) formed of the same material as the capping insulating layer 178 may be formed on an inner wall of the air spacers AS. However, in some cases, the capping liner may not be formed in the air spacers AS.

FIGS. 16 to 19 are cross-sectional and plan views illustrating semiconductor device manufacturing methods according to an embodiment of the inventive concepts and semiconductor devices manufactured by these methods. FIGS. 16A, 17A, 18A, and 19A are cross-sectional views taken along line I-I' of FIG. 1; FIGS. 16B, 17B, 18B, and 19B are cross-sectional views taken along line II-II' of FIG. 1; FIGS. 16C, 17C, 18C, and 19C are cross-sectional views taken along line of III-III' FIG. 1; and FIG. 19D is a plan view of FIGS. 19A to 19C. In FIGS. 16 to 19, like reference numerals as in FIGS. 2 to 13 denote like elements, and a detailed description thereof will be omitted herein.

In detail, FIGS. 16 to 19 may be identical to FIG. 15 with the exception that an additional insulating layer 175 is formed on the insulating layer 170 constituting the fence region before the forming of the landing pad grooves Glp and the landing pads 190a.

Figure 16A:
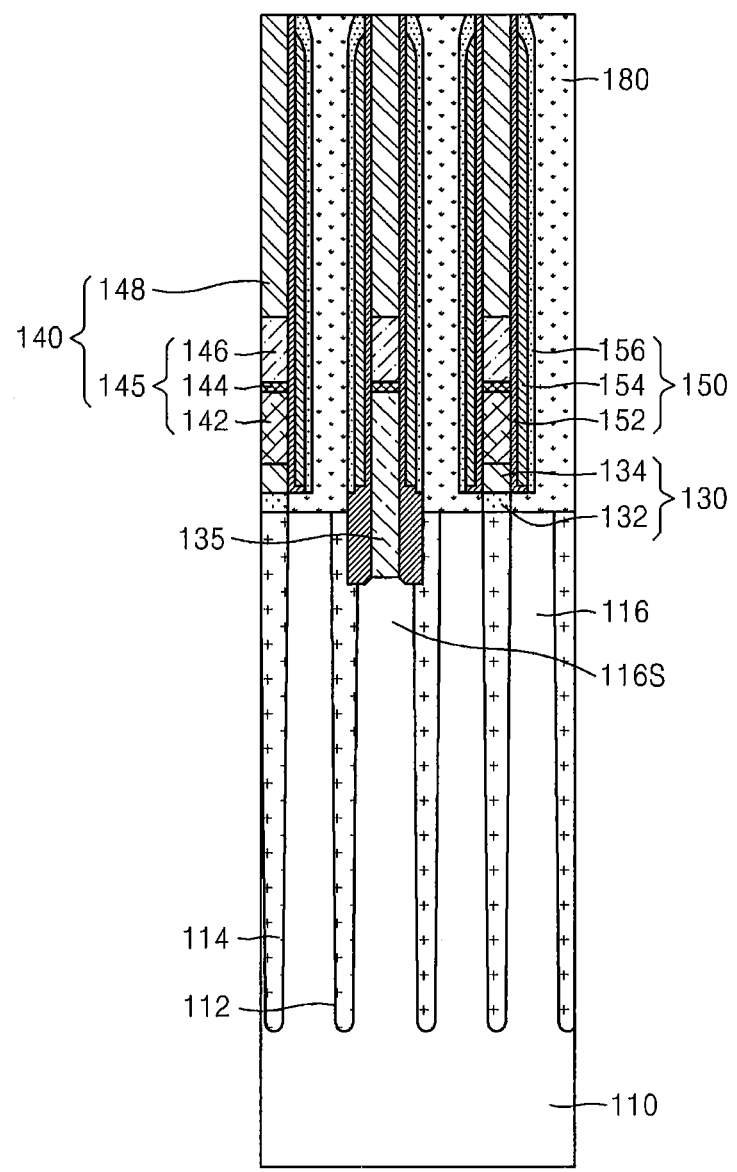
FIGS. 16A-16C, 17A-17C, 18A-18C and 19A-19D are cross-sectional and plan views illustrating semiconductor device manufacturing methods according to an embodiment of the inventive concepts and a semiconductor device manufactured by these methods.
Figure 16B:
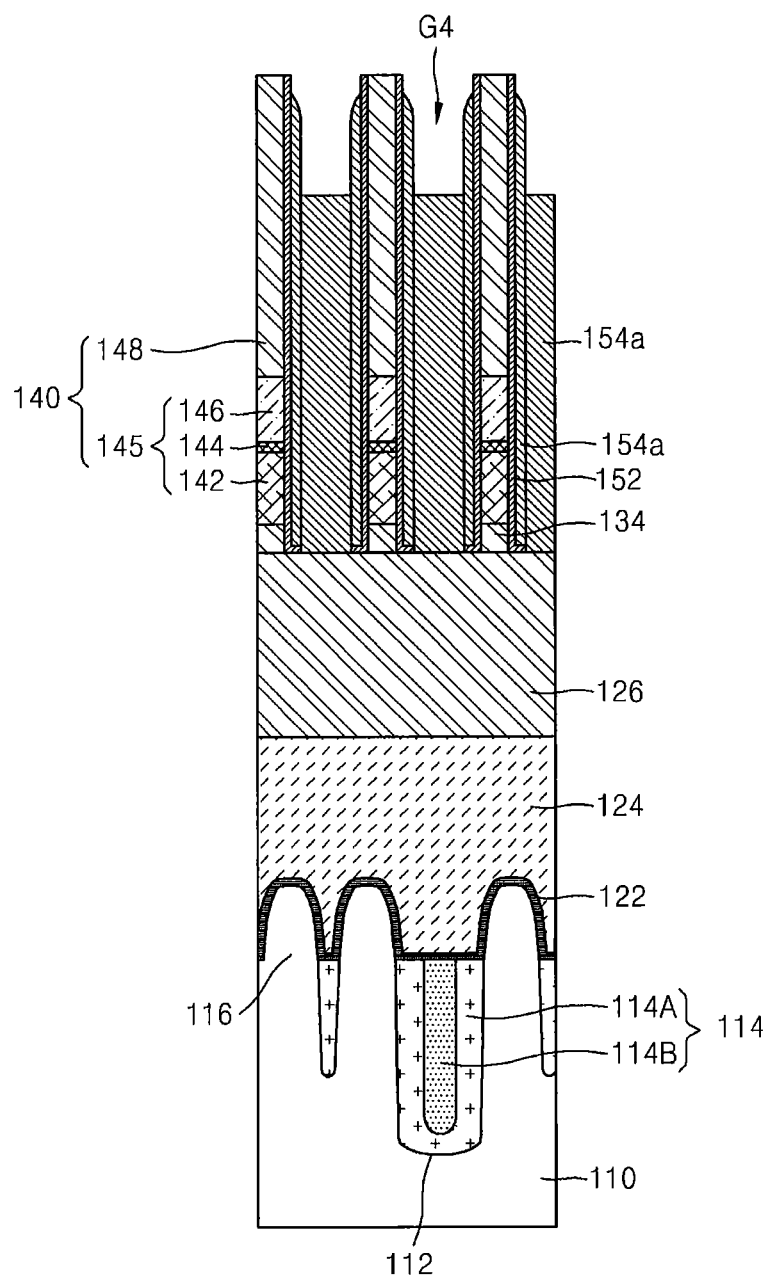
Figure 16C:
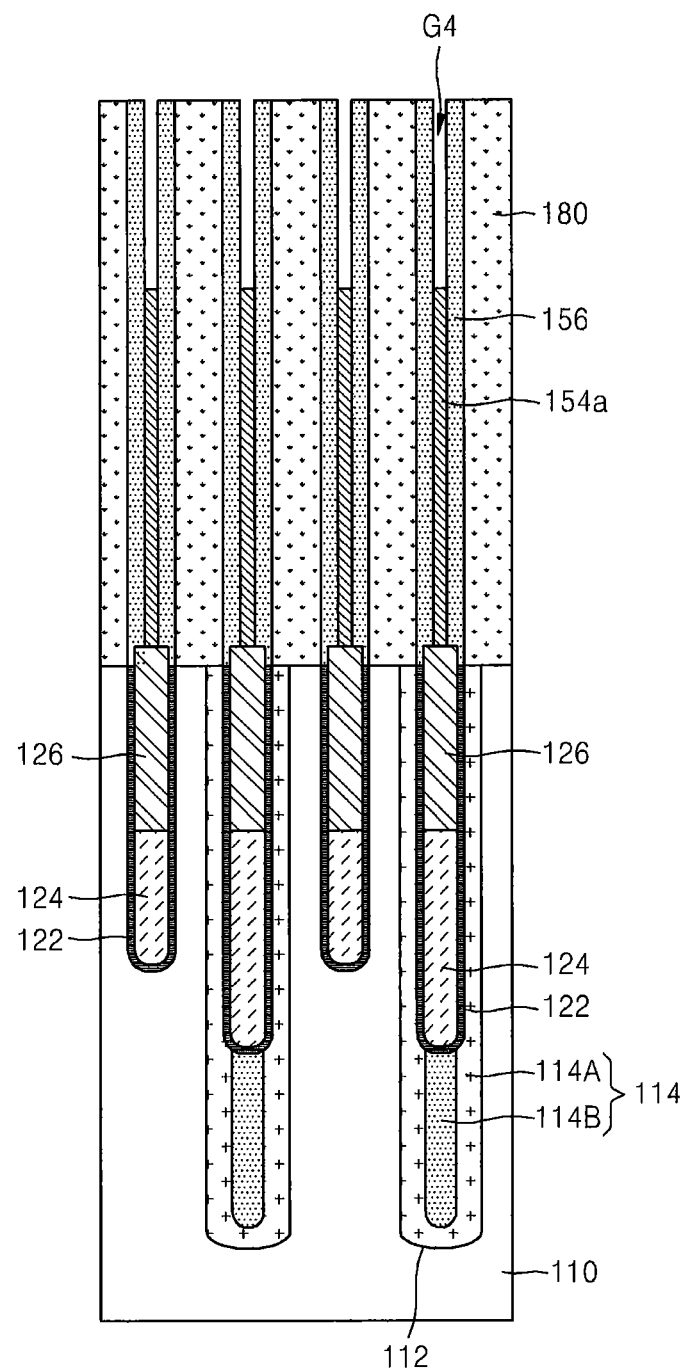

Referring to FIGS. 16A to 16C, as described with reference to FIGS. 2A to 10C, an upper portion of the conductive material layer is removed by CMP to expose the top surfaces of the multilayer spacers 150 and the bit line structures 140, thereby forming a plurality of buried contacts 180. Thereafter, upper portions of the first supplementary spacers 154a are removed to form a plurality of fourth grooves G4.

As described above, since the first supplementary spacers 154a are formed of an oxide material, the first supplementary spacers 154a may be removed by dry etching or etch-back using the polysilicon buried contacts 180, the nitride bit line structures 140, and the multilayer spacers 150 as an etch mask. As described with reference to FIG. 16C, top surfaces of the first supplementary spacers 154a that are left after etching may be maintained at a lower level than a top surfaces of the buried contacts 180 that are remain after the etch-back.

Figure 17A:
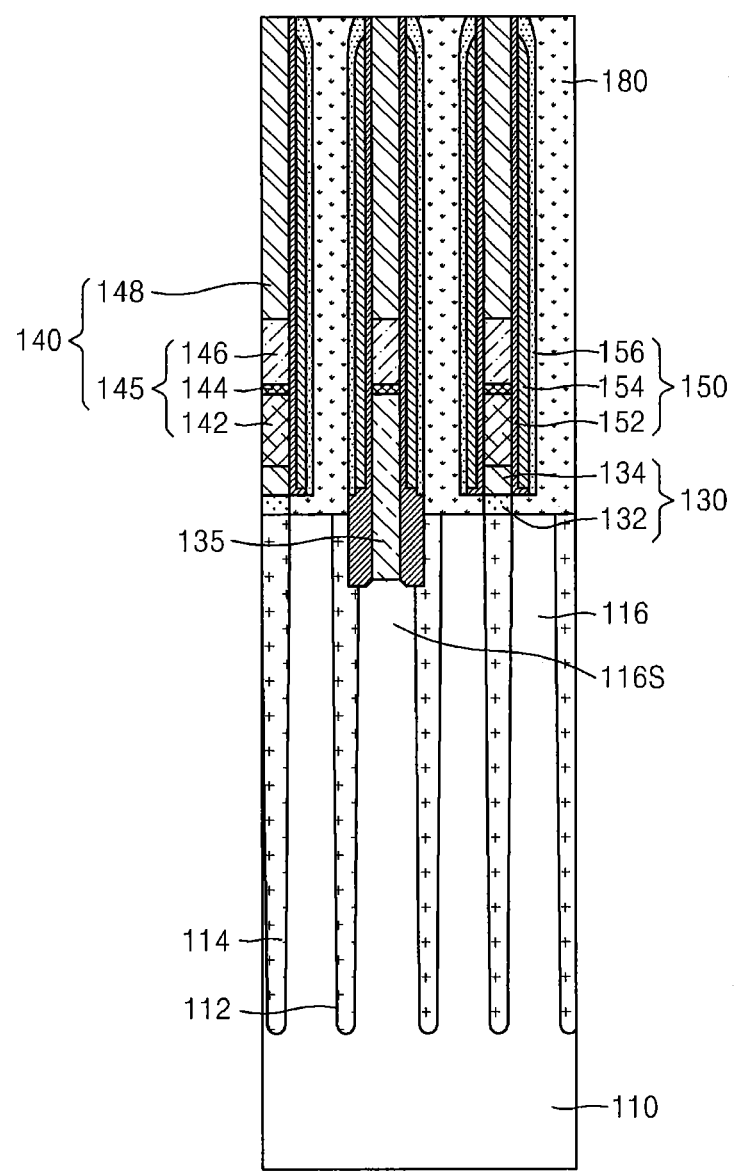
Figure 17B:
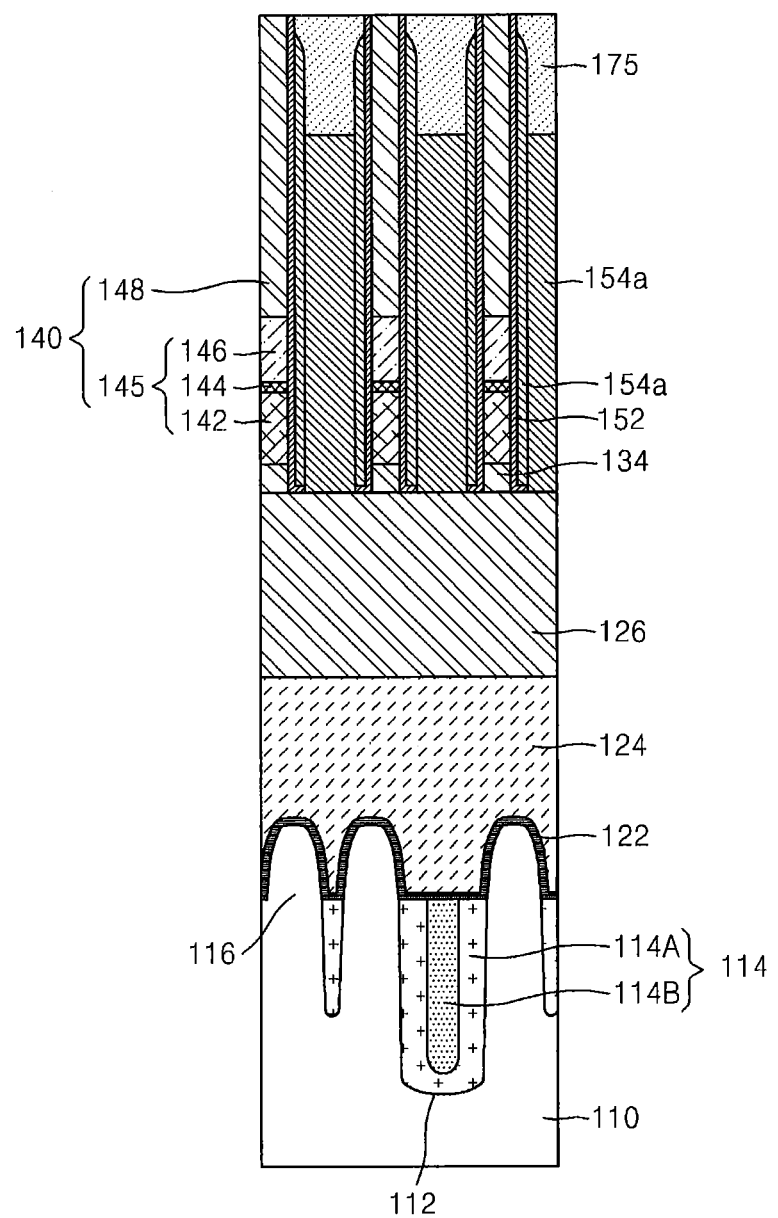
Figure 17C:
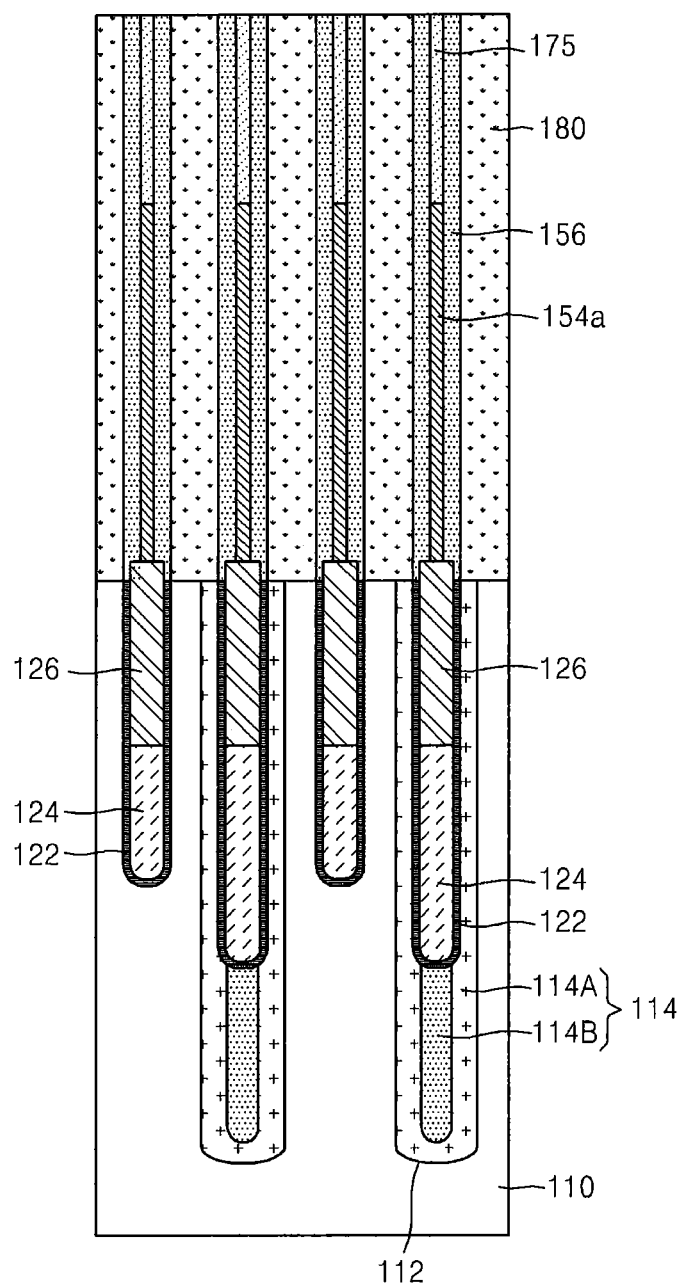

Referring to FIGS. 17A to 17C, a nitride material layer (not illustrated) is formed to fill the fourth grooves G4 and to cover the top surfaces of the multilayer spacers 150 and the bit line structures 140. Thereafter, an upper portion of the nitride material layer is removed by CMP to expose the top surfaces of the multilayer spacers 150 and the bit line structures 140, thereby forming an additional insulating layer 175. The additional insulating layer 175 may be formed of a nitride layer. The additional insulating layer 175 may function to supplement or protect the fence region. The additional insulating layer 175 may function as the fence region or the fence insulating layer. The additional insulating layer 175 may function to protect the oxide first supplementary spacers 154a when an air spacer is formed later.

Figure 18A:
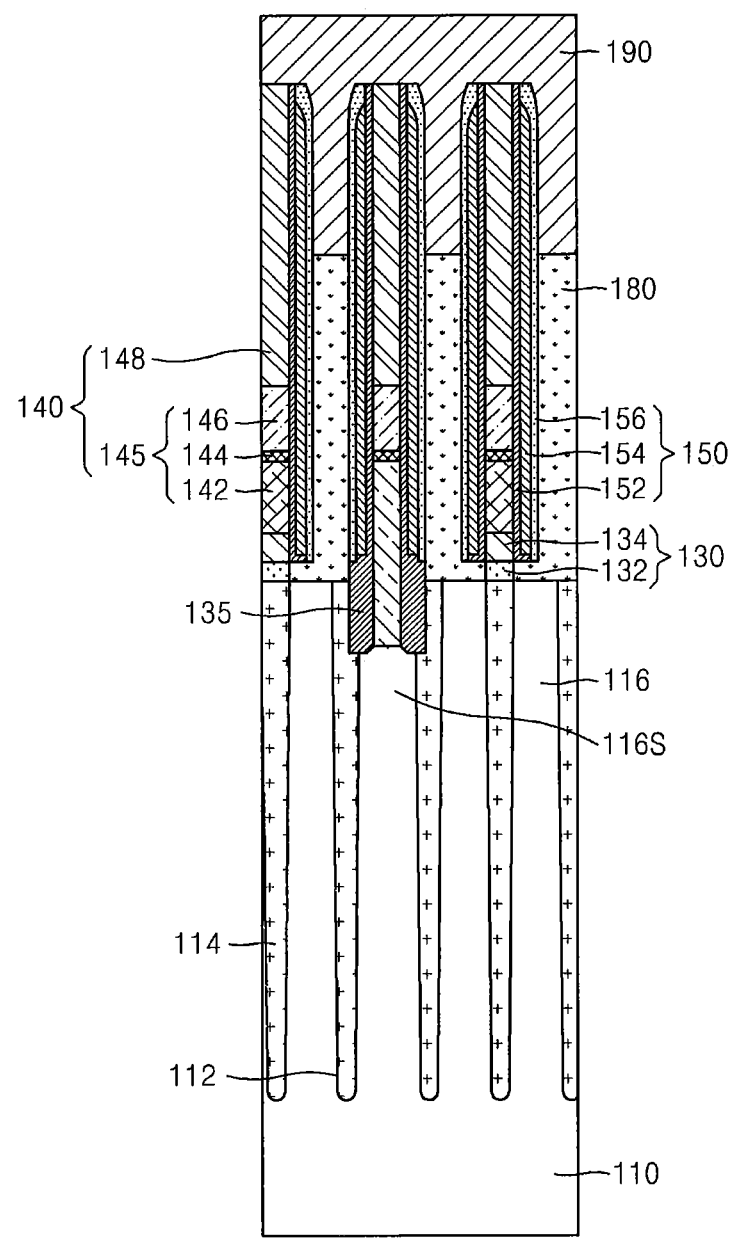
Figure 18B:
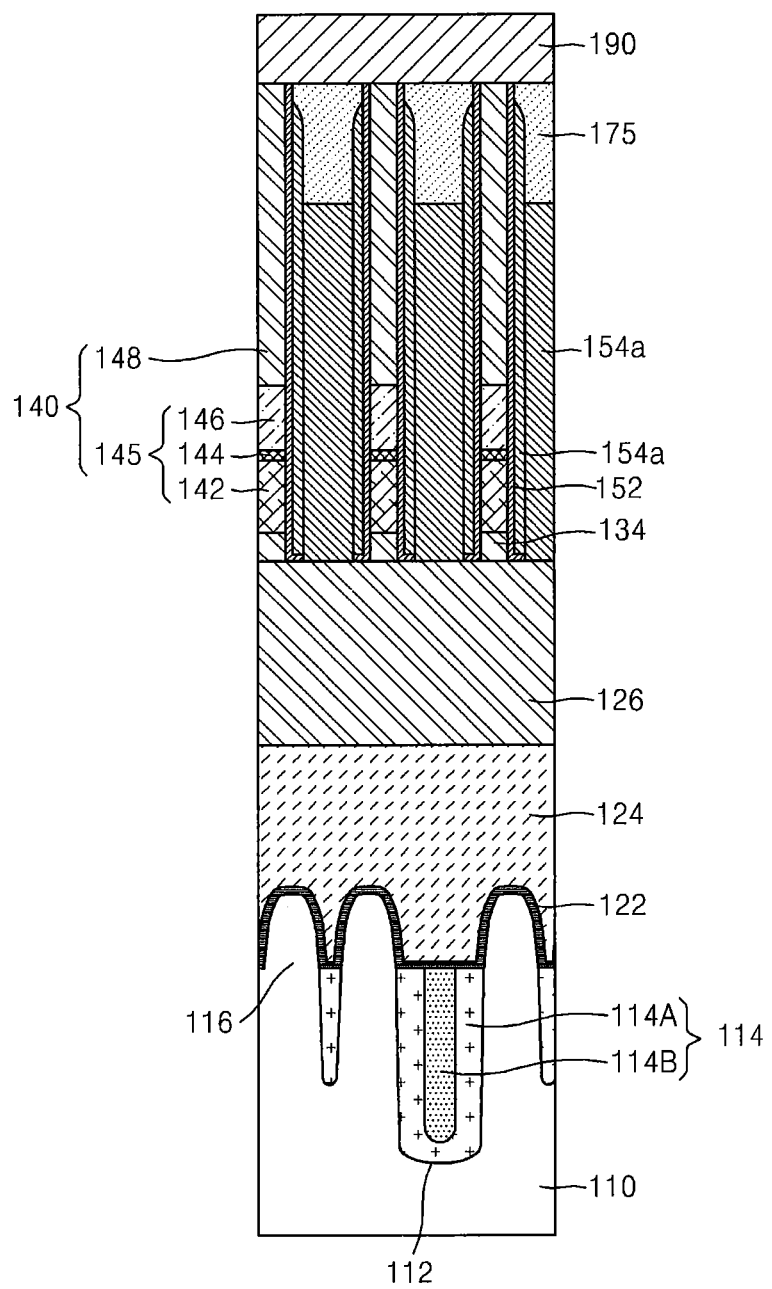
Figure 18C:
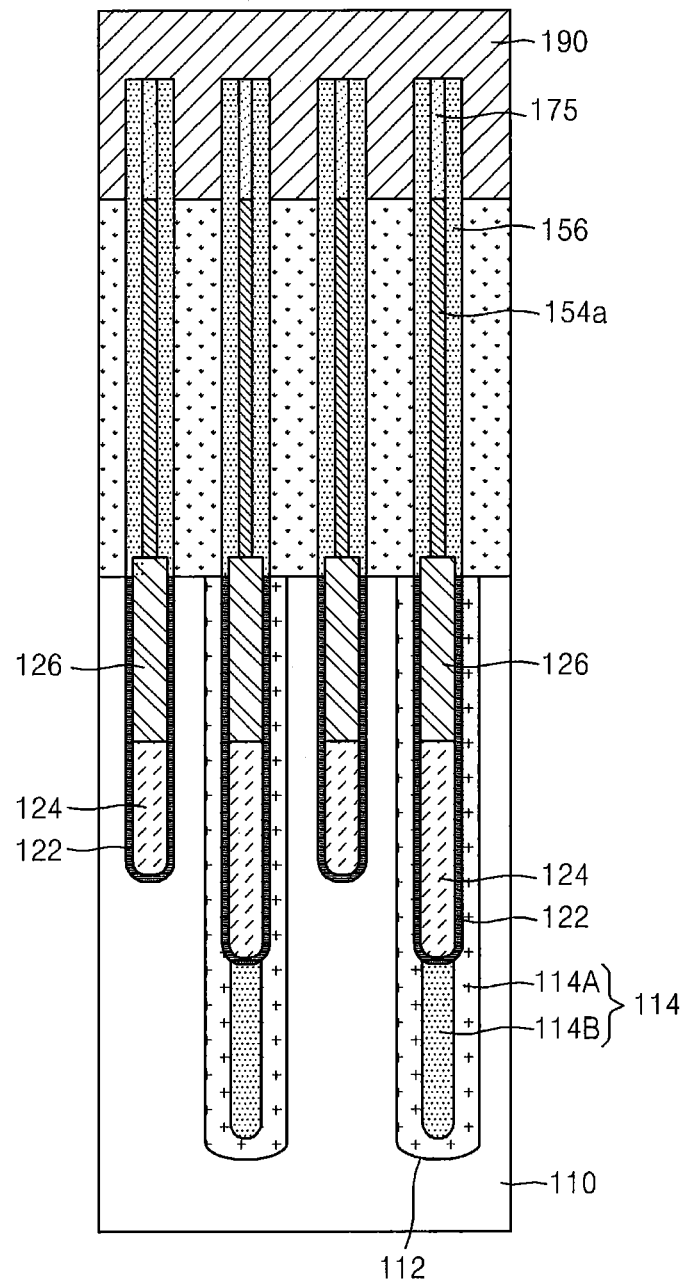

Referring to FIGS. 18A to 18C, a metal layer 190 is formed in the same manner as described with reference to FIGS. 11A to 11C. That is, upper portions of the buried contacts 180 are removed by etch-back to form grooves (not illustrated), and a metal layer 190 is formed to fill the grooves and to cover the top surfaces of the multilayer spacers 150 and the bit line structures 140.

The metal layer 190 may include a metal silicide layer (not illustrated) at a contact portion with respect to the buried contacts 180. For example, the metal silicide layer may be a cobalt silicide layer. The metal layer 190 may include: a buried layer (not illustrated) that covers an inner wall of the groove, the bit line structures 140, and the top surfaces of the multilayer spacers 150; an inner metal layer that is formed on the buried layer to fill the grooves; and an upper metal layer that is formed on the buried layer to cover the bit line structures 140 and the top surfaces of the multilayer spacers 150. In some embodiments, the buried layer may be formed in a Ti/TiN stack structure as described above. Also, in some embodiments, at least one of the inner metal layer and the upper metal layer may include tungsten.

Figure 19A:
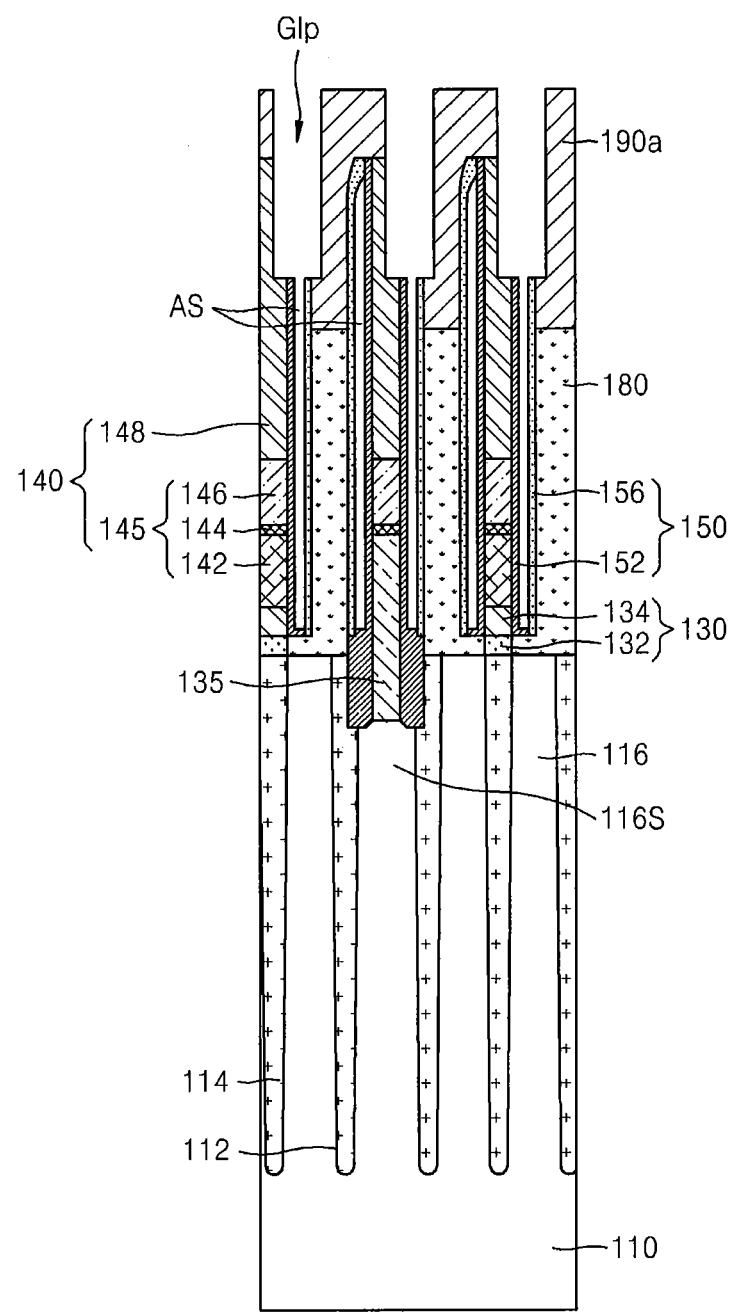
Figure 19B:
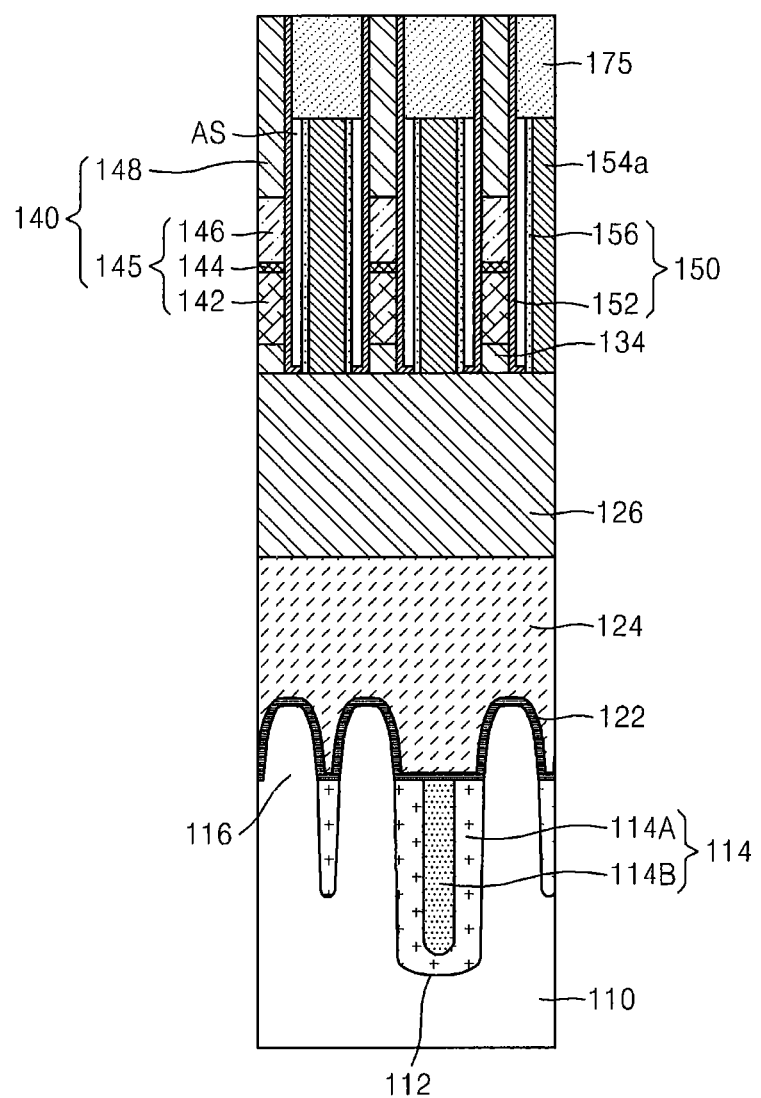
Figure 19C:
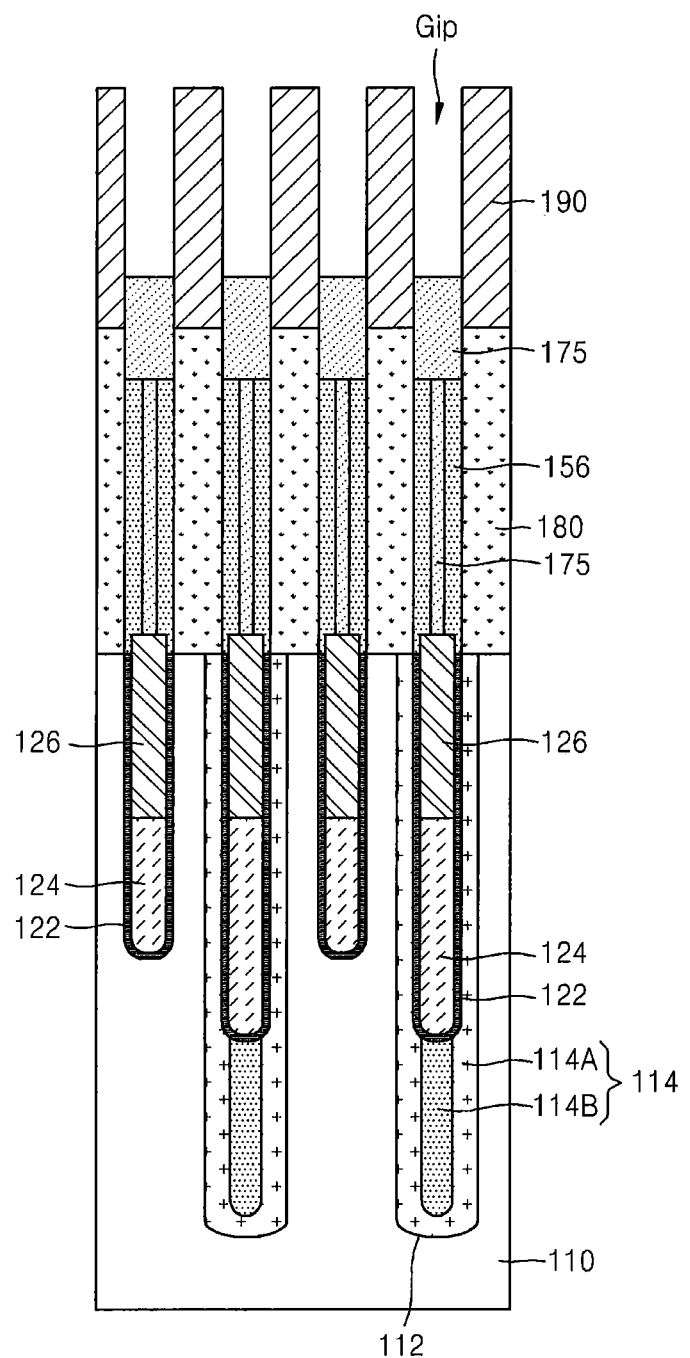
Figure 19D:
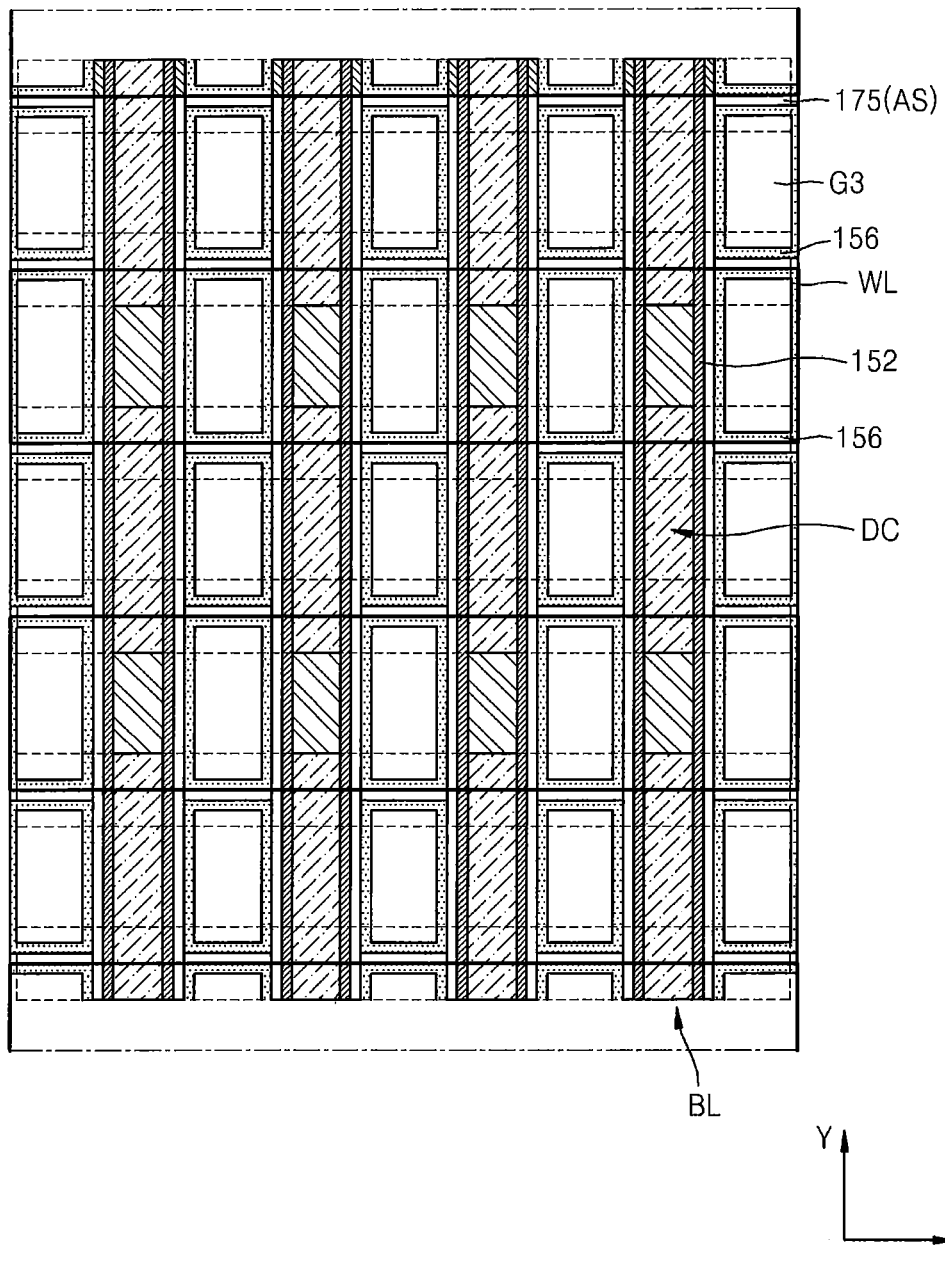

Referring to FIGS. 19A to 19C, a plurality of landing pads 190a are formed in the same manner as described with reference to FIGS. 12A to 12C. That is, a mask pattern (not illustrated) is formed on the metal layer 190. Thereafter, by using the mask pattern as an etch mask, the metal layer 190, the bit line structures 140 thereunder, and a portion of the multilayer spacers 150 are etched to form landing pad grooves Glp, thereby forming a plurality of landing pads 190a that are connected to the buried contacts 180 and are electrically disconnected and physically isolated from each other. The process of forming the landing pads 190a in the present embodiment may be different from the process of forming the landing pads 190a in FIGS. 12A to 12C, in that a portion of the additional insulating layer 175 is etched and removed.

Like the landing pads LP of FIG. 1, the landing pads 190a of the present embodiment may be disposed along the first direction (Y-axis direction) in a zigzag configuration L1 that alternately covers the multilayer spacer 150 on the left sidewall of the bit line structure 140 and the multilayer spacer 150 on the right sidewall of the bit line structure 140, and the landing pad 190a may have a structure that covers the multilayer spacer 150 formed on the same sidewall of each bit line structure 140, along the second direction (X-axis direction). After the forming of the landing pads 190a, the mask pattern is removed.

As illustrated in FIG. 19A, the oxide first supplementary spacers 154a that are exposed through the landing pad grooves Glp are removed to form a plurality of air spacers AS. Also, as illustrated in FIG. 19B, the first supplementary spacers 154a formed on the sidewalls of the bit line structures 140 under the additional insulating layer 175 are removed to form air spacers AS.

In other words, by using the additional insulating layer 175 and the insulating liners 152 (first spacers) as an etch mask, the oxide first supplementary spacers 154a exposed through the landing pad grooves Glp are removed to form a plurality of air spacers AS. The air spacers AS may be formed between the second supplementary spacers 156 and the first spacers 152 of the bit line structures 140 to surround the third grooves G3, that is, the buried contacts. The air spacers AS may be formed by, for example, wet etching. In order to increase the width of the air spacers AS, portions of the second supplementary spacers 156 and the nitride insulating liners 152 may be further removed by wet etching.

Thereafter, as described with reference to FIGS. 13A to 13C, a capping insulating layer 178 may be formed to fill the landing pad grooves Glp and cover top surfaces of the landing pads 190a. During the forming of the capping insulating layer 178, an insulating material constituting the capping insulating layer 178 may be deposited in the air spacers AS, top surfaces of which are exposed through the landing pad grooves Glp. As a result, except a portion of the air spacer AS that is covered by the landing pad 190a, a capping liner (not illustrated) formed of the same material as the capping insulating layer 178 may be formed on an inner wall of the air spacer AS. However, in some cases, the capping liner may not be formed in the air spacer AS.

Figure 20:
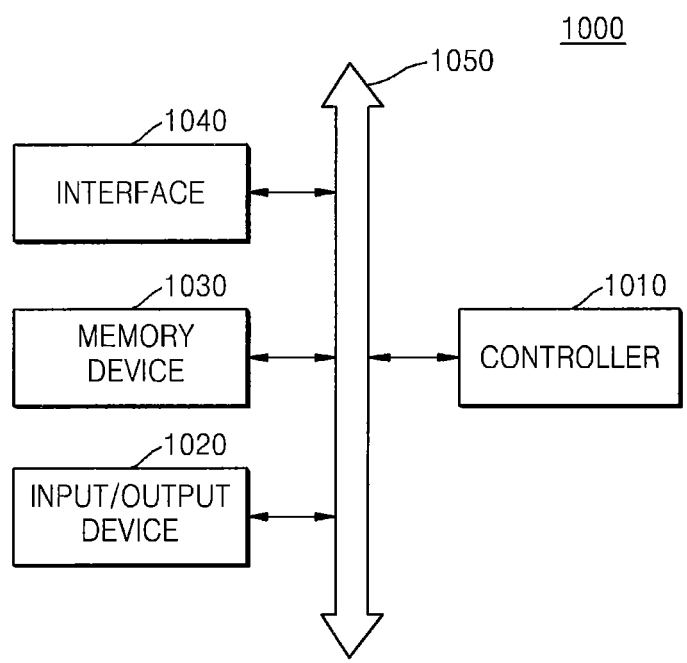
FIG. 20 illustrates a system that includes a semiconductor device according to an embodiment of the inventive concepts.

FIG. 20 illustrates a system including a semiconductor device according to an embodiment of the inventive concepts.

Referring to FIG. 20, a system 1000 according to the present embodiment may include a controller 1010, an input/output device 1020, a memory device 1030, and an interface 1040. The system 1000 may be a mobile system or a system that transmits or receives information. In some embodiments, the mobile system may be a PDA, a portable computer, a web tablet, a wireless phone, a mobile phone, a digital music player, or a memory card.

The controller 1010 controls an execution program in the system 1000. The controller 1210 may include a microprocessor, a digital signal processor, a microcontroller, or the like. The input/output device 1020 may be used to input data to or output data from the system 1000. By using the input/output device 1020, the system 1000 may be connected to an external device, for example, a personal computer or a network to exchange data with the external device. The input/output device 1020 may be, for example, a keypad, a keyboard, or a display device.

The memory device 1030 may store codes and/or data for operation of the controller 1010, or store data processed by the controller 1010. The memory device 1030 may include a semiconductor device that includes fin-type field effect transistors according to embodiments of the inventive concepts. For example, the memory device 1030 may include at least one of the semiconductor devices that are manufactured by the above-described methods.

The interface 1040 may be a data transmission path between the system 1000 and other external devices. The controller 1010, the input/output device 1020, the memory device 1030, and the interface 1040 may communicate with each other through a bus 1050.

The system 1000 according to the present embodiment may be used, for example, in mobile phones, MP3 players, navigation devices, portable multimedia players (PMPs), solid state disks (SSDs), or household appliances.

Figure 21:
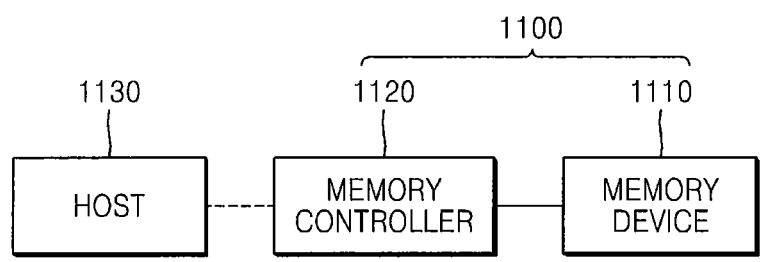
FIG. 21 illustrates a memory card that includes a semiconductor device according to an embodiment of the inventive concepts.

FIG. 21 illustrates a memory card that includes a semiconductor device according to an embodiment of the inventive concepts.

Referring to FIG. 21, a memory card 1100 according to the present embodiment may include a memory device 1110 and a memory controller 1120.

The memory device 1110 may store data. In some embodiments, the memory device 1110 may have non-volatile characteristics that may retain stored data even when power supply thereto is interrupted. The memory device 1110 may include at least one of the semiconductor devices that are manufactured by the methods illustrated in FIGS. 1 to 19D.

The memory controller 1120 may read data stored in the memory device 1110 or may store data in the memory device 1110, in response to a read/write request of a host 1130. The memory controller 1120 may include at least one of the semiconductor devices that are manufactured by the above-described methods.

While the inventive concepts have been particularly shown and described with reference to exemplary embodiments thereof, it will be understood that various changes in form and details may be made therein without departing from the spirit and scope of the following claims.

What is claimed is:

1. A method of manufacturing a semiconductor device, comprising:
    forming first and second bit line structures that extend in a first direction on a substrate, the first and second bit line structures spaced apart from each other by a first groove in a second direction that is perpendicular to the first direction;
    forming multilayer spacers on first and second opposing sidewalls of the first bit line structure and on first and second opposing sidewalls of the second bit line structure;
    forming a sacrificial layer in the first groove;
    patterning the sacrificial layer to form a plurality of second grooves that are spaced apart from each other in the first direction and the second direction;
    etching portions of an outermost spacer of at least some of the multilayer spacers that are exposed in the second grooves;
    forming first supplementary spacers in at least some of the second grooves; and
    removing the sacrificial layer to form a plurality of third grooves that are spaced apart from each other in the first direction and the second direction.

2. The method of claim 1, wherein forming multilayer spacers on first and second sidewalls of the first bit line structure comprises:
    forming nitride spacers on sidewalls of the first and second bit line structures; and
    forming oxide spacers on the nitride spacers, the oxide spacers being the outermost spacers of the multilayer spacers.

3. The method of claim 1, wherein forming the plurality of second grooves comprises:
    forming a mask pattern on the sacrificial layer to expose portions of the sacrificial layer; and
    etching the sacrificial layer using the mask pattern and the multilayer spacer as an etch mask.

4. The method of claim 3, wherein the mask pattern exposes portions of the sacrificial layer that are on word lines that are buried in the substrate.

5. The method of claim 1, wherein the first supplementary spacers are formed on exposed sidewalls of the sacrificial layer and on the portions of the multilayer spacers for which the outermost spacer was etched.

6. The method of claim 1, wherein the first supplementary spacers comprise oxide spacers.

7. The method of claim 1, wherein forming the plurality of third grooves comprises:
    forming an insulating layer in at least some of the second grooves; and
    removing both the sacrificial layer and the insulating layer by an ashing and stripping process.

8. The method of claim 1, wherein a second supplementary spacer is formed in each of the third grooves.

9. The method of claim 1, further comprising, after forming the plurality of third grooves:
    forming a polysilicon conductive layer in the third grooves that is electrically connected to the substrate; and
    removing an upper portion of the polysilicon conductive layer by an etch-back process and forming a metal layer to extend on the first and second bit line structures, the multilayer spacers, and the first supplementary spacers.

10. The method of claim 9, wherein forming the polysilicon conductive layer comprises:
    forming a conductive material layer in the third grooves that also extends on the first and second bit line structures, the multilayer spacers, and the first supplementary spacers; and
    exposing the first and second bit line structures, the multilayer spacers, and the first supplementary spacers by removing an upper portion of the conductive material layer by a chemical mechanical polishing (CMP) process.

11. The method of claim 9, further comprising, after forming the metal layer, forming a plurality of fourth grooves by etching portions of the first supplementary spacers, the multilayer spacers, the first and second bit line structures, and the metal layer that are exposed through a mask pattern,
    wherein the metal layer is divided by the fourth grooves into a plurality of landing pads that are electrically isolated from each other.

12. The method of claim 11, wherein
    the landing pads are disposed in a zigzag configuration along the first direction,
    the multilayer spacers on facing sidewalls of the first bit line structure and the second bit line structure are alternately exposed through the fourth groove along the first direction, and
    the multilayer spacer formed on the same sidewall of the first and second bit line structures is exposed by the fourth groove along the second direction.

13. The method of claim 11, wherein
    second supplementary spacers are formed in the third grooves before the polysilicon conductive layer is formed, and the method further comprises; after the forming of the metal layer:
  forming the fourth grooves to expose the multilayer spacers, the first supplementary spacers, and the second supplementary spacers; and
  forming air spacers by removing the first supplementary spacers.

14. A method of manufacturing a semiconductor device, comprising:
  forming first and second bit line structures that extend in a first direction on a substrate, the first and second bit line structures spaced apart from each other in a second direction that is perpendicular to the first direction by a first groove;
  forming multilayer spacers on first and second opposing sidewalls of the first bit line structure and on first and second opposing sidewalls of the second bit line structure;
  forming a sacrificial layer in the first groove;
  forming a plurality of second grooves that are spaced apart from each other in the first direction and the second direction by patterning the sacrificial layer;
  forming fence insulating layers of a same material as an outermost layer of the multilayer spacers in at least some of the second grooves;
  forming an insulating layer in the second grooves in regions bounded by the respective fence insulating layers; and
  forming a plurality of third grooves that are spaced apart from each other in the first direction and the second direction by removing the sacrificial layer and the insulating layer.

15. The method of claim 14, wherein the fence insulating layers and the outermost layer of each multilayer spacer include oxide.

16. The method of claim 14, wherein each multilayer spacer comprises:
  a first spacer comprising a nitride layer on both sidewalls of a respective one of the first and second bit line structures; and
  a second spacer comprising an oxide layer as an outermost spacer on the first spacer.

17. The method of claim 16, wherein forming the fence insulating layers comprises:
  etching portions of the second spacer of each multilayer spacer that are located in the second grooves and that are formed in the second direction; and
  forming first supplementary spacers on both sidewalls of the sacrificial layer in the second grooves in the first direction and on the first spacers of the first and second bit line structures in the second direction.

18. The method of claim 17, wherein after forming the third grooves, supplementary spacers having an etch selectivity with respect to the first spacers and the fence insulating layers are further formed on both sidewalls of at least some of the fence insulating layers in the first direction and on the multilayer spacers of the first and second bit line structures in the second direction.

19. The method of claim 18, further comprising, after forming the third grooves:
  forming a polysilicon conductive layer in the third grooves that is electrically connected to the substrate; and
  removing an upper portion of the polysilicon conductive layer by an etch-back process; and
  forming a metal layer on the first and second bit line structures, the multilayer spacers, the supplementary spacers, and the fence insulating layers.

20. The method of claim 19, further comprising, after forming the metal layer:
  forming a fourth groove to expose the metal layer, the first and second bit line structures, the multilayer spacers, the supplementary spacers, and the fence insulating layers; and
  forming air spacers by removing the fence insulating layers and the second spacers of the multilayer spacers.

* * * * *